US012745606B2

(12) United States Patent
Hu

(10) Patent No.: US 12,745,606 B2
(45) Date of Patent: Sep. 22, 2026

(54) MEMORY DEVICE STRUCTURE AND FORMING METHOD INCLUDING RETICLE ADJUSTMENT

(71) Applicant: Micron Technology, Inc., Boise, ID (US)

(72) Inventor: Yi Hu, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 712 days.

(21) Appl. No.: 17/404,649

(22) Filed: Aug. 17, 2021

(65) Prior Publication Data

US 2023/0058170 A1 Feb. 23, 2023

(51) Int. Cl.

| | |
|---|---|
| ***H10P 74/00*** | (2026.01) |
| ***G11C 16/04*** | (2006.01) |
| ***H10B 41/10*** | (2023.01) |
| ***H10B 41/27*** | (2023.01) |
| ***H10B 41/35*** | (2023.01) |
| ***H10B 41/40*** | (2023.01) |
| ***H10B 43/10*** | (2023.01) |
| ***H10B 43/27*** | (2023.01) |
| ***H10B 43/35*** | (2023.01) |
| ***H10B 43/40*** | (2023.01) |
| ***H10W 20/41*** | (2026.01) |

(52) U.S. Cl.

CPC ............. *H10P 74/23* (2026.01); *H10B 41/10* (2023.02); *H10B 41/27* (2023.02); *H10B 41/35* (2023.02); *H10B 41/40* (2023.02); *H10B 43/10* (2023.02); *H10B 43/27* (2023.02); *H10B 43/35* (2023.02); *H10B 43/40* (2023.02); *H10W 20/435* (2026.01); *G11C 16/0483* (2013.01)

(58) Field of Classification Search

CPC ..... H01L 23/5283; H10B 41/27; H10B 43/27; H10B 43/10; H10B 41/10; H10B 43/50

See application file for complete search history.

(56) References Cited

U.S. PATENT DOCUMENTS

| | | | | |
|---|---|---|---|---|
| 2020/0357811 | A1* | 11/2020 | Kim | H10B 41/35 |
| 2021/0074711 | A1* | 3/2021 | Suzuki | G11C 16/0483 |
| 2022/0102273 | A1* | 3/2022 | Kubo | H10B 43/27 |

* cited by examiner

*Primary Examiner* — Samuel A Gebremariam
*Assistant Examiner* — Jonas T Beardsley
(74) *Attorney, Agent, or Firm* — Schwegman Lundberg & Woessner, P.A.

(57) ABSTRACT

Some embodiments include apparatuses and methods of forming the apparatuses. One of the apparatuses includes memory cell strings having respective pillars extending through levels of first conductive materials interleaved with levels of first dielectric materials; conductive structures formed over the memory cell strings and extending through levels of second conductive materials interleaved with levels of second dielectric materials; dielectric structures located in respective trenches over the memory cell strings and dividing the levels of second conductive materials into portions that are electrically separated from each other; and the dielectric structures located such that the distance between two adjacent dielectric structures is different from the distance between two other adjacent dielectric structures.

10 Claims, 32 Drawing Sheets

MEMORY CELL STRING
SELECT CIRCUIT
BLK0
BLK1
SB0
SB1
SRC
200

200

200

700

700

700

700

700

700

700
12A
12A
BLK0
BLK1
1251
1143
422'
424'
462'
463'
464'
Y
X

700
SUBSTRATE 799
SRC
790
1251
1251A
1251B
445'
448'
449'
444'
921
922
923
721
722
Z 821
521'

700
BLK0
BLK1
1251
1143
13A
422'
424'
462'
463'
464'
Y
X

SUBSTRATE 799
SRC
790
921
1322
923
721
445'
448'
449'
444'
Z 821
521'

700

700

700
BLK0
451'
BLK1
1143
1525
1521
422'
424'
462'
463'
464'
15A
Y
X 921
1480
923
721
$223_0$
$222_0$
$221_0$
$220_0$
$223_1$
$222_1$
$221_1$
$220_1$
790
SRC
444'
445'
448'
449'
SUBSTRATE 799
Z 821
521'

700
SUBSTRATE 799
SRC
BLK0
BLK1
SB0
SB1
1143
921
923
721
790
1480
821
521'
451'
1646'
1525
1521
424'
422'
444'
445
448'
449'
462'
463'
464'
16A

700

700

700
SUBSTRATE 799
SRC

LITHOGRAPHY EQUIPMENT
2001
2046
RETICLE
2010
CONTROL
2005
700
2002
2000

1646A
424A
422A
1924A
D2
X2
1924B
700

1646'
424'
422'
700

1646A
424A
422A
X1
1824B
1824A
D1
424A

1646'
424'
422'
700

X
Y

SUBSTRATE 799
SRC
BLK0
BLK1

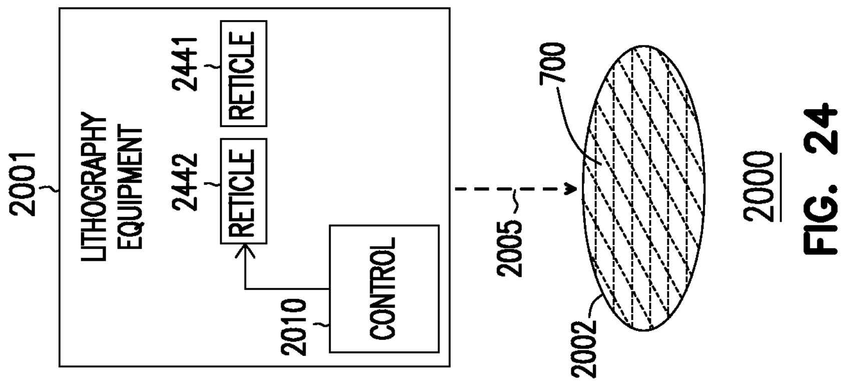
FIG. 24
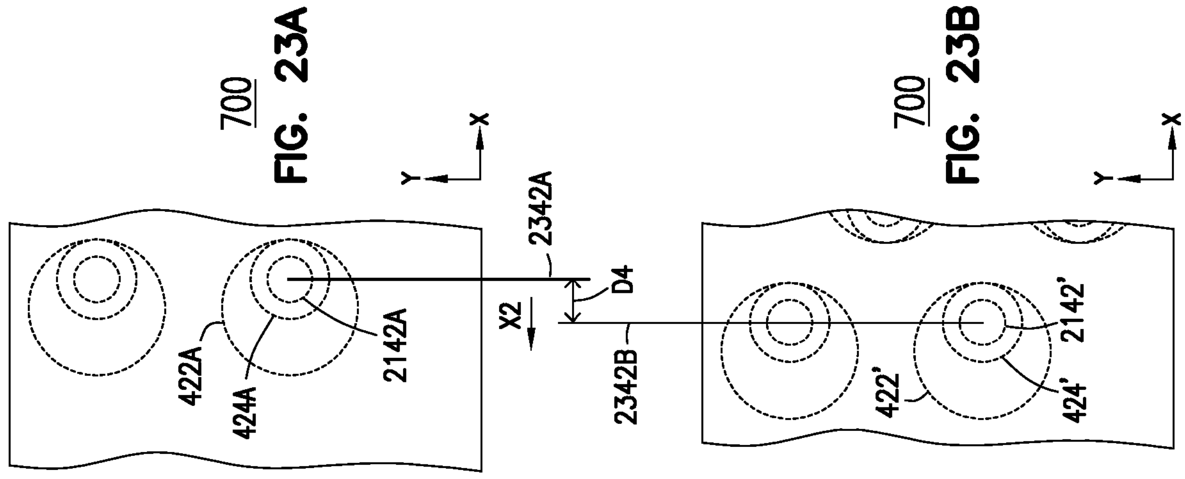
FIG. 23A
FIG. 23B
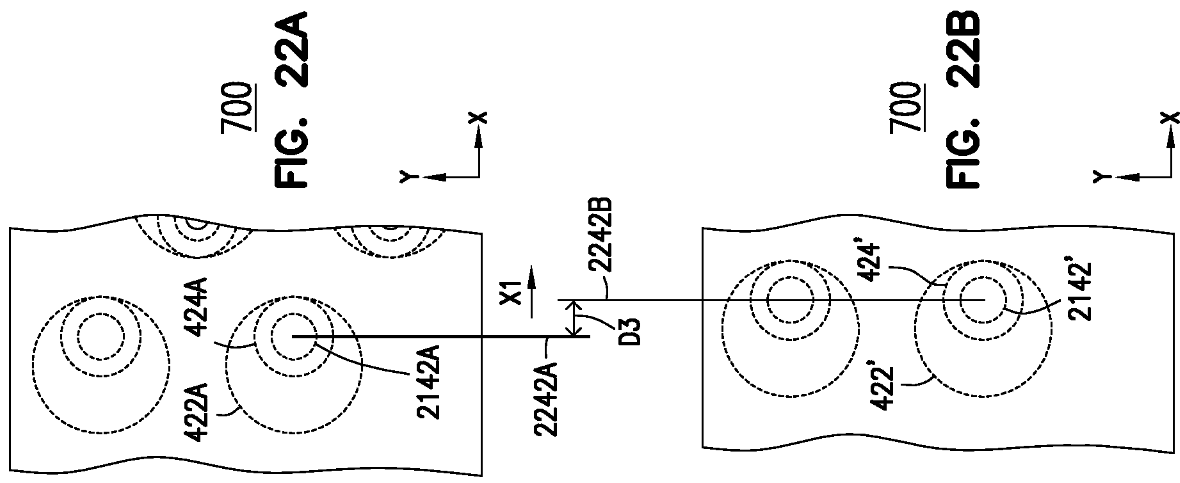
FIG. 22A
FIG. 22B

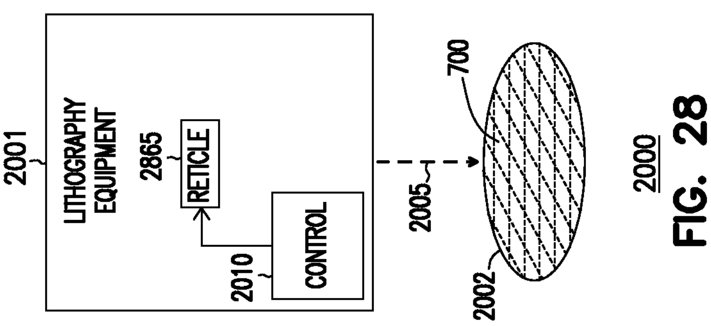
FIG. 28
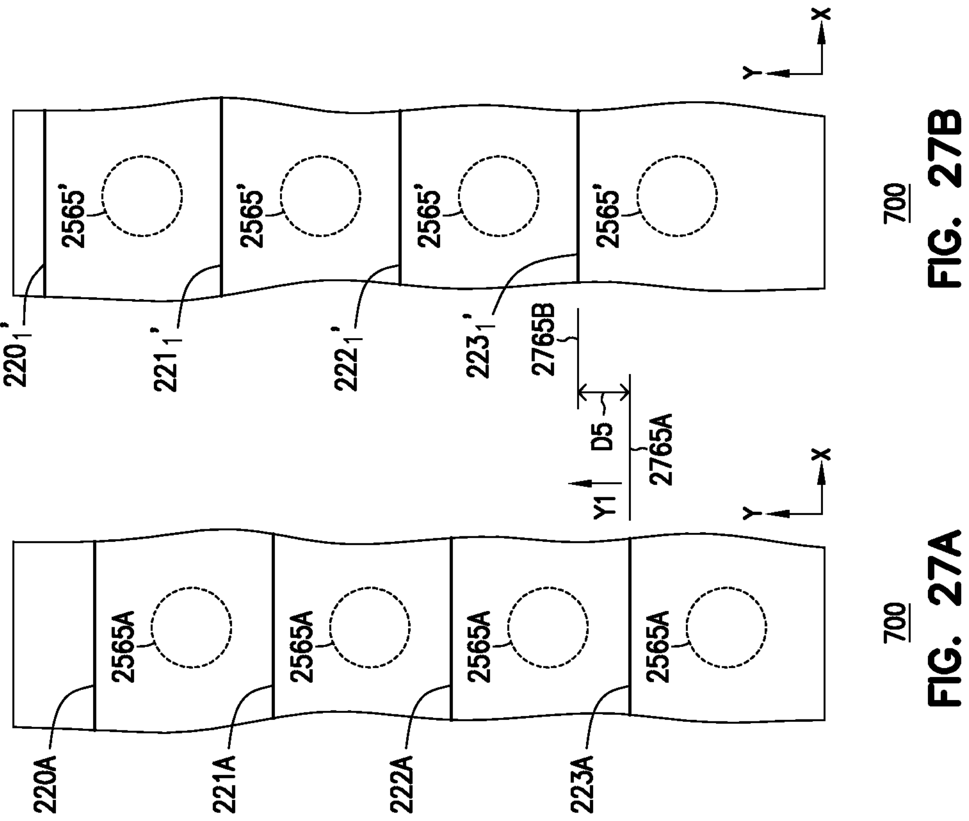
FIG. 27A
FIG. 27B 3000
1143
30A
30A
422'
424'
462'
463'
464'
Y
X
1143
921
922
923
721
722
790
424'
445'
448'
449'
444'
SRC
SUBSTRATE 799
Z
X
3000

821
521'
Z
Y
SUBSTRATE 799
3000

3000

SUBSTRATE 799
SRC
1143
1646
1646B
31A
821
521'
790

3000
SUBSTRATE 799
SRC
BLK0
BLK1
451'
446'1
32A
1143
1525
1521
1721
790
821
521'

3000
BLK0
451'
BLK1
446'1
1143
1525
1521
422'
424'
441'
442'
33A
Y
X

3000
SUBSTRATE 799
SRC
790
921
923
721
283₁
282₁
281₁
280₁
283₀
282₀
281₀
280₀
223₀
222₀
221₀
220₀
223₁
222₁
221₁
220₁
444'
445'
448'
449'
1721
Z

3000
SUBSTRATE 799
1480
2621
2665
821
521'

3000
BLK0
451'
BLK1
BL3
BL2
BL1
BL0
1143
1341
270_3
270_2
270_1
270_0
424'
422'
441'
442'
34A
SUBSTRATE 799
SRC
2021
2975
790
921
923
721
1480
2956
2621
2665
821
521'

MEMORY DEVICE STRUCTURE AND FORMING METHOD INCLUDING RETICLE ADJUSTMENT

TECHNICAL FIELD

Embodiments described herein relate to memory devices including formation of the structures of the memory devices.

BACKGROUND

Memory devices are widely used in computers and many other electronic items. A memory device usually has numerous memory cells used to store information (e.g., data) and data lines to carry information (in the form of electrical signals) to and from the memory cells. During fabrication of the memory device, the memory cells are often divided into physical blocks. In some conventional processes of forming the memory device, stress and process variation can cause block bending errors where the structures of the blocks and other features in the blocks may bend. This can cause features in the blocks to deviate from their intended locations. Damage to the structure, operation, or both may occur in the memory device if such a block bending error is left untreated or undetected.

BRIEF DESCRIPTION OF THE DRAWINGS

FIG. 7A, FIG. 7B, and FIG. 7C through FIG. 29A, FIG. 29B, and FIG. 29C show different views of elements during processes of forming a memory device, according to some embodiments described herein.

FIG. 30A, FIG. 30B, FIG. 30C through FIG. 34A, FIG. 34B, and FIG. 34C show different views of elements during processes of forming another memory device, according to some embodiments described herein.

DETAILED DESCRIPTION

The techniques described herein involve forming a memory device and performing reticle adjustments during fabrication of the memory device. The memory device described herein includes pillars of memory cells that are divided into physical blocks. The memory device also includes conductive structures that are part of conductive paths in respective blocks. During processes of forming the memory device, the blocks may bend due to local imbalance in the structures of the blocks. As a result, the pillars in the blocks may also bend. Thus, intended locations (e.g., design locations) of the blocks and the pillars can change (e.g., shift). The reticle adjustments described herein are performed to compensate for such change, so that the part of the memory device including sub-block dividers and conductive structures can be reliably formed despite potential occurrence of pillar and block bending error. In an example, reticle adjustments can be performed during processes of forming the memory device to determine changes in part of the memory device relative to intended locations. Based on the determination, other structures of the memory device can be formed at appropriate (e.g., corrected) locations instead of at the intended locations, which may no longer be suitable. Using the techniques described herein, the reliability of the memory device described can be maintained or improved. Improved yield may also be achieved. Other improvements and benefits of the techniques described herein are further discussed below with reference to FIG. 1 through FIG. 34C.

Figure 1:
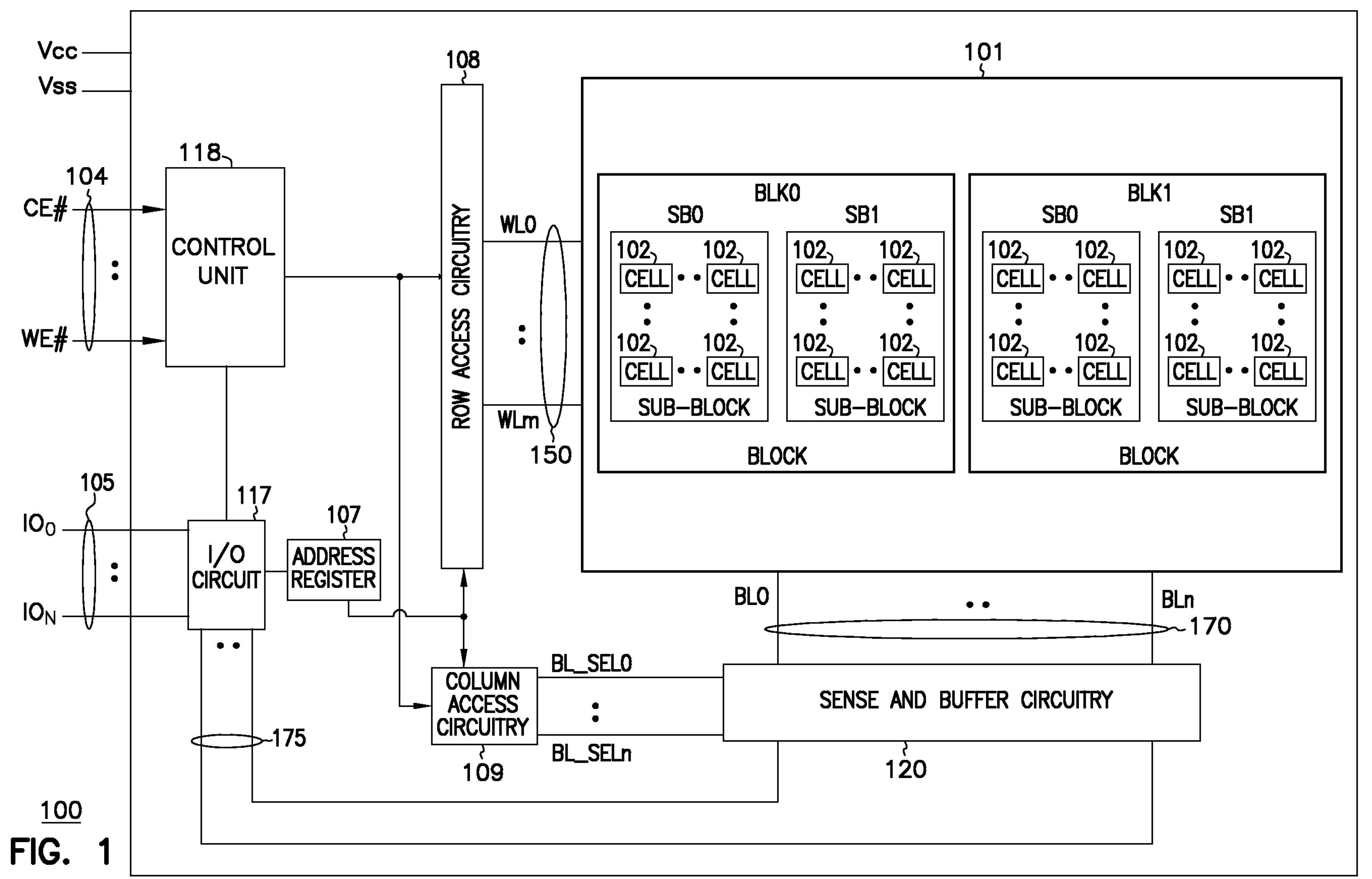
FIG. 1 shows a block diagram of an apparatus in the form of a memory device, according to some embodiments described herein.

FIG. 1 shows a block diagram of an apparatus in the form of a memory device 100, according to some embodiments described herein. Memory device 100 can include a memory array (or multiple memory arrays) 101 containing memory cells 102 arranged in blocks (blocks of memory cells), such as blocks BLK0 and BLK1. Each of blocks BLK0 and BLK1 can include its own sub-blocks, such as sub-blocks SB0 and SB1. In the physical structure of memory device 100, memory cells 102 can be arranged vertically (e.g., stacked over each other) over a substrate (e.g., a semiconductor substrate) of memory device 100. FIG. 1 shows memory device 100 having two blocks, BLK0 and BLK1, and two sub-blocks in each of the blocks as an example. Memory device 100 can have more than two blocks and more than two sub-blocks in each of the blocks.

As shown in FIG. 1, memory device 100 can include access lines (which can include word lines) 150 and data lines (which can include bit lines) 170. Access lines 150 can carry signals (e.g., word line signals) WL0 through WLm. Data lines 170 can carry signals (e.g., bit line signals) BL0 through BLn. Memory device 100 can use access lines 150 to selectively access memory cells 102 of blocks BLK0 and BLK1 and data lines 170 to selectively exchange information (e.g., data) with memory cells 102 of blocks BLK0 and BLK1. Blocks BLK0 can have access lines (e.g., word lines)

that are electrically separated from access lines (e.g., word lines) of block BLK1. Sub-blocks of the same block can share access lines (e.g., can share word lines) and can be controlled by the same access lines. For example, sub-blocks SB0 and SB1 of block BLK0 can share a group of access lines associated with block BLK0, and sub-blocks SB0 and SB1 of block BLK1 can share another group of access lines associated with block BLK1.

Memory device 100 can include an address register 107 to receive address information that can include locations of memory cells in memory array 110. Memory device 100 can include row access circuitry 108 and column access circuitry 109 that can decode address information from address register 107. Based on decoded address information, memory device 100 can determine which memory cells 102 of which sub-blocks of blocks BLK0 and BLK1 are to be accessed during a memory operation. Memory device 100 can perform a read operation to read (e.g., sense) information (e.g., previously stored information) from memory cells 102 of blocks BLK0 and BLK1, or a write (e.g., programming) operation to store (e.g., program) information in memory cells 102 of blocks BLK0 and BLK1. Memory device 100 can use data lines 170 associated with signals BL0 through BLn to provide information to be stored in memory cells 102 or obtain information read (e.g., sensed) from memory cells 102. Memory device 100 can also perform an erase operation to erase information from some or all of memory cells 102 of blocks BLK0 and BLK1.

Memory device 100 can include a control unit 118 that can be configured to control memory operations of memory device 100 based on control signals on lines 104. Examples of the control signals on lines 104 include one or more clock signals and other signals (e.g., a chip enable signal CE #, a write enable signal WE #) to indicate which operation (e.g., read, write, or erase operation) memory device 100 can perform. Other devices external to memory device 100 (e.g., a memory controller or a processor) may control the values of the control signals on lines 104. Specific values of a combination of the signals on lines 104 may produce a command (e.g., read, write, or erase command) that causes memory device 100 to perform a corresponding memory operation (e.g., read, write, or erase operation).

Memory device 100 can include sense and buffer circuitry 120 that can include components such as sense amplifiers and page buffer circuits (e.g., data latches). Sense and buffer circuitry 120 can respond to signals BL_SEL0 through BL_SELn from column access circuitry 109. Sense and buffer circuitry 120 can be configured to determine (e.g., by sensing) the value of information read from memory cells 102 (e.g., during a read operation) of blocks BLK0 and BLK1 and provide the value of the information to lines (e.g., global data lines) 175. Sense and buffer circuitry 120 can also be configured to use signals on lines 175 to determine the value of information to be stored (e.g., programmed) in memory cells 102 of blocks BLK0 and BLK1 (e.g., during a write operation) based on the values (e.g., voltage values) of signals on lines 175 (e.g., during a write operation).

Memory device 100 can include input/output (I/O) circuitry 117 to exchange information between memory cells 102 of blocks BLK0 and BLK1 and lines (e.g., I/O lines) 105. Signals $I/O_0$ through $I/O_N$ on lines 105 can include information (e.g., data and address). For example, Signals $I/O_0$ through $I/O_N$ on lines 105 can include data read from memory cells 102 of blocks BLK0 and BLK1 during a read operation. In another example, signals $I/O_0$ through $I/O_N$ on lines 105 can include data to be stored in memory cells 102 of blocks BLK0 and BLK1 during a write operation. Lines 105 can include nodes within memory device 100 or pins (or solder balls) on a package where memory device 100 can reside. Other devices external to memory device 100 (e.g., a memory controller or a processor) can communicate with memory device 100 through lines 103, 104, and 105.

Memory device 100 can receive a supply voltage, including supply voltages Vcc and Vss. Supply voltage Vss can operate at a ground potential (e.g., having a value of approximately zero volts). Supply voltage Vcc can include an external voltage supplied to memory device 100 from an external power source such as a battery or alternating current to direct current (AC-DC) converter circuitry.

Each of memory cells 102 can be programmed to store information representing a value of at most one bit (e.g., a single bit), or a value of multiple bits such as two, three, four, or another number of bits. For example, each of memory cells 102 can be programmed to store information representing a binary value "0" or "1" of a single bit. The single bit per cell is sometimes called a single-level cell. In another example, each of memory cells 102 can be programmed to store information representing a value for multiple bits, such as one of four possible values "00", "01", "10", and "11" of two bits, one of eight possible values "000", "001", "010", "011", "100", "101", "110", and "111" of three bits, or one of other values of another number of multiple bits (e.g., more than three bits in each memory cell). A cell that has the ability to store multiple bits is sometimes called a multi-level cell (or multi-state cell).

Memory device 100 can include a non-volatile memory device, and memory cells 102 can include non-volatile memory cells, such that memory cells 102 can retain information stored thereon when power (e.g., voltage Vcc, Vss, or both) is disconnected from memory device 100. For example, memory device 100 can be a flash memory device, such as a NAND flash (e.g., 3D NAND) or a NOR flash memory device, or another kind of memory device, such as a variable resistance memory device (e.g., a phase change memory device or a resistive Random Access Memory (RAM) device).

One of ordinary skill in the art may recognize that memory device 100 may include other components, several of which are not shown in FIG. 1 so as not to obscure the example embodiments described herein. At least a portion of memory device 100 can include structures and perform operations similar to or identical to the structures and operations of any of the memory devices described below with reference to FIG. 2 through FIG. 5A.

Figure 2:
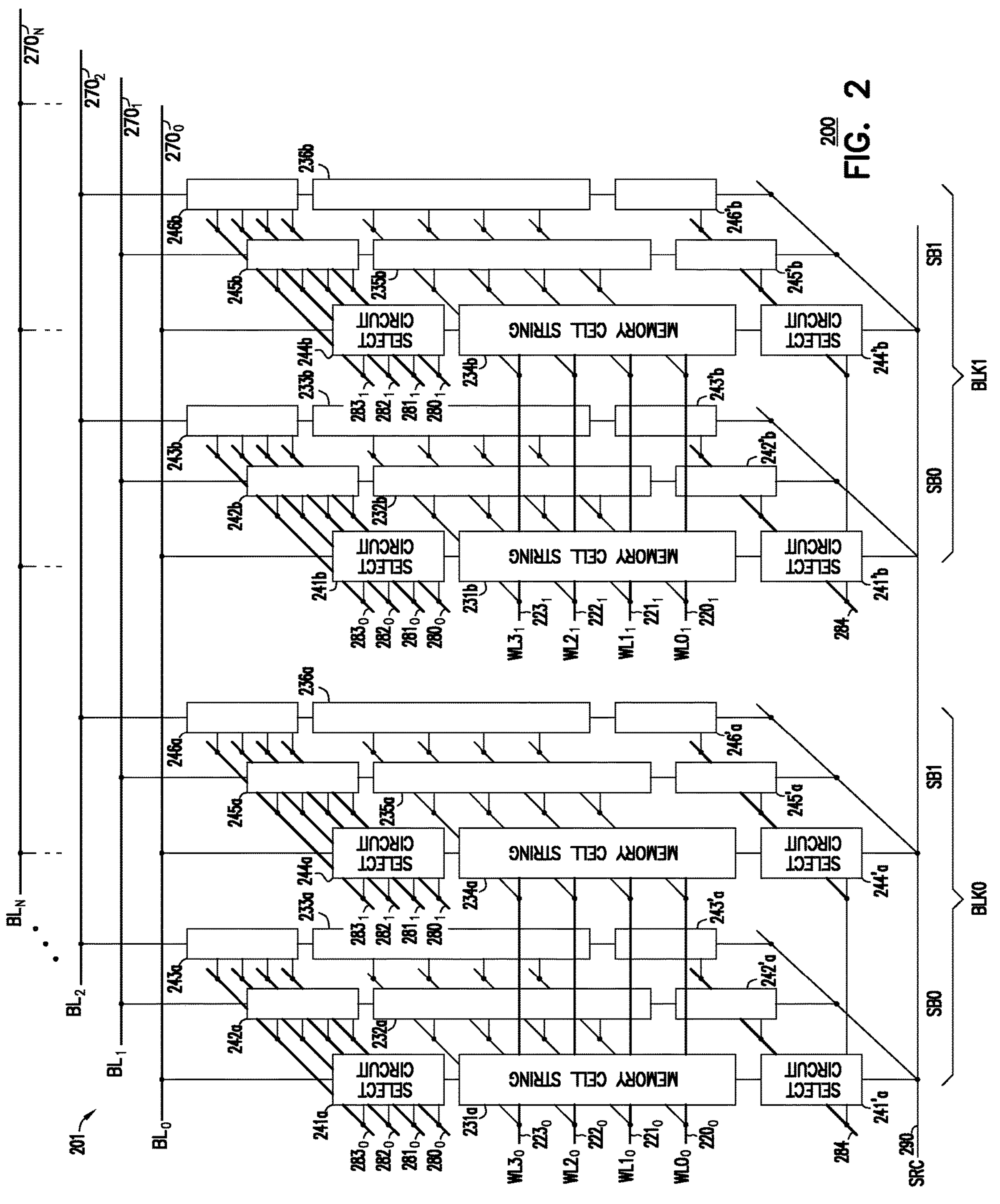
FIG. 2 shows a general schematic diagram of a portion of a memory device including a memory array having memory cell strings and associated select circuits, according to some embodiments described herein.

FIG. 2 shows a general schematic diagram of a portion of a memory device 200 including a memory array 201 having memory cell strings and associated select circuits, according to some embodiments described herein. Memory device 200 can correspond to memory device 100 of FIG. 1. For example, memory array 201 can form part of memory array 101 of FIG. 1.

As shown in FIG. 2, memory device 200 can include blocks (blocks of memory cells) BLK0 and BLK1. Two blocks are shown as an example. Memory device 200 can include many blocks (e.g., up to thousands or more blocks). In the physical structure of memory device 200, the blocks can be arranged (e.g., formed) one block next to another block, such that each block can have a neighboring block. Neighboring blocks are blocks located immediately next to (e.g., adjacent) each other. For example, in the physical structure of memory device 200, blocks BLK0 and BLK1 can be neighboring blocks.

Each of blocks BLK0 and BLK1 of memory device 200 can include (e.g., can be divided into) sub-blocks. For example, each of blocks BLK0 and BLK1 can include sub-blocks SB0 and SB1. Blocks BLK0 and BLK1 can include the same number of sub-blocks. FIG. 2 shows an example where each of blocks BLK0 and BLK1 can include two sub-blocks (e.g., SB0 and SB1). However, each of blocks BLK0 and BLK1 can have more than two blocks (e.g., four sub-blocks SB0, SB1, SB2, and SB3 or more than four sub-blocks).

As shown in FIG. 2, each sub-block (e.g., SB0 or SB1) has its own memory cell strings that can be associated with (e.g., coupled to) respective select circuits. For example, sub-block SB0 of block BLK0 has memory cell strings 231*a*, 232*a*, and 233*a* and associated select circuits (e.g., drain select circuits) 241*a*, 242*a*, and 243*a*, respectively, and select circuits (e.g., source select circuits) 241'*a*, 242'*a*, and 243'*a*, respectively. In another example, sub-block SB1 of block BLK0 has memory cell strings 234*a*, 235*a*, and 236*a* and associated select circuits (e.g., drain select circuits) 244*a*, 245*a*, and 246*a*, respectively, and select circuits (e.g., source select circuits) 244'*a*, 245'*a*, and 246'*a*, respectively.

Similarly, sub-block SB0 of block BLK1 has memory cell strings 231*b*, 232*b*, and 233*b*, and associated select circuits (e.g., drain select circuits) 241*b*, 242*b*, and 243*b*, respectively, and select circuits (e.g., source select circuits) 241'*b*, 242'*b*, and 243'*b*, respectively. Sub-block SB1 of block BLK1 has memory cell strings 234*b*, 235*b*, and 236*b*, and associated select circuits (e.g., drain select circuits) 244*b*, 245*b*, and 246*b*, respectively, and select circuits (e.g., source select circuits) 244'*b*, 245'*b*, and 246'*b*, respectively. The sub-blocks of the blocks (e.g., blocks BLK0 and BLK1) of memory device 200 can have the same number of memory cell strings and associated select circuits.

FIG. 2 shows an example of three memory cell strings and their associated circuits in a sub-block (e.g., in sub-block SB0). However, the number of memory cell strings and their associated select circuits in each the sub-block of blocks BLK0 and BLK1 can vary. Each of the memory cell strings of memory device 200 can include series-connected memory cells (shown in detail in FIG. 3 and FIG. 4A) and a pillar (e.g., pillar of memory cells, such as pillar 422 in FIG. 4A) where the series-connected memory cells can be located (e.g., vertically located) along respective portion of the pillar.

As shown in FIG. 2, memory device 200 can include data lines $270_0$ through $270_N$ that carry signals $BL_0$ through $BL_N$, respectively. Each of data lines $270_0$ through $270_N$ can be structured as a conductive line that can includes conductive materials (e.g., conductively doped polycrystalline silicon (doped polysilicon), metals, or other conductive materials).

The memory cell strings of blocks BLK0 and BLK1 can share data lines $270_0$ through $270_N$ to carry information (in the form of signals) read from or to be stored in memory cells of selected memory cells (e.g., selected memory cells in block BLK0 or BLK1) of memory device 200. For example, memory cell strings 231*a*, 234*a* (of block $BK_0$), 231*b* and 234*b* (of block BLK1) can share data line $270_0$. Memory cell strings 232*a*, 235*a* (of block BK0), 232*b* and 235*b* (of block BK1) can share data line $270_1$. Memory cell strings 233*a*, 236*a* (of block BK0), 233*b* and 236*b* (of block BK1) can share data line $270_2$.

Memory device 200 can include a source (e.g., a source line, a source plate, or a source region) 290 that can carry a signal (e.g., a source line signal) SRC. Source 290 can be structured as a conductive line or a conductive plate (e.g., conductive region) of memory device 200. Source 290 can be a common source (e.g., common source plate or common source region) of blocks BLK0 and BLK1. Alternatively, each of blocks BLK0 and BLK1 can have its own source similar to source 290. Source 290 can be coupled to a ground connection of memory device 200.

Memory device 200 can include control gates (e.g., word lines) $220_0$, $221_0$, $222_0$, and $223_0$ in block BLK0 that can be part of access lines of memory device 200 (that can correspond to part of access lines 150 of memory device 100 of FIG. 1).

Memory device 200 can include control gates (e.g., word lines) $220_1$, $221_1$, $222_1$, and $223_1$ in block BLK1 that can be part of other access lines of memory device 200 (that can correspond to part of access lines 150 of memory device 100 of FIG. 1).

Control gates $220_0$, $221_0$, $222_0$, and $223_0$ can be electrically separated from each other. Control gates $220_1$, $221_1$, $222_1$, and $223_1$ can be electrically separated from each other.

Control gates $220_0$, $221_0$, $222_0$, and $223_0$ can be electrically separated from control gates $220_1$, $221_1$, $222_1$, and $223_1$. Thus, blocks BLK0 and BLK1 can be accessed separately (e.g., accessed one block at a time). For example, block BLK0 can be accessed at one time using control gates $220_0$, $221_0$, $222_0$, and $223_0$, and block BLK1 can be accessed at another time using control gates $220_1$, $221_1$, $222_1$, and $223_1$ at another time.

Memory device 200 can have the same number of control gates among the blocks (e.g., blocks BLK0 and BLK1) of memory device 200. In the example of FIG. 2, memory device 200 has four control gates in each of blocks BLK0 and BLK1. The number of control gates in the blocks (e.g., blocks BLK0 and BLK1) of memory device 200 can be different from four. For example, each of blocks BLK0 and BLK1 can include hundreds of control gates.

Each of control gates $220_0$, $221_0$, $222_0$, and $223_0$ can be part of a structure (e.g., a level) of a conductive material (e.g., a layer of conductive material, shown in FIG. 4A) located in a level of memory device 200. Control gates $220_0$, $221_0$, $222_0$, and $223_0$ can carry corresponding signals (e.g., word line signals) $WL0_0$, $WL1_0$, $WL2_0$, and $WL3_0$. Memory device 200 can use signals $WL0_0$, $WL1_0$, $WL2_0$, and $WL3_0$ to selectively control access to memory cells of block BLK0 during an operation (e.g., read, write, or erase operation). For example, during a read operation, memory device 200 can use signals $WL0_0$, $WL1_0$, $WL2_0$, and $WL3_0$ to control access to selected memory cells of block BLK0 to read (e.g., sense) information (e.g., previously stored information) from the memory cells of block BLK0. In another example, during a write operation, memory device 200 can use signals $WL0_0$, $WL1_0$, $WL2_0$, and $WL3_0$ to control access to selected memory cells of block BLK0 to store information in the selected memory cell of block BLK0.

Each of control gates $220_1$, $221_1$, $222_1$, and $223_1$ can be part of a structure (e.g., a level) of a conductive material (e.g., a layer of conductive material, shown in FIG. 4A) located in a level of memory device 200. Control gates $220_1$, $221_1$, $222_1$, and $223_1$ can carry corresponding signals (e.g., word line signals) $WL0_0$, $WL1_0$, $WL2_0$, and $WL3_0$. Memory device 200 can use signals $WL0_1$, $WL1_1$, $WL2_1$, and $WL3_1$ to selectively control access to memory cells of block BLK0 during an operation (e.g., read, write, or erase operation). For example, during a read operation, memory device 200 can use signals $WL0_1$, $WL1_1$, $WL2_1$, and $WL3_1$ to control access to selected memory cells of block BLK1 to read (e.g., sense) information (e.g., previously stored information) from the memory cells of block BLK1. In another example, during a write operation, memory device 200 can use signals $WL0_1$, $WL1_1$, $WL2_1$, and $WL3_1$ to control access to selected memory cells of block BLK1 to store information in the selected memory cell of block BLK1.

As shown in FIG. 2, in sub-block SB0 of block BLK0, memory device 200 includes select lines (e.g., drain select lines) $\mathbf{280}_0$, $\mathbf{281}_0$, $\mathbf{282}_0$, and $\mathbf{283}_0$ that can be shared by select circuits 241*a*, 242*a*, and 243*a*. In sub-block SB1 of block BLK0, memory device 200 includes select lines (e.g., drain select lines) $\mathbf{280}_1$, $\mathbf{281}_1$, $\mathbf{282}_1$, and $\mathbf{283}_1$ that can be shared by select circuits 244*a*, 245*a*, and 246*a*. Block BLK0 can include a select line (e.g., source select line) 284 that can be shared by select circuits 241'*a*, 242'*a*, 243'*a*, 244'*a*, 245'*a*, and 246'*a*.

In sub-block SB0 of block BLK1, memory device 200 includes select lines (e.g., drain select lines) $\mathbf{280}_0$, $\mathbf{281}_0$, $\mathbf{282}_0$, and $\mathbf{283}_0$ that can be shared by select circuits 241*b*, 242*b*, and 243*b*. Select lines $\mathbf{280}_0$, $\mathbf{281}_0$, $\mathbf{282}_0$, and $\mathbf{283}_0$ of block BLK0 are electrically separated from select lines $\mathbf{280}_0$, $\mathbf{281}_0$, $\mathbf{282}_0$, and $\mathbf{283}_0$ of block BLK1. In sub-block SB1 of block BLK1, memory device 200 includes select lines (e.g., drain select lines) $\mathbf{280}_1$, $\mathbf{281}_1$, $\mathbf{282}_1$, and $\mathbf{283}_1$ that can be shared by select circuits 244*b*, 245*b*, and 246*b*. Select lines $\mathbf{280}_1$, $\mathbf{281}_1$, $\mathbf{282}_1$, and $\mathbf{283}_1$ of block BLK1 are electrically separated from select lines $\mathbf{280}_1$, $\mathbf{281}_1$, $\mathbf{282}_1$, and $\mathbf{283}_1$ of block BLK0. Block BLK1 can include a select line (e.g., source select line) 284 that can be shared by select circuits 241'*b*, 242'*b*, 243'*b*, 244'*b*, 245'*b*, and 246'*b*.

FIG. 2 shows an example where memory device 200 includes four drain select lines (e.g., select lines $\mathbf{280}_0$, $\mathbf{281}_0$, $\mathbf{282}_0$, and $\mathbf{283}_0$) associated with a drain select circuit (e.g., select circuits 241*a*, 242*a*, or 243*a*) in a sub-block (e.g., sub-block SB0 of block BLK0). However, memory device 200 can include fewer or more than four drain select lines associated with a drain select circuit.

FIG. 2 shows an example where memory device 200 includes one source select line (e.g., select line 284) associated with a source select circuit (e.g., select circuits 241'*a*, 242'*a*, or 243'*a*) in a sub-block (e.g., sub-block SB0 of block BLK0). However, memory device 200 can include more than one source select line associated with a source select circuit.

Each of the drain select circuits of memory device 200 can include multiple drain select gates connected in series (e.g., four transistors connected in series, shown in FIG. 3) between a respective data line and a respective memory cell string. The drain select gates can be controlled (e.g., turned on or turned off) by respective drain select lines based on voltages provided to the signals on the respective drain select lines.

Each of the source select circuits of memory device 200 can include a select gate (shown in FIG. 3) coupled between source 290 and a respective memory cell string. The source select gate can be controlled (e.g., turned on or turned off) by the source select line based on a voltage provided to the signals on the source select line.

In FIG. 2, each of the memory cell strings of memory device 200 has memory cells (shown in FIG. 3) arranged in a string (e.g., coupled in series among each other) to store information. During an operation (e.g., read, write, or erase operation) of memory device 200, the memory cell strings can be individually selected to access the memory cells in the selected memory cell string in order to store information in or read information from the selected memory cell string. One or both select circuits (a drain select circuit and a source select circuit) associated with a selected memory cell string can be activated (e.g., by turning on the select gates (e.g., transistors) in the select circuit (or selected circuits)), depending on which operation memory device 200 performs on the selected memory cell string.

Activating a particular select circuit among the select circuits of memory device 200 during an operation of memory device 200 can include providing (e.g., applying) voltages having certain values to the signals on select lines associated with that particular select circuit. When a particular drain select circuit of memory device 200 is activated, it can electrically connect (e.g., form a current path from) a selected memory cell string associated with that particular select circuit to a respective data line (e.g., one of data lines $\mathbf{270}_0$ through $\mathbf{270}_N$). When a particular source select circuit is activated, it can electrically connect (e.g., form a current path from) a selected memory cell string associated with that particular select circuit to source 290.

Figure 3:
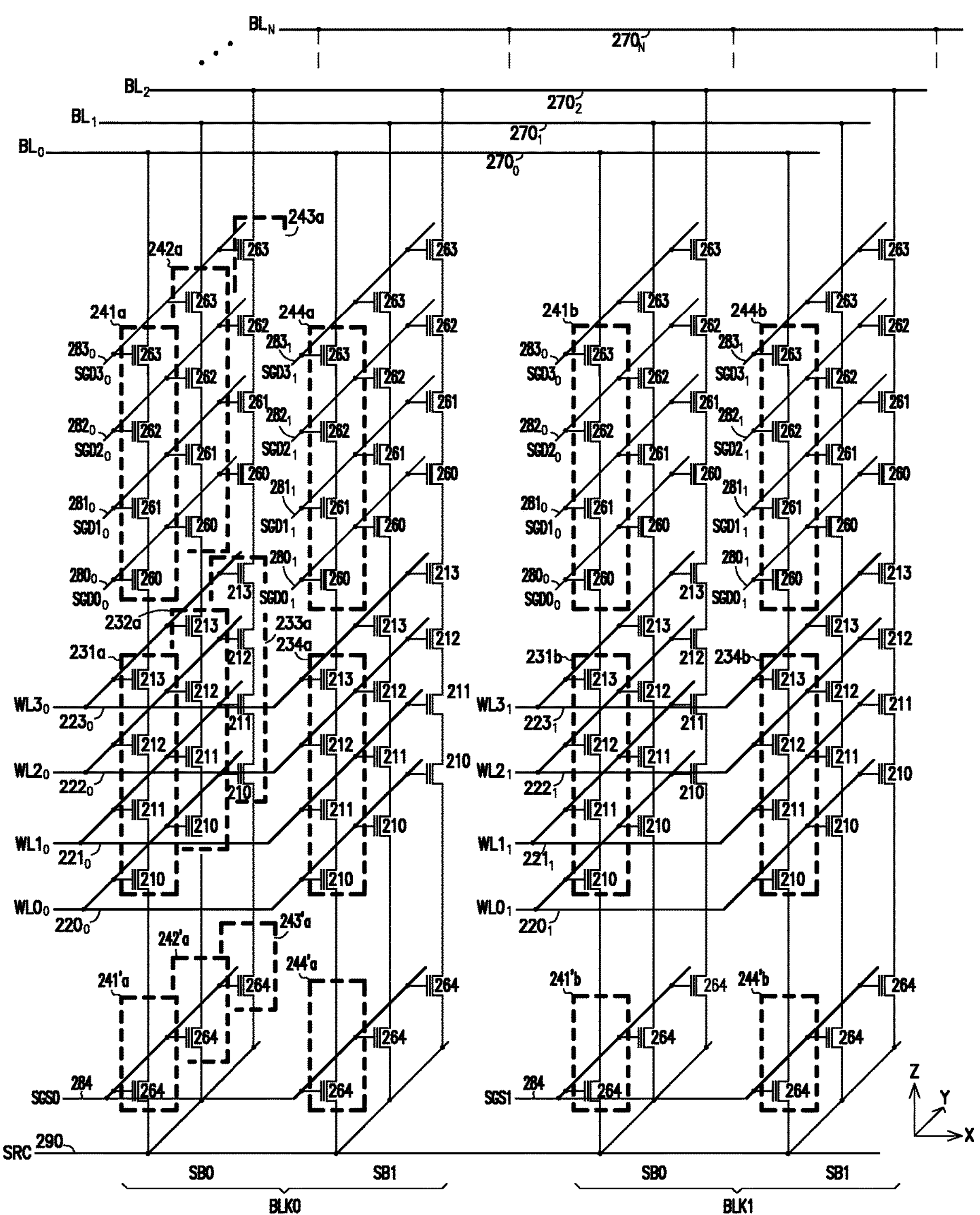
FIG. 3 shows a detailed schematic diagram of the memory device of FIG. 2, according to some embodiments described herein.

FIG. 3 shows a detailed schematic diagram of memory device 200 of FIG. 2, according to some embodiments described herein. For simplicity, only some of the memory cell strings and some of the select circuits of memory device 200 of FIG. 2 are labeled in FIG. 3. Directions X, Y, and Z in FIG. 3 can be relative to the physical directions (e.g., dimensions) of the structure of memory device 200. For example, the Z-direction can be a direction perpendicular to (e.g., vertical direction with respect to) a substrate of memory device 200 (e.g., a substrate 499 shown in FIG. 4A). The Z-direction is perpendicular to the X-direction and Y-direction (e.g., the Z-direction is perpendicular to an X-Y plane of memory device 200).

As shown in FIG. 3, each select line can carry an associated select signal. For example, in sub-block SB0 of block BLK0, select lines (e.g., drain select lines) $\mathbf{280}_0$, $\mathbf{281}_0$, $\mathbf{282}_0$, and $\mathbf{283}_0$ can carry associated signals (e.g., drain select-gate signals) $\text{SGD}\mathbf{0}_0$, $\text{SGD}\mathbf{1}_0$, $\text{SGD}\mathbf{2}_0$, and $\text{SGD}\mathbf{3}_0$, respectively. In sub-block SB1 of block BLK0, select lines (e.g., drain select lines) $\mathbf{280}_1$, $\mathbf{281}_1$, $\mathbf{282}_1$, and $\mathbf{283}_1$, and $\mathbf{283}_1$ can carry associated signals $\text{SGD}\mathbf{0}_1$, $\text{SGD}\mathbf{1}_1$, $\text{SGD}\mathbf{2}_1$, and $\text{SGD}\mathbf{3}_1$, respectively. Sub-blocks SB0 and SB1 of block BLK0 can share select line 284 and associated signal (e.g., source select-gate signal) SGS0.

In sub-block SB0 of block BLK1, select lines (e.g., drain select lines) $\mathbf{280}_0$, $\mathbf{281}_0$, $\mathbf{282}_0$, and $\mathbf{283}_0$ can carry associated signals $\text{SGD}\mathbf{0}_0$, $\text{SGD}\mathbf{1}_0$, $\text{SGD}\mathbf{2}_0$, and $\text{SGD}\mathbf{3}_0$, respectively. Signals $\text{SGD}\mathbf{0}_0$, $\text{SGD}\mathbf{1}_0$, $\text{SGD}\mathbf{2}_0$, and $\text{SGD}\mathbf{3}_0$ of sub-block SB0 of block BLK1 are different from signals $\text{SGD}\mathbf{0}_0$, $\text{SGD}\mathbf{1}_0$, $\text{SGD}\mathbf{2}_0$, and $\text{SGD}\mathbf{3}_0$ of sub-block SB0 of block BLK0.

In sub-block SB1 of block BLK1, select lines (e.g., drain select lines) $\mathbf{280}_1$, $\mathbf{281}_1$, $\mathbf{282}_1$, and $\mathbf{283}_1$ can carry associated signals $\text{SGD}\mathbf{0}_1$, $\text{SGD}\mathbf{1}_1$, $\text{SGD}\mathbf{2}_1$, and $\text{SGD}\mathbf{3}_1$, respectively. Signals $\text{SGD}\mathbf{0}_1$, $\text{SGD}\mathbf{1}_1$, $\text{SGD}\mathbf{2}_1$, and $\text{SGD}\mathbf{3}_1$ of sub-block SB1 of block BLK1 are different from signals $\text{SGD}\mathbf{0}_1$, $\text{SGD}\mathbf{1}_1$, $\text{SGD}\mathbf{2}_1$, and $\text{SGD}\mathbf{3}_1$ of sub-block SB1 of block BLK0. Sub-blocks SB0 and SB1 of block BLK1 can share select line 284 and associated signal (e.g., source select-gate signal) SGS1.

As shown in FIG. 3, the drain select lines within a sub-block (e.g., select lines $\mathbf{280}_0$, $\mathbf{281}_0$, $\mathbf{282}_0$, and $\mathbf{283}_0$ in sub-block SB0 of block BLK0) can be electrically separated from each other and can be associated with separate drain select-gate signals (e.g., signals $\text{SGD}\mathbf{0}_0$, $\text{SGD}\mathbf{1}_0$, $\text{SGD}\mathbf{2}_0$, and $\text{SGD}\mathbf{3}_0$). Alternatively, the drain select lines within a sub-block (e.g., select lines $\mathbf{280}_0$, $\mathbf{281}_0$, $\mathbf{282}_0$, and $\mathbf{283}_0$ in sub-block SB0 of block BLK0) can be electrically coupled (e.g., ganged) together and can be associated with the same signal drain select-gate signal (e.g., a single SGD signal (not shown) instead of four signals $\text{SGD}\mathbf{0}_0$, $\text{SGD}\mathbf{1}_0$, $\text{SGD}\mathbf{2}_0$, and $\text{SGD}\mathbf{3}_0$).

As shown in FIG. 3, memory device 200 can include memory cells 210, 211, 212, and 213; select gates (e.g., drain select gates or transistors) 260, 261, 262, and 263; and a select gate (e.g., a source select gate or transistor) 264 that can be physically arranged in 3D, such as X, Y, and Z directions (e.g., dimensions), with respect to the structure (shown in FIG. 4A) of memory device 200.

In FIG. 3, each of the memory cell strings (e.g., memory cell strings 231*a*, 232*a*, 233*a*, 234*a*, 231*b*, and 234*b*) of memory device 200 can include one of memory cells 210, one of memory cells 211, one of memory cells 212, and one of memory cells 213. FIG. 3 shows an example of four memory cells 210, 211, 212, and 213 in each memory cell string. The number of memory cells in each memory cell string can vary.

As shown in FIG. 3, each of select circuits (e.g., drain select circuits) 241*a*, 242*a*, 243*a*, 244*a*, 241*b*, and 244*b* can include four select gates: one of select gates 260, one of select gates 261, one of select gates 262, and one of select gate 263. FIG. 3 shows an example where memory device 200 includes four drain select gates (e.g., select gates 260, 261, 262, and 263) in each drain select circuit. However, memory device 200 can include fewer or more than four drain select gates in each drain select circuit, depending on the number of drain select lines associated with each drain select circuit. The number of drain select gates (e.g., four in the example of in FIG. 3) in each drain select circuit can be equal to the number of drain select lines (e.g., four in the example of in FIG. 3) associated with each drain select circuit.

Each of select circuits (e.g., source select circuits) 241'*a*, 242'*a*, 243'*a*, 244'*a*, 241'*b*, and 244'*b* can include select gate 264. FIG. 3 shows an example where memory device 200 includes one source select gate (e.g., select gate 264) in each source select circuit. However, memory device 200 can include more than one source select gate in each source select circuit, depending on the number of source select lines associated with each source select circuit. The number of source select gates (e.g., one source select gate in the example of in FIG. 3) in each source select circuit can be equal to the number of source select lines (e.g., one source select line in the example of in FIG. 3) associated with each source select circuit.

Each of select gates 260, 261, 262, 263, and 264 can operate as a transistor. For example, select gate 260 of select circuit 241*a* can operate as a field effect transistor (FET), such as a metal-oxide semiconductor FET (MOSFET). An example of such a MOSFET includes an n-channel MOS (NMOS) transistor.

As shown in FIG. 3, a select line shared among particular select circuits can be shared by respective select gates of those particular select circuits. For example, select line $\mathbf{280}_0$ of sub-block SB0 of block BLK0 can be shared by select gates 260 of select circuits 241*a*, 242*a*, and 243*a* of sub-block SB0 of block BLK0. Select line $\mathbf{281}_0$ of sub-block SB0 of block BLK0 can be shared by select gates 261 of select circuits 241*a*, 242*a*, and 243*a* of sub-block SB0 of block BLK0. Select line $\mathbf{282}_0$ of sub-block SB0 of block BLK0 can be shared by select gates 262 of select circuits 241*a*, 242*a*, and 243*a* of sub-block SB0 of block BLK0. Select line $\mathbf{283}_0$ of sub-block SB0 of block BLK0 can be shared by select gates 263 of select circuits 241*a*, 242*a*, and 243*a* of sub-block SB0 of block BLK0.

In another example, select line 284 of sub-block SB0 of block BLK0 can be shared by select gates 264 of select circuits 241'*a*, 242'*a*, and 243'*a* of sub-block SB0 of block BLK0.

A select line (e.g., select line $\mathbf{280}_0$ of sub-block SB0 of block BLK0) can carry a signal (e.g., signal SGD$\mathbf{0}_0$) but it does not operate like a switch (e.g., a transistor). A select gate (e.g., select gate 260 of select circuit 241*a* of sub-block SB0 of block BLK0) can receive a signal (e.g., signal SGD$\mathbf{0}_0$) from a respective select line (e.g., select line $\mathbf{280}_0$ of sub-block SB0 of block BLK0) and can operate like a switch (e.g., a transistor).

In the physical structure of memory device 200, a select line (e.g., select line $\mathbf{280}_0$ of sub-block SB0 of block BLK0) can be a structure (e.g., a level) of a conductive material (e.g., a layer (e.g., a piece) of conductive material) located in a single level of memory device 200. The conductive material can include metal, doped polysilicon, or other conductive materials.

In the physical structure of memory device 200, a select gate (e.g., select gate 260 of select circuit 241*a* of sub-block SB0 of block BLK0) can include (can be formed from) a portion of the conductive material of a respective select line (e.g., select line $\mathbf{280}_0$ of sub-block SB0 of block BLK0), a portion of a channel material (e.g., polysilicon channel), and a portion of a dielectric material (e.g., similar to a gate oxide of a transistor (e.g., FET)) between the portion of the conductive material and the portion of the channel material.

Figure 4A:
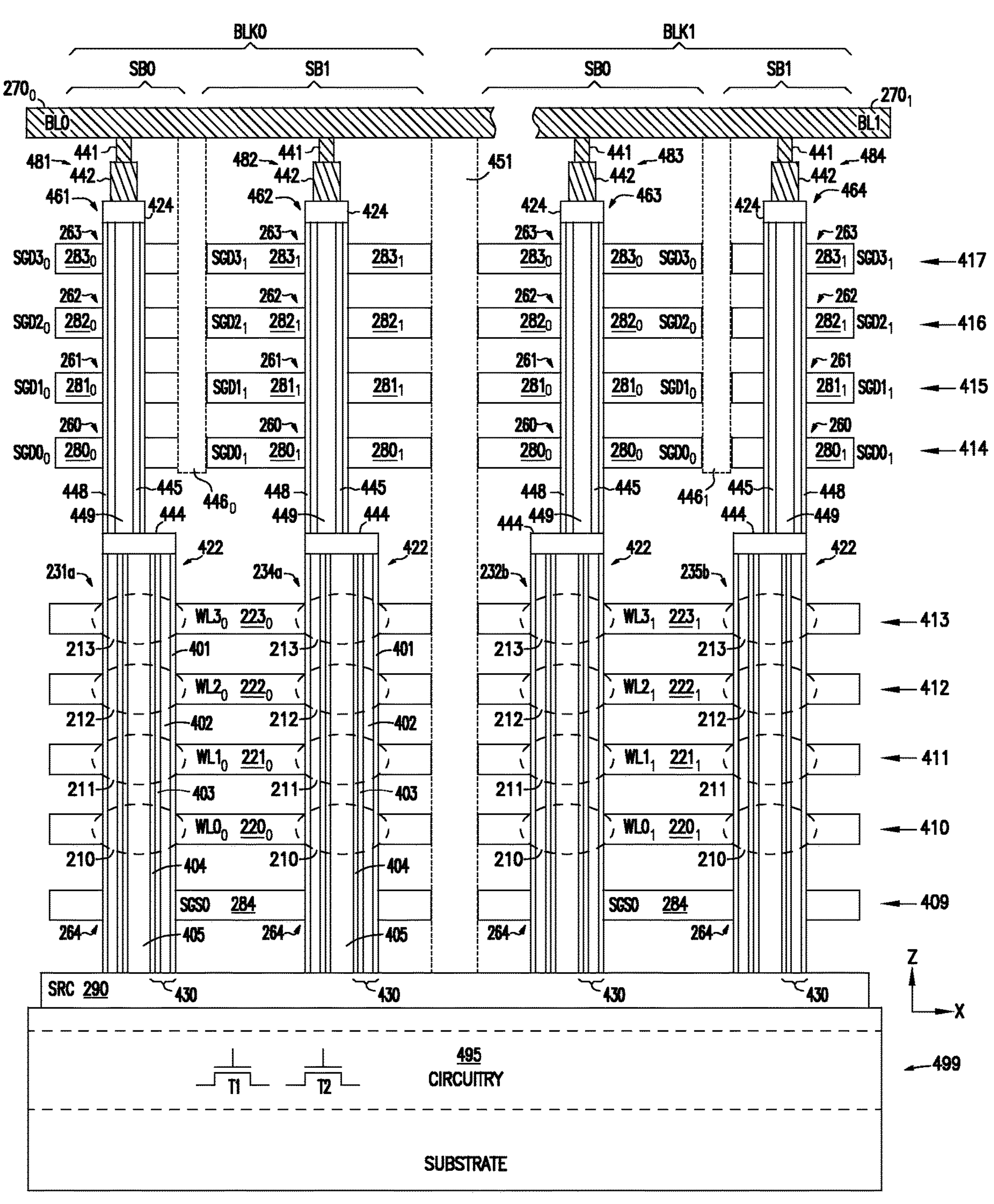
FIG. 4A shows a side view (e.g., cross-section) of a structure of a portion of the memory device of FIG. 3 including the conductive structures in two blocks of memory cells and a dielectric structure between the two blocks, according to some embodiments described herein.

FIG. 4A shows a side view (e.g., cross-section) of a structure of a portion of memory device 200 of FIG. 3 including a dielectric structure (e.g., block divider) 451 between blocks BLK0 and BLK1, dielectric structures (e.g., sub-block dividers) $\mathbf{446}_0$ and $\mathbf{446}_1$, pillars 422, and conductive structures between pillars and respective data lines, according to some embodiments described herein. The structure of memory device 200 in FIG. 4A corresponds to part of the schematic diagram of memory device 200 shown in FIG. 3. For simplicity, some elements of memory device 200 of FIG. 3 are omitted from the structure of the portion of memory device 200 shown in FIG. 4A.

For simplicity, cross-section lines (e.g., hatch lines) are omitted from some or all the elements shown in the drawings described herein. Some elements of memory device 200 (and other memory devices described herein) may be omitted from a particular figure of the drawings so as not to obscure the view or the description of the element (or elements) being described in that particular figure. Further, the dimensions (e.g., physical structures) of the elements shown in the drawings described herein are not scaled.

As shown in FIG. 4A, memory device 200 can include a substrate 499 over which memory cells 210, 211, 212, and 213 of memory cell strings 231*a*, 234*a*, 231*b*, and 234*b* of respective sub-blocks SB0 and SB1 of blocks BLK0 and BLK1 can be formed (e.g., formed vertically in z-direction with respect to source 290 and substrate 499).

Figures 4B, 4C:
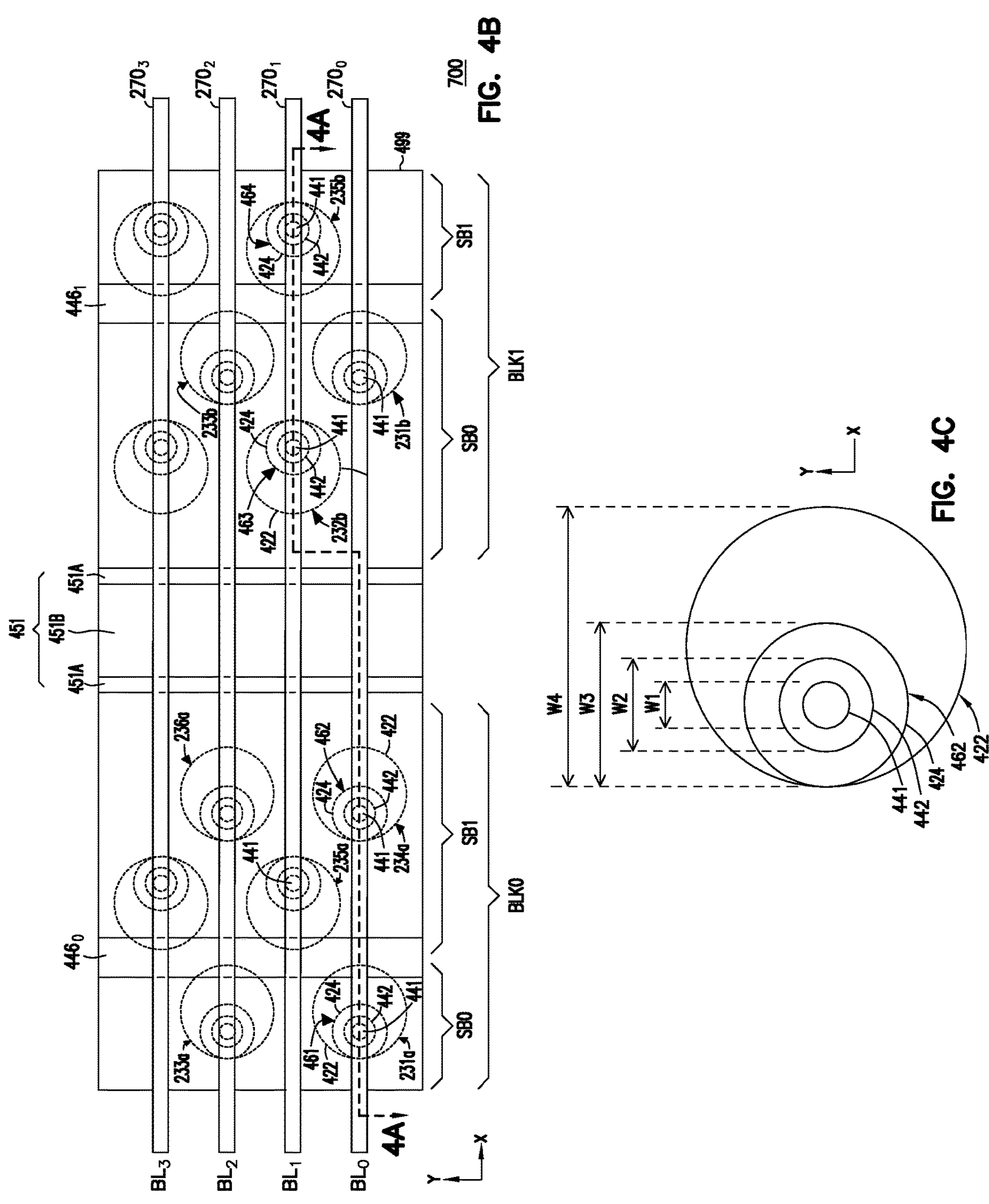
FIG. 4B shows a top view of a portion of the memory device of FIG. 4A including relative locations of data lines, conductive structures, and memory cell pillars, according to some embodiments described herein.
FIG. 4C shows relationships among widths (e.g., diameters) of conductive contacts of conductive structure and pillars of the memory device of FIG. 4A and FIG. 4B, according to some embodiments described herein.

Dielectric structure (e.g., block divider) 451 can be formed to electrically separate block BLK0 from block BLK1. Dielectric structure 451 can have a depth (e.g., height) in the Z-direction. The depth of dielectric structure 451 can be a distance (e.g., vertical distance) between and source 290 and a data line (e.g., data line $\mathbf{270}_0$ or $\mathbf{270}_1$). FIG. 4B shows more details from a top view of dielectric structure 451, which can be formed in (or can include) a slit (not labeled) and materials 451A and 451B (FIG. 4B) formed in (e.g., filled in) the slit. Material 451A can include a dielectric material (e.g., silicon dioxide). Material 451B can include polysilicon.

In FIG. 4A, dielectric structure (e.g., sub-block divider) $\mathbf{446}_0$ can be formed to electrically separate select lines $\mathbf{280}_0$, $\mathbf{281}_0$, $\mathbf{282}_0$, and $\mathbf{283}_0$ of sub-block SB0 of block BLK0 from select lines $\mathbf{280}_1$, $\mathbf{281}_1$, $\mathbf{282}_1$, and $\mathbf{283}_1$ of sub-block SB1 of block BLK0. Dielectric structure (e.g., sub-block divider) $\mathbf{446}_1$ can be formed to electrically separate select lines $\mathbf{280}_0$, $\mathbf{281}_0$, $\mathbf{282}_0$, and $\mathbf{283}_0$ of sub-block SB0 of block BLK1 from select lines $\mathbf{280}_1$, $\mathbf{281}_1$, $\mathbf{282}_1$, and $\mathbf{283}_1$ of sub-block SB1 of block BLK1.

As shown in FIG. 4A, memory device 200 includes conductive structures 461 and 462 in block BLK0, and conductive structures 463 and 464 in block BLK1. Conductive structures 461, 462, 463, and 464 can be located (formed) over and electrically coupled to (in electrical contact with) respective pillars 422.

Memory device 200 includes conductive structures 481 and 482 in block BLK0, and conductive structures 483 and 484 in block BLK1. Conductive structures 481, 482, 483, and 484 cab be located (formed) over and electrically coupled to (in electrical contact with) conductive structures 461, 462, 463, and 464, respectively.

Conductive structure 461 and 481 can be part of select circuit (e.g., drain select circuit) 241*a* of FIG. 3 of block BLK0. Conductive structure 462 and 482 (FIG. 4A) can be part of select circuit (e.g., drain select circuit) 244*a* of FIG. 3 of block BLK0. Conductive structure 463 and 483 (FIG. 4A) can be part of select circuit (e.g., drain select circuit) 242*b* of FIG. 3 of block BLK0. Conductive structure 464 and 484 (FIG. 4A) can be part of select circuit (e.g., drain select circuits) 245*b* of FIG. 3 of block BLK0.

As shown in FIG. 4A, memory device 200 can include different levels 409 through 417 with respect to a Z-direction. Levels 409 through 417 are internal device levels between substrate 499 and data line $\mathbf{270}_0$.

Substrate 499 of memory device 200 can include monocrystalline (also referred to as single-crystal) semiconductor material. For example, substrate 499 can include monocrystalline silicon (also referred to as single-crystal silicon). The monocrystalline semiconductor material of substrate 499 can include impurities, such that substrate 499 can have a specific conductivity type (e.g., n-type or p-type).

As shown in FIG. 4A, memory device 200 can include circuitry 495 located in (e.g., formed in) substrate 499. At least a portion of circuitry 495 (e.g., the entire circuitry 495 or only a portion of circuitry 495) can be located in a portion of substrate 499 that is under (e.g., directly under) memory cell strings 231*a*, 234*a*, 231*b*, and 234*b*. Circuitry 495 can include circuit elements (e.g., transistors T1 and T2 and other transistors (not shown)) coupled to other circuit elements outside substrate 499. For example, data lines $\mathbf{270}_0$ and $\mathbf{270}_1$ and control gates $\mathbf{220}_0$, $\mathbf{221}_0$, $\mathbf{222}_0$, $\mathbf{223}_0$ of block BLK0 and control gates $\mathbf{220}_1$, $\mathbf{221}_1$, $\mathbf{222}_1$, and $\mathbf{223}_1$ of block BLK1 can be coupled to circuit elements of memory device 200. Circuitry 495 can include decoder circuits, driver circuits, buffers, sense amplifiers, charge pumps, and other circuitry of memory device 200. Transistors T1 and T2 (and other transistors, not shown) of circuitry 495 can be part of (e.g., can represent) such decoder circuits, driver circuits, buffers, sense amplifiers, charge pumps, and other circuitry of memory device 200.

Source 290 can include a conductive material (or materials (e.g., different levels of materials)) and can have a length extending in the X-direction. FIG. 4A shows an example where source 290 can be formed over a portion of substrate 499 (e.g., by depositing a conductive material over substrate 499). Alternatively, source 290 can be formed in or formed on a portion of substrate 499 (e.g., by doping a portion of substrate 499).

As shown in FIG. 4A, select lines (e.g., drain select lines) $\mathbf{280}_0$, $\mathbf{281}_0$, 2820, and $\mathbf{283}_0$ of each of blocks BLK0 and BLK1 can be located in respective levels 414, 415, 416, and 417. Select lines (e.g., drain select lines) $\mathbf{280}_1$, $\mathbf{281}_1$, $\mathbf{282}_1$, and $\mathbf{283}_1$ of each of blocks BLK0 and BLK1 can also be located in respective levels 414, 415, 416, and 417. Select line (e.g., source select line) 284 of each of blocks BLK0 and BLK1 can be located in the same level (e.g., level 409) between substrate 499 and memory cell strings 231*a*, 234*a*, 231*b*, and 234*b*.

As shown in FIG. 4A, a select line (e.g., select line $\mathbf{280}_0$) can be a structure (e.g., a level) of a conductive material (e.g., a layer (e.g., a piece) of conductive material or materials) located in a single level of memory device 200. As described above, a select line can carry a signal (e.g., signal SGD$\mathbf{0}_0$) but it does not operate like a switch (e.g., a transistor). A select gate (e.g., select gate 260) can include a portion of a respective select line (e.g., a portion of the piece of the conductive material that forms the respective select line) and additional structures to perform a function (e.g., function of a transistor).

For example, in FIG. 4A, select gate 260 of sub-block SB0 of block BLK0 can include a portion of select line $\mathbf{280}_0$ sub-block SB0 of block BLK0 and a portion of conductive structure 461 (e.g., a portion of conductive region 445) adjacent select line $\mathbf{280}_0$ of sub-block SB0 of block BLK0. In another example, select gate 261 of sub-block SB0 of block BLK0 can include a portion of select line $\mathbf{281}_0$ sub-block SB0 of block BLK0 and a portion of conductive structure 461 (e.g., a portion of conductive region 445) adjacent select line $\mathbf{281}_0$ of sub-block SB0 of block BLK0. In another example, select gate 262 of sub-block SB0 of block BLK0 can include a portion of select line $\mathbf{282}_0$ sub-block SB0 of block BLK0 and a portion of conductive structure 461 (e.g., a portion of conductive region 445) adjacent select line $\mathbf{282}_0$ of sub-block SB0 of block BLK0.

Memory cells 210, 211, 212, and 213 of memory cell strings 231*a*, 234*a*, 231*b*, and 234*b* can be located in levels 410, 411, 412, and 413, respectively. Control gates $\mathbf{220}_0$, $\mathbf{221}_0$, $\mathbf{222}_0$, and $\mathbf{223}_0$ (associated with memory cells 210, 211, 212, and 213, respectively) of block BLK0 can be located in levels 410, 411, 412, and 413, respectively, that are the same levels at which memory cells 210, 211, 212, and 213 are located. Control gates $\mathbf{220}_1$, $\mathbf{221}_1$, $\mathbf{222}_1$, and $\mathbf{223}_1$ (associated with memory cells 210, 211, 212, and 213, respectively) of block BLK1 can be located in levels 410, 411, 412, and 413, respectively, that are the same levels at which control gates $\mathbf{220}_0$, $\mathbf{221}_0$, $\mathbf{222}_0$, and $\mathbf{223}_0$ of block BLK0 can be located.

Example materials for control gates $\mathbf{220}_0$, $\mathbf{221}_0$, $\mathbf{222}_0$, $\mathbf{223}_0$, $\mathbf{220}_1$, $\mathbf{221}_1$, $\mathbf{222}_1$, and $\mathbf{223}_1$ include a single conductive material (e.g., single metal (e.g., tungsten)) or a combination of conductive materials (e.g., a combination (e.g., a multi-layer) of aluminum oxide, titanium nitride, and tungsten). Select lines $\mathbf{280}_0$, $\mathbf{281}_0$, $\mathbf{282}_0$, $\mathbf{283}_0$, $\mathbf{280}_1$, $\mathbf{281}_1$, $\mathbf{282}_1$, $\mathbf{283}_1$, and 284 can have the same material (or materials) as control gates $\mathbf{220}_0$, $\mathbf{221}_0$, $\mathbf{222}_0$, $\mathbf{223}_0$, $\mathbf{220}_1$, $\mathbf{221}_1$, $\mathbf{222}_1$, and $\mathbf{223}_1$.

Memory device 200 can also include dielectric materials (not labeled in FIG. 4A) interleaved with other elements in different levels (e.g., levels interleaved with levels 409 through 417) of memory device 200. For example, memory device 200 can include dielectric materials (e.g., silicon dioxide) located between levels 414 and 417 and interleaved with (located in the spaces between) select lines $\mathbf{280}_0$, $\mathbf{281}_0$, $\mathbf{282}_0$, and $\mathbf{283}_0$ of blocks BLK0 and BLK1. In another example, memory device 200 can include other dielectric materials (e.g., silicon dioxide) located between levels 409 and 413 and interleaved with (located in the spaces between) control gates $\mathbf{220}_0$, $\mathbf{221}_0$, $\mathbf{222}_0$, and $\mathbf{223}_0$ of block BLK0, and control gates $\mathbf{220}_1$, $\mathbf{221}_1$, $\mathbf{222}_1$, and $\mathbf{223}_1$ of block BLK1.

Each of pillars (pillars of memory cells) 422 can be part of a respective memory cell string. Each of pillars 422 can have length extending outwardly (e.g., extending vertically in the direction of the Z-direction). As shown in FIG. 4A, sub-blocks SB0 and SB1 of blocks BLK0 and BLK1 can include respective pillars 422. Memory cells 210, 211, 212, and 213 and control gates $\mathbf{220}_0$, $\mathbf{221}_0$, $\mathbf{222}_0$, $\mathbf{223}_0$, $\mathbf{220}_1$, $\mathbf{221}_1$, $\mathbf{222}_1$, and $\mathbf{223}_1$ can be located (e.g., vertically located) along respective portions (e.g., segments) of pillars 422 in the Z-direction.

As shown in FIG. 4A, memory device 200 can include a structure 430 and a structure 405 that can be part of a respective pillar of pillars 422 and extending continuously along a length of the respective pillar. Structure 405 can include dielectric material (e.g., silicon dioxide). Structure 430 is adjacent portions of respective access lines (control gates $\mathbf{220}_0$, $\mathbf{221}_0$, $\mathbf{222}_0$, and $\mathbf{223}_0$, or control gates $\mathbf{220}_1$, $\mathbf{221}_1$, $\mathbf{222}_1$, and $\mathbf{223}_1$).

Structure 430 can include portions 401, 402, 403, and 404. Parts of structure 430 along a particular pillar can form part of each of memory cells of the memory cell string adjacent that particular pillar. Thus, each of memory cells 210, 211, 212, and 213 of a memory cell string can include part of structure 430 (part of each of portions 401, 402, 403, and 404) located directly between one of the access lines (one of control gates $\mathbf{220}_0$, $\mathbf{221}_0$, $\mathbf{222}_0$, and $\mathbf{223}_0$, $\mathbf{220}_1$, $\mathbf{221}_1$, $\mathbf{222}_1$, and $\mathbf{223}_1$) and a respective pillar.

Structure 430 can be electrically coupled to source 290. Structure 430 can include a conductive structure (e.g., portion 404) that can be part of a conductive path (e.g., pillar channel structure) to conduct current between data line $\mathbf{270}_0$ and source 290.

Structure 430 can be part of a TANOS (TaN, $Al_2O_3$, $Si_3N_4$, $SiO_2$, Si) structure. For example, portion 401 (e.g., interpoly dielectric portion) can include a charge blocking material or materials (e.g., a dielectric material such as TaN and $Al_2O_3$) that are capable of blocking a tunneling of a charge. Portion 402 can include a charge storage element (e.g., charge storage material or materials, such as $Si_3N_4$) that can provide a charge storage function (e.g., trap charge) to represent a value of information stored in memory cells 210, 211, 212, or 213. Portion 403 can include a dielectric, such as a tunnel dielectric material or materials (e.g., $SiO_2$) that are capable of allowing tunneling of a charge (e.g., electrons). Portion 404 can include polysilicon (e.g., doped or undoped polysilicon) and can be a channel structure (e.g., pillar channel) that can conduct current during operation of memory device 200.

As an example, portion 403 can allow tunneling of electrons from portion 404 to portion 402 during a write operation and tunneling of electrons from portion 402 to portion 404 during an erase operation of memory device 200. Moreover, portion 403 can allow tunneling of holes from portion 404 to portion 402, compensating the trapped electron recombination during an erase operation of memory device 200.

In an alternative arrangement of memory device 200, structure 430 can be part of a SONOS (Si, $SiO_2$, $Si_3N_4$, $SiO_2$, Si) structure. In another alternative arrangement, structure 430 can be part of a floating gate structure (e.g., portion 402 can be polysilicon and each of portions 401 and 403 can be dielectric (e.g., $SiO_2$)). FIG. 4A shows an example of structure 430 having a particular shape (e.g., the shape shown in FIG. 4A). However, structure 430 can have a different shape as long as it can be part of a conductive path between a respective data line (e.g., data line $\mathbf{270}_0$ or $\mathbf{270}_1$) and source 290.

As shown in FIG. 4A, each of conductive structures 461, 462, 463, and 464 can include conductive contact (e.g., conductive plug) 424, conductive contact (e.g., pillar contact) 444, a conductive region (e.g., conductive path) 445, and dielectric regions 448 and 449. Conductive contacts 441, 442, 424, and 444 can include the same material or different materials.

Conductive region 445 can include doped or undoped polysilicon. Dielectric regions 448 and 449 can include silicon dioxide. Conductive region 445 can form part of a channel region of each of select gates (e.g., select transistors) 260, 261, 262, and 263 of a respective structure among conductive structures 461, 462, 463, and 464. Dielectric region 448 can be a gate oxide region of select gates (e.g., select transistors) 260, 261, 262, and 263 of a respective structure among conductive structures 461, 462, 463, and 464. Dielectric region 448 can electrically separate conductive region 445 from select lines (e.g., select lines $\mathbf{280}_0$, $\mathbf{281}_0$, $\mathbf{282}_0$, and $\mathbf{283}_0$) of a respective conductive structure among conductive structures 461, 462, 463, and 464. Each of conductive structures 461, 462, 463, and 464 and a respective conductive structure among conductive structures 481, 482, 483, and 484 can be part of a conductive path (e.g., current path) between a respective data line (e.g., data line $\mathbf{270}_0$ or $\mathbf{270}_1$) and source 290 through part of a respective pillar 422.

As shown in FIG. 4A, each of conductive structures 481, 482, 483, and 484 can include a conductive contact 442 and a conductive contact 441 formed over and in electrical contact with a respective conductive contact 442. Conductive contacts 441 and 442 can include a material (e.g., tungsten or other metals) different from the materials (e.g., conductively doped polysilicon or conductive materials) of one or both of conductive contacts 424 and 444.

In block BLK0, conductive structures 481 and 461, and structure 430 of memory cell string 231*a*, can form part of a conductive path (e.g., current path) between data line $\mathbf{270}_0$ and source 290 through memory cell string 231*a* during an operation (e.g., read or write operation) of memory device 200. Conductive structures 482 and 462, and structure 430 of memory cell string 234*a*, can form part of a conductive path (e.g., current path) between data line $\mathbf{270}_0$ and source 290 through memory cell string 234*a*.

In block BLK1, conductive structures 483 and 463, and structure 430 of memory cell string 232*b*, can form part of a conductive path (e.g., current path) between data line $\mathbf{270}_1$ and source 290 through memory cell string 232*b*. Conductive structures 484 and 464, and structure 430 of memory cell string 235*b*, can form part of a conductive path (e.g., current path) between data line $\mathbf{270}_1$ and source 290 through memory cell string 235*b*.

FIG. 4B shows a top view of memory device 200 of FIG. 4A including relative locations of data lines $\mathbf{270}_0$, $\mathbf{270}_1$, $\mathbf{270}_2$, and $\mathbf{270}_3$, conductive structures 461, 462, 463, and 464, and pillars 422. Line 4A-4A in FIG. 4B shows a location of the side view (e.g., cross-section) of memory device 200 as shown and described above with reference to FIG. 4A. For simplicity, only a portion (portion including memory cell strings 231*a* and 233*a*) of sub-block SB0 of block BLK0 in FIG. 2 is shown in FIG. 4B. Only a portion (portion including memory cell string 235*b*) of sub-block SB1 of block BLK1 of FIG. 2 is shown in FIG. 4B. Some of the elements of memory device 200 of FIG. 4B are not shown in FIG. 2 through FIG. 4A including data line $\mathbf{270}_3$ (and associated signal $BL_3$) and memory cell strings and select gate structures (not labeled) coupled to data line $\mathbf{270}_3$.

For simplicity, only a few pillars 422 of respective memory cell strings are labeled in FIG. 4B.

As shown in FIG. 4B, each of conductive structures 461, 462, 463, and 464 can be located at a location that is offset from the center of pillar 422 of a respective memory cell string. For example, conductive structure 462 in block BLK1 can be located at a location that is offset from pillar 422 of memory cell string 234*a*. In another example, conductive structure 463 in block BLK1 can be located at a location that is offset from pillar 422 of memory cell string 232*b*. Locating (forming) conductive structures 461, 462, 463, and 464 at such offset locations (e.g., location shown in FIG. 4A) allows more room (e.g., more margin) for dielectric structures (e.g., sub-block dividers) $\mathbf{446}_0$ and $\mathbf{446}_1$ to be formed at particular locations (e.g., location shown in FIG. 4A) between (from top view) respective conductive structures 461, 462, 463, and 464.

As shown in FIG. 4B, data lines $\mathbf{270}_0$, $\mathbf{270}_1$, $\mathbf{270}_2$, and $\mathbf{270}_3$ can be located over (in the Z-direction) and extend across (in the X-direction) the blocks (e.g., blocks BLK0 and BLK1) of memory device 200. Each of data lines $\mathbf{270}_0$, $\mathbf{270}_1$, $\mathbf{270}_2$, and $\mathbf{270}_3$ can contact (e.g., can be directly coupled to) at least one conductive contact 441 in block BLK0, and contact (e.g., can be directly coupled to or electrically coupled to) at least one conductive contact 441 in block BLK1.

For example, data line $\mathbf{270}_0$ can contact (e.g., directly coupled or electrically coupled to) conductive contacts 441 of respective conductive structures 481 and 482 in block BLK0, and contact (e.g., directly coupled or electrically coupled to) conductive contact 441 of a conductive structure (not labeled) located over memory cell string 231*b* in block BLK1. In another example, data line $\mathbf{270}_1$ can contact (e.g., directly coupled or electrically coupled to) conductive contacts 441 of respective conductive structures 463 and 464 in block BLK1, and contact (e.g., directly coupled or electrically coupled to) conductive contact 441 of a conductive structure (not labeled) located over memory cell string 235*a* in block BLK0.

Each of data lines $\mathbf{270}_0$, $\mathbf{270}_1$, $\mathbf{270}_2$, and $\mathbf{270}_3$ can contact (e.g., can be directly coupled to) dielectric structure 451. For example, data lines $\mathbf{270}_0$ can contact (e.g., directly coupled to) dielectric structure 451. In another example, data lines $\mathbf{270}_1$ can contact (e.g., directly coupled to) dielectric structure 451.

FIG. 4C shows relationships among widths (e.g., diameters) W1, W2, W3, and W4 of respective conductive contacts 441 and 442, conductive structure 462, and pillar 422 of memory device 200 of FIG. 4A and FIG. 4B. As shown in FIG. 4C, widths W1, W2, W3, and W4 can be measured in the X-direction. Width W1 is less than width W2. Width W2 is less than width W3. Width W3 is less than width W4. Other conductive contacts of other conductive structures (e.g., conductive structure 461, 463, and 464 in FIG. 4B) can have similar width as the conductive contacts of conductive structure 462.

Figure 5A:
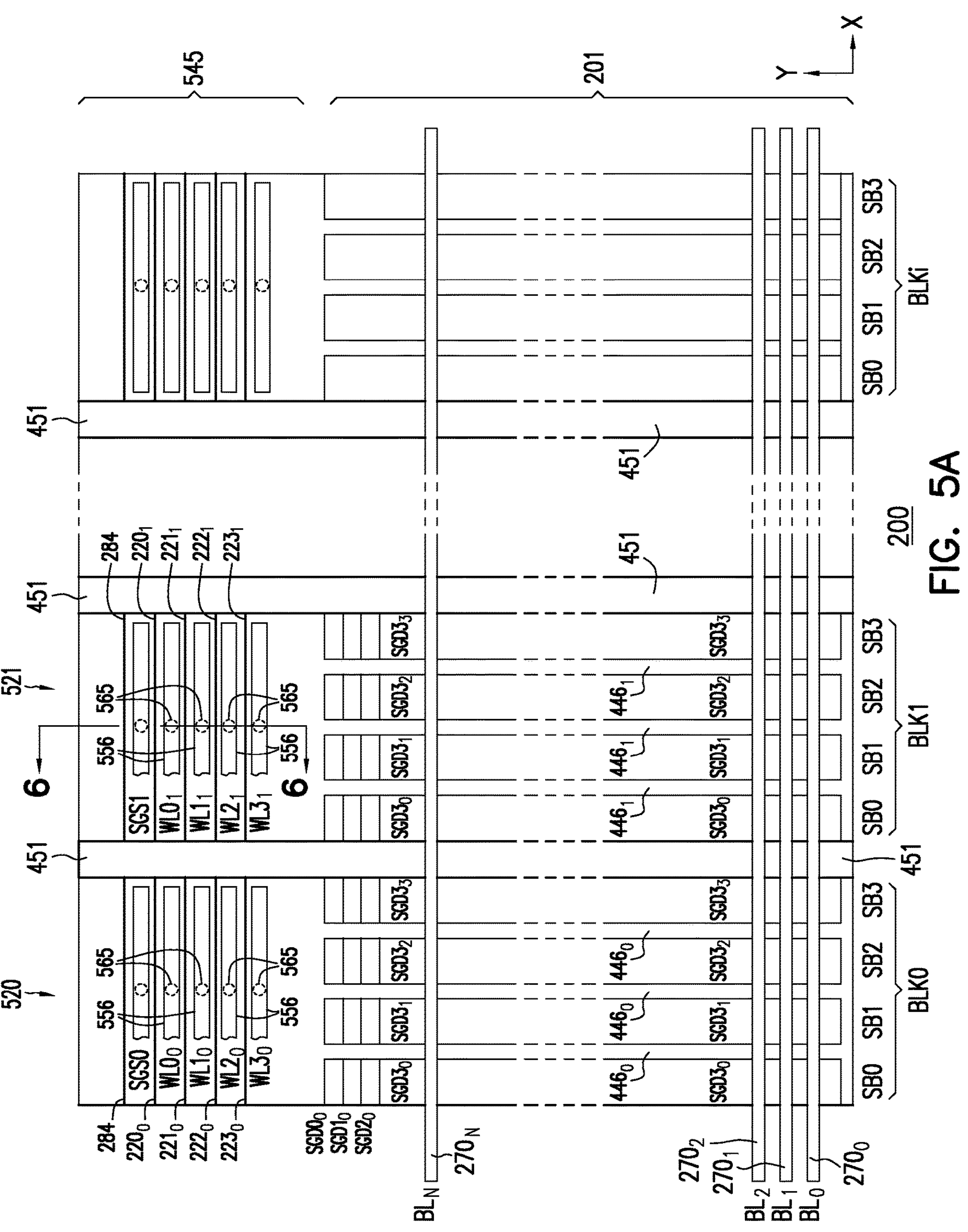
FIG. 5A shows a top view of the memory device of FIG. 4A including a memory array, a staircase region, and block and sub-blocks of the memory device of FIG. 4A, according to some embodiments of described herein.

FIG. 5A shows a top view in the X-Y direction of memory device 200 of FIG. 4A including memory array 201, staircase region 545, dielectric structures 451, and blocks BLK0 and BLK1 through BLKi, according to some embodiments described herein. For simplicity, FIG. 5A omits some of the elements of memory device 200 of FIG. 4A and FIG. 4B. Further, FIG. 5A omits labels for similar or the same elements among the blocks (e.g., block BLK0, BLK1, and BLKi) and the description of such elements is not repeated.

As shown in FIG. 5A, blocks BLK0 and BLK1 through BLKi of memory device 200 can be located side-by-side in the X-direction. Blocks BLK0 and BLK1 of FIG. 5A are also shown in the X-Z direction in FIG. 4A.

As shown in FIG. 5A, each dielectric structure 451 can have a length in the Y-direction, a width in the X-direction, and a depth (e.g., height) in the Z-direction (shown in FIG. 4A). Data lines $\mathbf{270}_0$ through $\mathbf{270}_N$ can have lengths extending in the X-direction across (in the X-direction) and over (in the Z-direction) blocks BLK0 through BLKi.

As shown in FIG. 5A, block BLK0 can include can include control gates associated with signals WL$\mathbf{0}_0$, WL$\mathbf{1}_0$, WL$\mathbf{2}_0$, and WL$\mathbf{3}_0$, select line (e.g., source select line) associated with signal SGS0, and sub-blocks (e.g., four sub-blocks) SB0, SB1, SB2, and SB3 and select lines (e.g., four drain select lines) associated with respective drain select-gate signals (e.g., signals SGD$\mathbf{3}_0$, SGD$\mathbf{3}_1$, SGD$\mathbf{3}_2$, and SGD$\mathbf{3}_3$, respectively), and a staircase structure 520. The select lines can include respective conductive regions (e.g., conductive materials) that are electrically separated from each other and can be located over (with respect to the Z-direction) the control gates of block BLK0. As shown in FIG. 5A, each of the select lines (associated with signals SGD$\mathbf{3}_0$, SGD$\mathbf{3}_1$, SGD$\mathbf{3}_2$, and SGD$\mathbf{3}_3$) can have length in the Y-direction (e.g., direction from memory array 201 to staircase region 545). FIG. 5A shows an example where each block of memory device 200 can have four sub-blocks. However, the number of sub-blocks can be different from four.

Block BLK1 can have structures like block BLK0. As shown in FIG. 5A, block BLK1 can include control gates associated with signals WL$\mathbf{0}_1$, WL$\mathbf{1}_1$, WL$\mathbf{2}_1$, and WL$\mathbf{3}_1$ (also shown in FIG. 3), select line (e.g., source select line) associated with signal SGS1 (also shown in FIG. 3), sub-blocks SB0, SB1, SB2, and SB3, select lines (e.g., drain select lines) SGD$\mathbf{3}_0$, SGD$\mathbf{3}_1$, SGD$\mathbf{3}_2$, and SGD$\mathbf{3}_3$, and a staircase structure 521.

The select lines of each sub-block (e.g., four select lines associated with signals SGD$\mathbf{0}_0$, SGD$\mathbf{1}_0$, SGD$\mathbf{2}_0$, and SGD$\mathbf{3}_0$ in sub-block SB0 of block BLK0) can include conductive regions (e.g., four respective conductive regions or conductive lines) that are electrically separated from each other and can have respective lengths in the Y-direction parallel to the lengths of dielectric structures 451.

As shown FIG. 5A, block BLK0 can include dielectric structures (e.g., sub-block dividers) $\mathbf{446}_0$ formed to electrically separate the drain select lines (associated with signals SGD$\mathbf{3}_0$, SGD$\mathbf{3}_1$, SGD$\mathbf{3}_2$, and SGD$\mathbf{3}_3$ in block BLK0) from each other. Block BLK1 can include dielectric structures (e.g., sub-block dividers) $\mathbf{446}_1$ formed to electrically separate the drain select lines (associated with signals SGD$\mathbf{3}_0$, SGD$\mathbf{3}_1$, SGD32, and SGD$\mathbf{3}_3$ in block BLK1) from each other. Each of dielectric structures $\mathbf{446}_0$ and $\mathbf{446}_1$ can have a length in the Y-direction parallel to the lengths of dielectric structures 451.

As shown in FIG. 5A, memory device 200 can include staircase region 545 located next to memory array 201. Staircase region 545 can include staircase structure 520 of block BLK0, staircase structure 521 of block BLK1, and other staircase structures of other blocks of memory device 200. Staircase structures of adjacent blocks (e.g., staircase structures 520 and 521 of blocks BLK0 and BLK1, respectively) can be electrically separated from each other by dielectric structure 451 between the adjacent blocks.

Staircase structure 520 of block BLK0 can be formed from portions (e.g., end portions) of control gates $\mathbf{220}_0$, $\mathbf{221}_0$, $\mathbf{222}_0$, and $\mathbf{223}_0$ of block BLK0. As shown in FIG. 5A, control gates $\mathbf{220}_0$, $\mathbf{221}_0$, $\mathbf{222}_0$, and $\mathbf{223}_0$ can extent in the Y-direction from memory array 201 to staircase region 545 where respective portions (e.g., end portions) of control gates 220$_0$, 221$_0$, 222$_0$, and 223$_0$ at staircase region 545 can form staircase structure 520.

Figure 6:
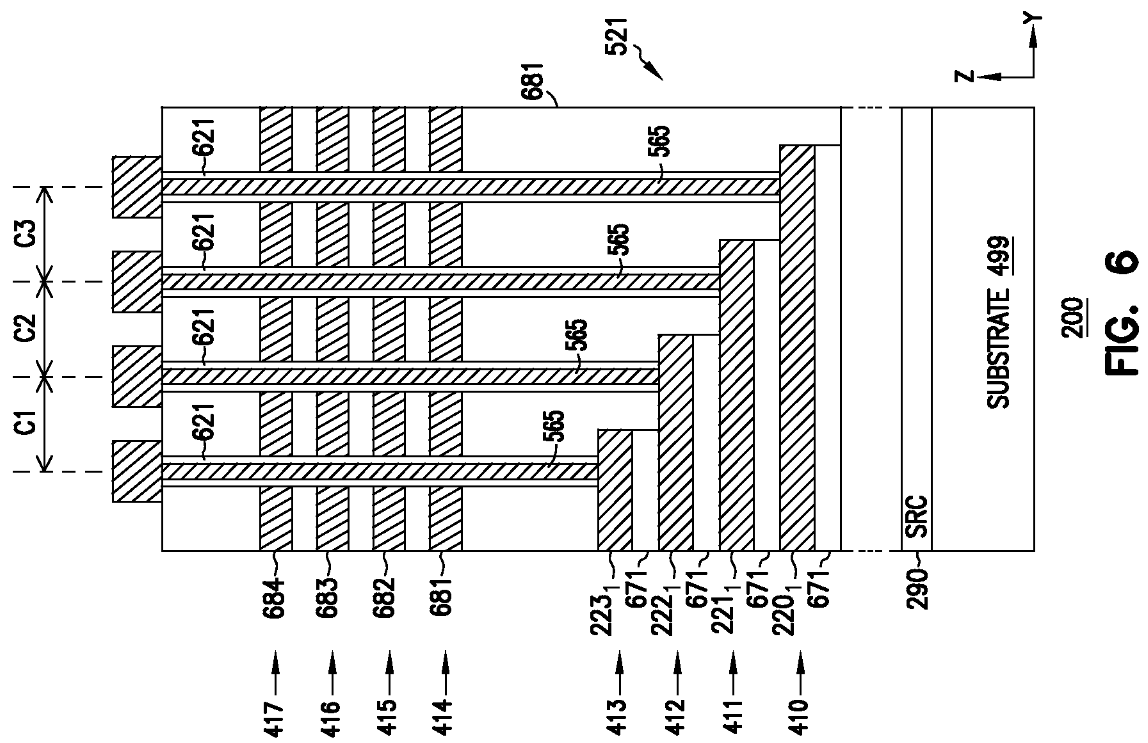
FIG. 6 shows a side view of a staircase structure of one of the blocks of the memory device of FIG. 5A, according to some embodiments of described herein.

Staircase structure 521 of block BLK1 can be formed from portions (e.g., end portions) of control gates 220$_1$, 221$_1$, 222$_1$, and 223$_1$ of block BLK1. Like control gates 220$_0$, 221$_0$, 222$_0$, and 223$_0$ of block BLK0, control gates 220$_1$, 221$_1$, 222$_1$, and 223$_1$ of block BLK1 can extend in the Y-direction from memory array 201 to staircase region 545 where respective portions (e.g., end portions) of control gates 220$_1$, 221$_1$, 222$_1$, and 223$_1$ at staircase region 545 can form staircase structure 521. FIG. 6 (described below) shows a side view (e.g., cross-section) of staircase structure 521 along line 6-6 of FIG. 5A.

As shown in FIG. 5A, memory device 200 can include conductive contacts (e.g., word line contacts) 565 (shown in top view) in each of the blocks (e.g., in blocks BLK0 and BLK1). Each of conductive contacts 565 can include a vertical structure (shown in FIG. 6) having length extending in the Z-direction.

Conductive contacts 565 within a block can be electrically coupled to respective control gates at the staircase structure of that block. For example, conductive contacts 565 of block BLK0 can be electrically coupled to respective control gates 220$_0$, 221$_0$, 222$_0$, and 223$_0$ at staircase structure 520 of block BLK0. In another example, conductive contacts 565 of block BLK1 can be electrically coupled to respective control gates 220$_1$, 221$_1$, 222$_1$, and 223$_1$ at staircase structure 521 of block BLK1.

As shown in FIG. 5A, memory device 200 can include conductive lines 556 in respective blocks of memory device 200. Conductive lines 556 can be part of conductive routings that can be coupled to peripheral circuitry (e.g., word line drivers in circuitry 495 in substrate 499 in FIG. 4A) of memory device 200.

As shown in FIG. 5A, conductive lines 556 can have respective lengths extending in the X-direction. Conductive lines 556 of one block (e.g., block BLK0) can be electrically separated from conductive lines of another block (e.g., block BLK1). Conductive lines 556 in a block (e.g., block BLK1) can contact (e.g., directly coupled to (e.g., electrically coupled to)) respective conductive contacts 565 in that block (e.g., block BLK1).

Conductive lines 556 can be structured to provide signals (e.g., word line signals from word line drivers) to respective control gates (through respective conductive contacts 565) of a respective block. For example, conductive lines 556 in block BLK0 can be structured to provide signals (e.g., word line signals) to respective control gates 220$_0$, 221$_0$, 222$_0$, and 223$_0$ through respective conductive contacts 565 in block BLK0. In another example, conductive lines 556 in block BLK1 can be structured to provide signals (e.g., word line signals) to respective control gates 220$_1$, 221$_1$, 222$_1$, and 223$_1$ through respective conductive contacts 565 in block BLK1.

Figure 5B:
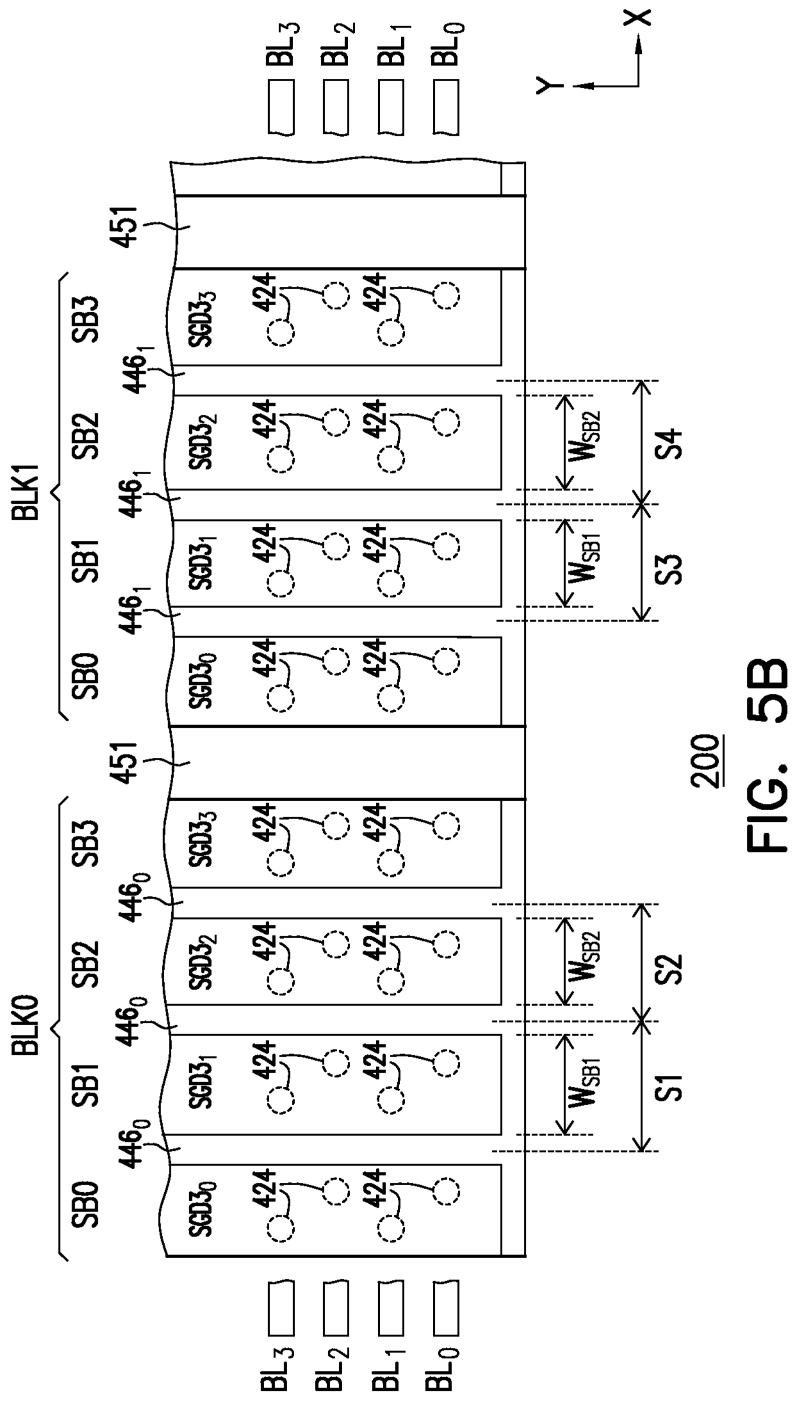
FIG. 5B shows a portion of the memory device of FIG. 5A including locations of dielectric structures of sub-block dividers relative to locations of conductive contacts in respective blocks of the memory device and distances between the sub-block dividers, according to some embodiments described herein.

FIG. 5B shows a portion of memory device 200 of FIG. 5A including locations of dielectric structures (e.g., sub-block dividers) 446$_0$ and 446$_1$ relative to locations of conductive contacts 424 in respective blocks BLK0 and BLK1, according to some embodiments described herein. As shown in FIG. 5B, conductive contacts 424 of blocks BLK0 and BLK1 can be formed in rows parallel to the X-direction. FIG. 5B shows an example of four rows of conductive contacts 424.

Each dielectric structure 446$_0$ can be formed between two adjacent sub-blocks in block BLK0. Dielectric structures 446$_0$ can be located (can be formed) in respective trenches (not labeled).

Distance S1 or S2 indicates the distance between two dielectric structures 446$_0$. Each of distances S1 and S2 can also be the distance between two trenches in which two respective dielectric structures 446$_0$ are located. FIG. 5B shows an example where each of distances S1 and S2 can be measured from the center (or approximately center) of one dielectric structure 446$_0$ to the center (or approximately center) of a nearest (neighbor) dielectric structure 4460. Alternatively, each of distances S1 and S2 can be measured from an edge (e.g., left edge) of one dielectric structure 446$_0$ to a corresponding edge (e.g., left edge) of a nearest (neighbor) dielectric structure 4460. Similarly, distances S3 and S4 indicate distances between respective dielectric structures 446$_1$ in block BLK1. Each of distances S3 and S4 can be measured from the center to center, or alternatively, from edge to edge of two neighbor dielectric structures 446$_1$.

As shown in FIG. 5B, a conductive material (e.g., level of conductive material or layer of conductive material) that forms a respective select line (associated with one of signals SGD0$_0$, SGD1$_0$, SGD2$_0$, and SGD3$_0$ in sub-block SB0 of block BLK0) can have a select line width (e.g., width $W_{SB1}$, $W_{SB2}$, $W_{SB3}$, or $W_{SB4}$). The select line width can be measured in the X-direction (e.g., a direction from one dielectric structure 446$_0$ (or 446$_1$) to another dielectric structure 446$_0$ (or 4460). A select line width (e.g., $W_{SB1}$) can be greater than a difference between two distances (e.g., S1 and S2) of corresponding dielectric structures. For example, $W_{SB1}$>S1–S2, meaning that select line width is greater than (S1 minus S2) a difference between distances S1 and S2. In another example, $W_{SB2}$>S1–S2; $W_{SB3}$>S3–S4; and $W_{SB4}$>S3–S4.

Widths $W_{SB1}$, $W_{SB2}$, $W_{SB3}$, and $W_{SB4}$ can be different (unequal) from each other. In an example, $W_{SB1}>W_{SB2}>W_{SB3}>W_{SB4}$, where ">" means greater than. Thus, width $W_{SB1}$ can be greater than width $W_{SB2}$. Width $W_{SB2}$ can be greater than width $W_{SB3}$. Width $W_{SB3}$ can be greater than width $W_{SB4}$.

Distances S1, S2, S3, and S4 can be different (unequal) from each other. In an example, S1>S2>S3>S4, where ">" means greater than. Thus, distance S1 can be greater than distance S2. Distance S2 can be greater than distance S3. Distance S3 can be greater than distance S4.

The difference between distances S1, S2, S3, and S4 and the differences between widths $W_{SB1}$, $W_{SB2}$, $W_{SB3}$, and $W_{SB4}$ can be a result of a reticle adjustment (e.g., a reticle correction) of a reticle (or reticles) used to form trenches (e.g., openings) where respective dielectric structures 446$_0$ and 446$_1$ are located (are formed). The reticle adjustment associated with forming dielectric structures 446$_0$ and 446$_1$ are described below with reference to FIG. 18A, FIG. 18B, FIG. 19A, FIG. 19B, and FIG. 20.

In FIG. 5B, dielectric structures 446$_0$ and 446$_1$ may be formed with equal distance (e.g., S1=S2=S3=S4), such as forming dielectric structure 446$_0$ and 446$_1$ without a reticle adjustment. However, without such a reticle adjustment, some or all of dielectric structures 446$_0$ and 446$_1$ may be formed at locations that may cut into the locations (e.g., in the X-direction) of other structures (e.g., conductive structures 461, 462, 463, and 464 (FIG. 4A) that include conductive contacts 424 (FIG. 4A and FIG. 5B). Such a formation (e.g., without a reticle adjustment) may damage the structure of memory device 200. A reticle adjustment described herein (e.g., with reference to FIG. 18A, FIG. 18B, FIG. 19A, FIG. 19B, and FIG. 20) can determine (e.g., select) appropriate locations for the trenches (where dielectric structure $446_0$ and $446_1$ are formed) based on the locations of conductive contacts 424. This allows dielectric structure $446_0$ and $446_1$ to be formed at appropriate locations (e.g., locations of the trenches) with different distances (e.g., S1, S2, S3, and S4) to avoid damaging other structures adjacent dielectric structures $446_0$ and $446_1$.

In an example, a difference between distance S1 and S2 is not greater than 40 nanometers. In another example, a difference between distance S1 and S2 can be in a range from 10 nanometers to 25 nanometers.

Figure 5C:
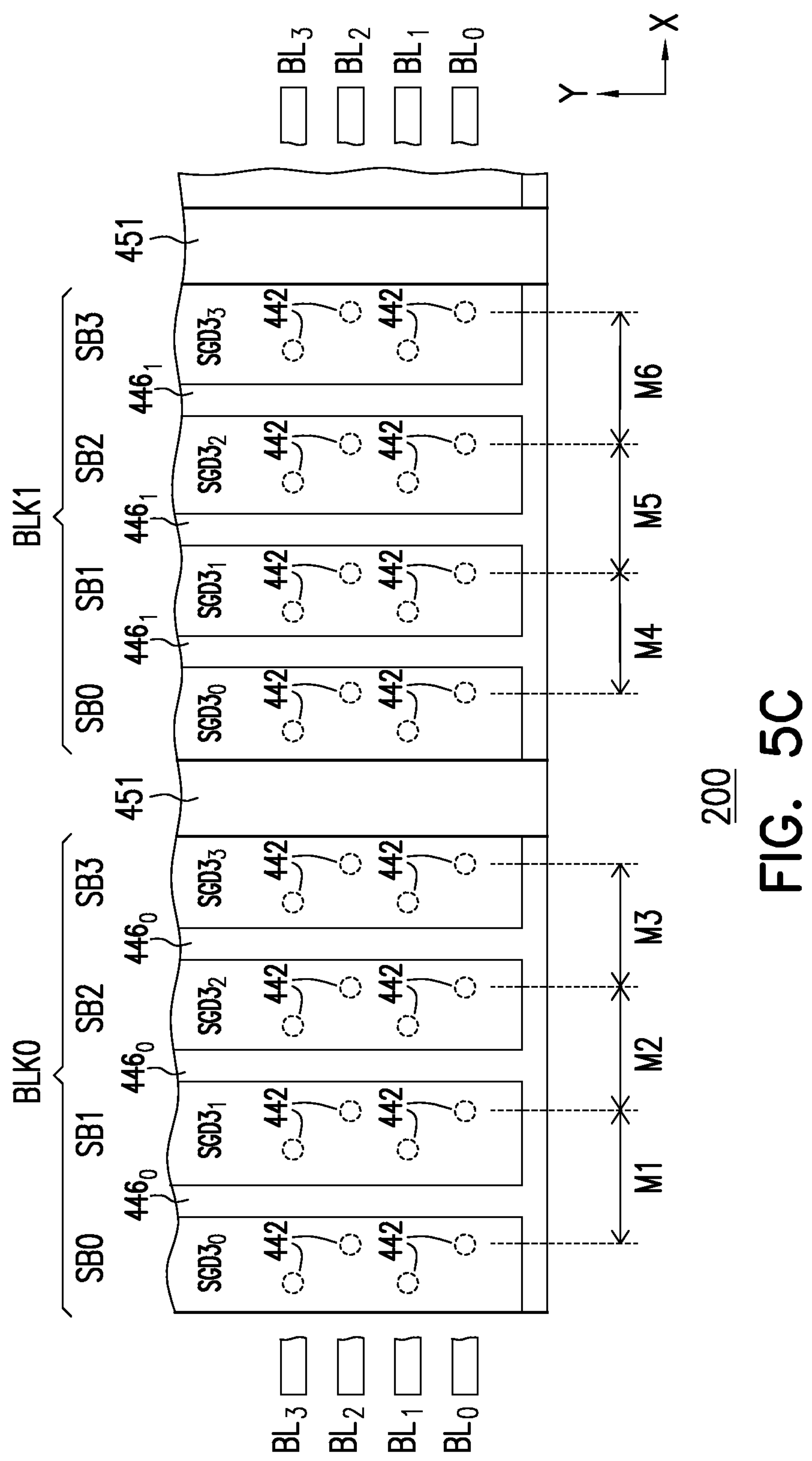
FIG. 5C shows a portion of the memory device of FIG. 5A including locations of dielectric structures of sub-block dividers relative to locations of conductive contacts in respective blocks of the memory device and distances between the conductive contacts, according to some embodiments described herein.

FIG. 5C shows a portion of memory device 200 of FIG. 5B including locations of conductive contacts 424 and locations of dielectric structures (e.g., sub-block dividers) $446_0$ and $446_1$, according to some embodiments described herein. Like conductive contacts 442 (shown in FIG. 5B, not shown in FIG. 5C but are located under conductive contacts 424 in FIG. 5C), conductive contacts 424 of blocks BLK0 and BLK1 in FIG. 5C can be formed in rows parallel to the X-direction. The number (quantity) of conductive contacts 424 (and the number of associated rows (e.g., four rows) of conductive contacts 424) can be the same as the number of conductive contacts 442 (and the number of rows (e.g., four rows) of conductive contacts 442).

Distance M1, M2, M3, M4, M5, or M6 indicates the distance between two conductive contacts 442 immediately on both sides (e.g., left side and right side in the X-direction) of a dielectric structure $446_0$ or a dielectric structure $446_1$. FIG. 5C shows an example where each of distances M1 through M6 can be measured from the center (or approximately center) of one conductive contact 442 to the center (or approximately center) of another conductive contact 442. Alternatively, each of distances M1 through M6 can be measured from respective edges (e.g., left edges) of two adjacent conductive contacts 442.

Distances M1 through M6 can be different from each other. In an example, M1>M2>M3>M4>M5>M6 where ">" means greater than. Thus, distance M1 can be greater than distance M2. Distance M2 can be greater than distance M3. Distance M3 can be greater than distance M4. Distance M4 can be greater than distance M5. Distance M5 can be greater than distance M6.

The difference between distances M1 through M6 can be a result of a reticle adjustment (e.g., a reticle correction) of a reticle (or reticles) used to form holes (e.g., openings) where respective conductive contacts 442 are located (are formed). The reticle adjustment associated with forming conductive contacts 442 are described below with reference to FIG. 22A, FIG. 22B, FIG. 23A, FIG. 23B, and FIG. 24.

In FIG. 6, conductive contacts 442 may be formed with equal distance (e.g., M1=M2=M3=M4=M5=M6), such as forming conductive contacts 442 without a reticle adjustment. However, without such a reticle adjustment, some or all of dielectric conductive contacts 442 may be formed at locations that may cut into the locations of other structures, may be misaligned with conductive contacts 424 (FIG. 4A and FIG. 5B), or both. Such a formation (e.g., without a reticle adjustment) may damage the structure of memory device 200. A reticle adjustment described herein (e.g., with reference to FIG. 22A, FIG. 22B, FIG. 23A, FIG. 23B, and FIG. 24) can determine (e.g., select) appropriate locations for the holes (where conductive contacts 442 are formed) based on the locations of conductive contacts 424. This allows conductive contacts 442 to be formed at appropriate locations (e.g., locations of the holes) with different distances (e.g., M1 through M6) to avoid damaging other structures, misalignments with conductive contacts 424, or both.

As shown in FIG. 5C, distances between conductive contacts 441 can also be distances M1 through M6 since conductive contacts 441 are formed over and aligned with conductive contacts 442. Conductive contacts 441 can be formed after conductive contacts 442 are formed. Like conductive contacts 442, a reticle adjustment (described below with reference to FIG. 22A, FIG. 22B, FIG. 23A, FIG. 23B, and FIG. 24) associated with forming conductive contacts 441 can be performed based on the locations of conductive contacts 424. This allows conductive contacts 441 to be formed at appropriate locations with different distances (e.g., M1 through M6) to avoid damaging other structures, misalignments with conductive contacts 442, or both.

FIG. 6 shows a side view of staircase structure 521 of block BLK1 of memory device 200 of FIG. 5A, according to some embodiments of described herein. In FIG. 6 levels 409 through 417 are the same as levels 409 through 417 of FIG. 4A. As shown in FIG. 6, control gates $\mathbf{220}_1$, $\mathbf{221}_1$, $\mathbf{222}_1$, and $\mathbf{223}_1$ can be formed (e.g., patterned), such that they have different lengths in the Y-direction and their respective portions (e.g., end portions) can form part of staircase structure 521.

Memory device 200 can include dielectric materials 671 that are interleaved with the conductive materials of control gates $\mathbf{220}_1$, $\mathbf{221}_1$, $\mathbf{222}_1$, and $\mathbf{223}_1$. Memory device 200 can include a dielectric material 621 formed at staircase structure 521. Conductive contacts 565 can be formed in respective openings (e.g., holes) that can be formed in dielectric material 621.

Conductive regions 681, 682, 683, and 684 on respective levels 414, 415, 416, and 417 are the same as conductive materials that form respective drain select lines (e.g., select lines $\mathbf{280}_1$, $\mathbf{281}_1$, $\mathbf{282}_1$, and $\mathbf{283}_1$ in FIG. 4A) of block BLK1. Conductive regions 681, 682, 683, and 684 can be electrically separated from conductive contacts 565 by dielectric material 621.

Distance C1, C2, and C3 indicates the distance between two adjacent conductive contacts 565. FIG. 6 shows an example where each of distances C1, C2, and C3 can be measured from the center (or approximately center) of one conductive contact 565 to the center (or approximately center) of another conductive contact 565. Alternatively, each of distances C1, C2, and C3 can be measured from respective edges of two adjacent conductive contacts 565.

Distances C1, C2, and C3 can be different from each other. In an example, C3>C2>C1 where ">" means greater than. Thus, distance C3 can be greater than distance C2. Distance C2 can be greater than distance C1.

The difference between distances C1, C2, and C3 can be a result of a reticle adjustment (e.g., a reticle correction) of a reticle used to form holes (e.g., openings) where respective conductive contacts 565 are located (are formed). The reticle adjustment associated with forming conductive contacts 565 are described below with reference to FIG. 27A, FIG. 27B, and FIG. 28.

In FIG. 5C, conductive contacts 565 may be formed with equal distance (e.g., C1=C2=C3), such as forming conductive contacts 565 without a reticle adjustment. However, without such a reticle adjustment, some or all of dielectric conductive contacts 565 may be formed at locations that may cut into the locations of other structures or may contact (e.g., land on) wrong control gates of memory device 700. Such a formation (e.g., without a reticle adjustment) may damage the structure of memory device 200. A reticle adjustment described herein (e.g., with reference to FIG. 27A, FIG. 27B, and FIG. 28) can determine (e.g., select) appropriate locations for the holes (where conductive contacts 565 are formed) based on the locations of the control gates. This allows conductive contacts 565 to be formed at appropriate locations (e.g., locations of the holes) with different distances (e.g., C1, C2, and C3) to avoid damaging other structures, landing on wrong control gates, or both.

Some or all of the structure of memory device 200 can be formed using processes associated with the processes described below with reference to FIG. 7A, FIG. 7B, and FIG. 7C through FIG. 29A, FIG. 29B, and FIG. 29C, or alternatively, formed by processes described below with reference to FIG. 30A, FIG. 30B, and FIG. 30C through FIG. 34C.

Figures 7A, 7B, 7C:
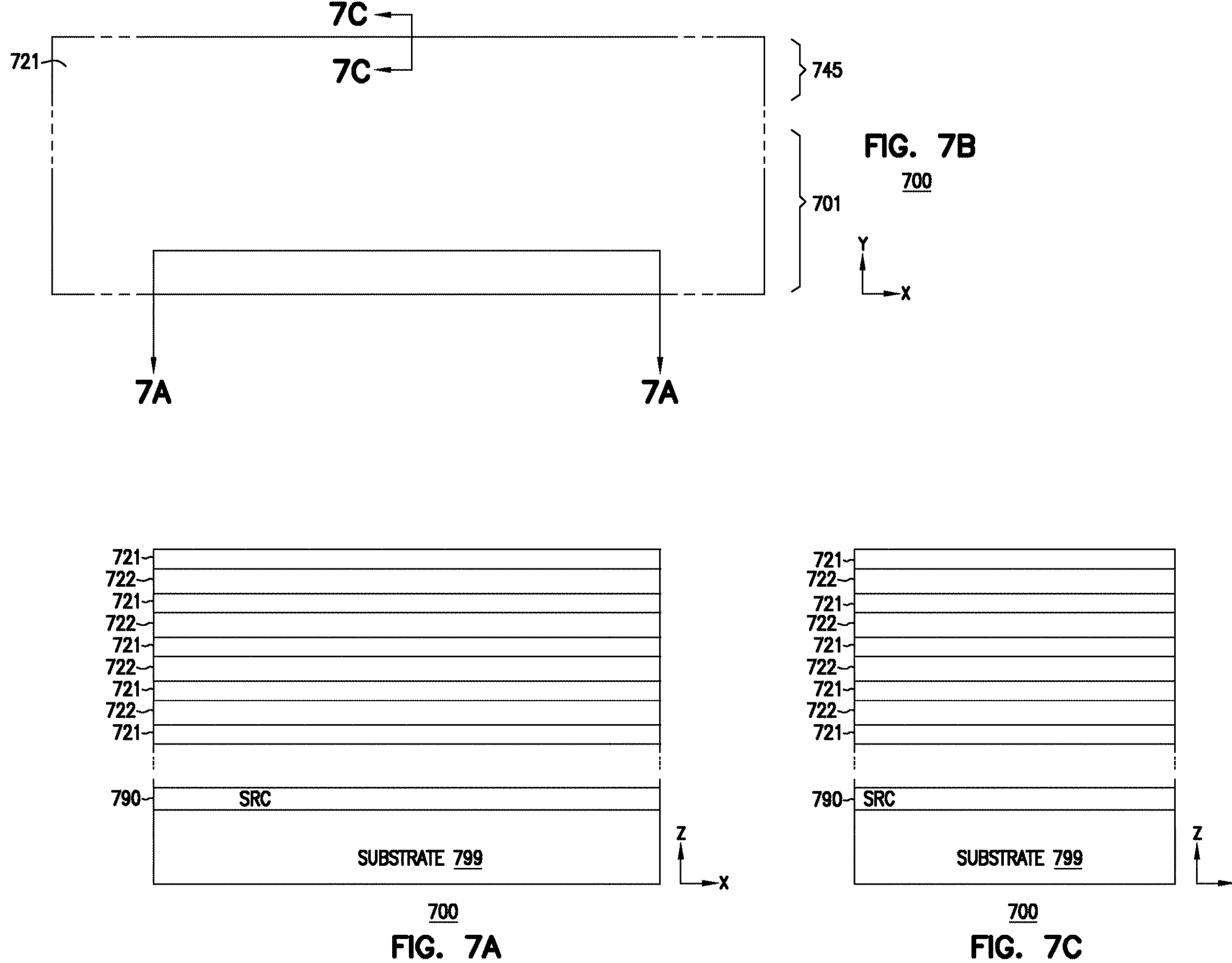

FIG. 7A through FIG. 29C show different views of elements during processes of forming a memory device 700, according to some embodiments described herein. FIG. 7A shows a side view (e.g., cross-section) in the X-direction of device 700 after dielectric materials (levels of dielectric materials) 721 and dielectric materials (levels of dielectric materials) 722 are alternatively formed over a substrate 799. Substrate 799 is similar to (e.g., can correspond to) substrate 499 (FIG. 4) of memory device 200. Dielectric materials 721 and 722 can be sequentially formed, one material after another, over substrate 799 in an interleaved fashion, such that dielectric materials 721 are interleaved with dielectric materials 722.

FIG. 7B shows a top view of memory device 700 after dielectric materials 721 and 722 are formed. Memory device 700 can include a memory array region 701 where a memory array (e.g., similar to memory array 201 of FIG. 5A) having memory cell strings of memory device 700 can be formed in subsequent processes (after the process of FIG. 7A). Memory device 700, as shown in FIG. 7B, can include a staircase region 745 where staircase structures (similar to staircase structures 520 and 521 of FIG. 5A) of memory device 700 can be formed in subsequent processes. The side view (in the X-Z direction) at memory array region 701 of memory device 700 shown in FIG. 7A is taken along line (e.g., cross-section line) 7A-7A of FIG. 7B. Another side view (in the Y-Z direction) at staircase region 745 of memory device 700 shown in FIG. 7C is taken along line 7C-7C of FIG. 7B.

As shown in FIG. 7A, the process of forming memory device 700 can include forming a material 790 over substrate 799. Material 790 can form part of a source (e.g., associated with signal SRC) that is similar to source 290 of FIG. 4A.

One skilled in the art would readily recognize that the process of forming memory device 700 can include forming additional elements (not shown) in the dashed line portion (between material 790 and one of dielectric materials 721) in FIG. 7A of memory device 200. The additional elements can include select circuits similar to select circuit (e.g., source select circuit) 241'*a*, 244'*a*, 2412'*b*, and 244'*b* and other elements of memory device 200 (FIG. 2, FIG. 3, and FIG. 4A). However, for simplicity and not to obscure the embodiments described herein, description of formation of such additional elements is omitted from the description herein.

Figure 8C:
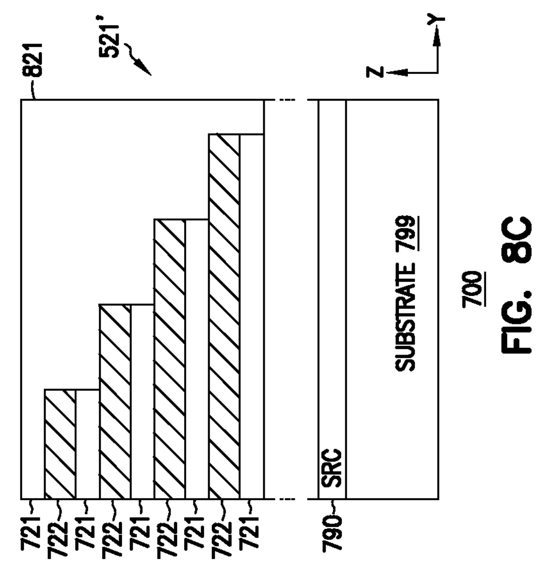
Figure 8B:
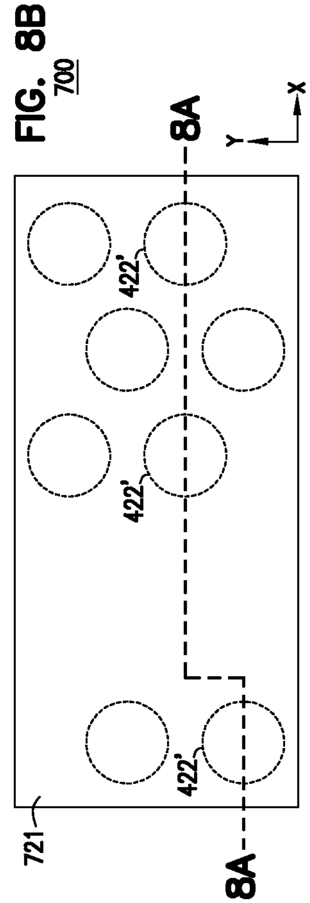
Figure 8A:
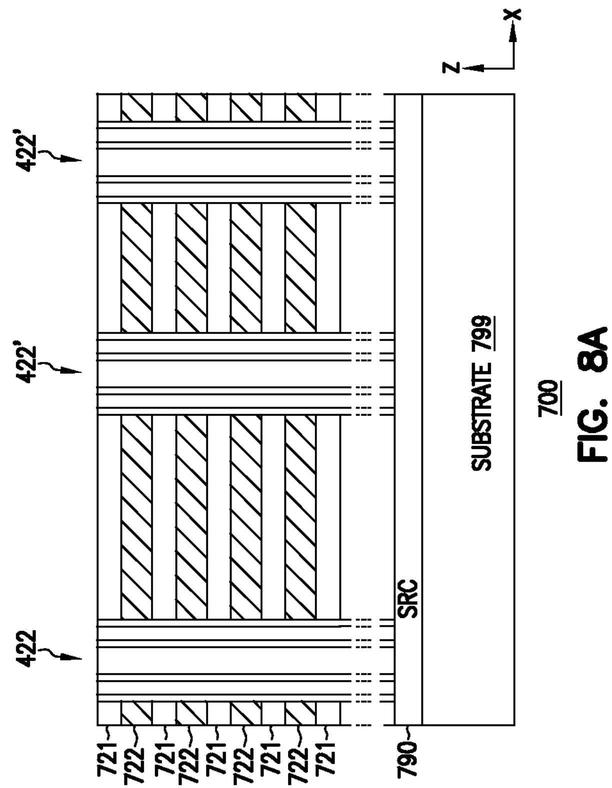

In the following description, different views of memory device 700 in subsequent processes are based on the views of memory device 700 of FIG. 7A, FIG. 7B, and FIG. 7C and follow the same arrangement of the views (e.g., side view and top view) of FIG. 7A, FIG. 7B, and FIG. 7C. For example, FIG. 8A shows a side view of a portion of memory device 700 taken along line (e.g., cross-section line) 8A-8A of FIG. 8B. FIG. 8B shows a top view of a portion of memory device 700 of FIG. 8A. FIG. 8C shows a side view of a portion of memory device 700 at the staircase region 745 (FIG. 7B). For simplicity, the following description omits repeating specific views (e.g., side view and top view) and specific cross-section lines of portion of memory device 700 from one process to the next.

In the description herein, elements given the same numerical labels are similar or the same elements. For example, pillar 422 (FIG. 4) and pillar 422' (FIG. 8A) are similar or the same elements. In another example, pillar 422 (FIG. 4) and pillar 422' (FIG. 8A) are similar or the same elements. In another example, dielectric structure $446_1$ (FIG. 4A) and dielectric structure $446'_1$ (FIG. 17A) are similar or the same elements. In another example, conductive contacts 441 and 442 (FIG. 4A) and conducive contacts 441' and 442' (FIG. 21A), respectively, are similar or the same elements. Thus, for simplicity, the detailed description of similar or the same elements may not be repeated.

FIG. 8A, FIG. 8B, and FIG. 8C show different views of memory device 700 after pillars 422' and staircase structure 521' are formed. Pillars 422' are similar to (e.g., can correspond to) pillars 422 of FIG. 4A. Staircase structure 521' is similar to (e.g., can correspond to) staircase structure 521 of FIG. 5A. Forming pillars 422' can include forming openings (e.g., holes) through dielectric materials 721 and 722, and then forming pillars 422' in the openings. Similar to pillar 422 (FIG. 4A), each pillar 422' of FIG. 8A can include memory cells (e.g., like memory cells 210, 211 212, and 213 in FIG. 4A) of a respective memory cell string.

Forming staircase structure 521' of FIG. 8C can include removing a portion of dielectric materials 721 and 722 at staircase region 745 (labeled in FIG. 7B) to obtain a remaining portion of dielectric materials 721 and 722 that have edges (e.g., vertical edges, not labeled) as shown in FIG. 8C. Portions (e.g., end portions) of dielectric materials 721 and 722 and their respective edges form staircase structure 521'. A dielectric material (e.g., silicon dioxide) 821 can be formed and can be part of staircase structure 521'.

In FIG. 8A, a level (e.g., a layer) of dielectric material 722 (or alternatively, two adjacent levels that include a level of dielectric material 721 and a level of dielectric material 722) can be called a tier of memory device 700. As shown in FIG. 8A, the tiers of memory device 700 can be located (e.g., stacked) one over another in the Z-direction over substrate 799, such that two adjacent tiers can be separated from each other by a respective level (e.g., layer) of dielectric material (e.g., silicon dioxide) 721. FIG. 8A shows an example of a specific number of tiers (e.g., four tiers). However, memory device 700 can include up to (or more than) hundred tiers.

Figure 9C:
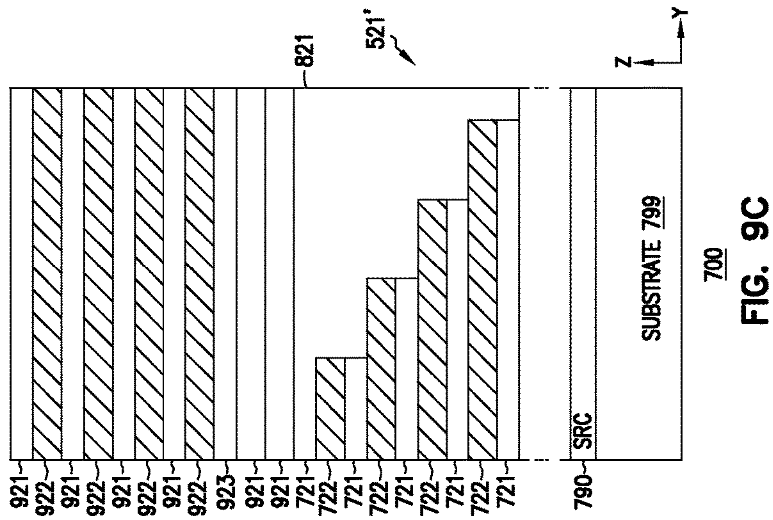
Figure 9B:
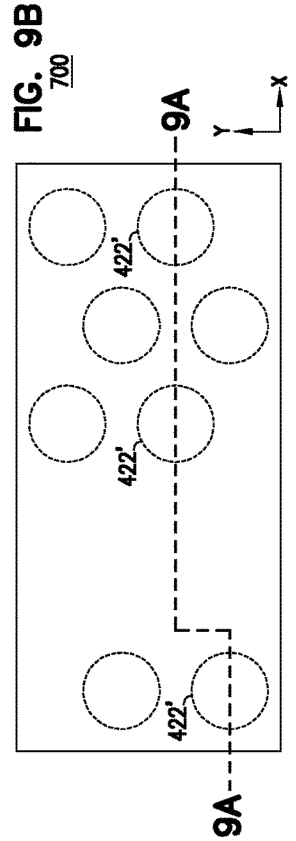
Figure 9A:
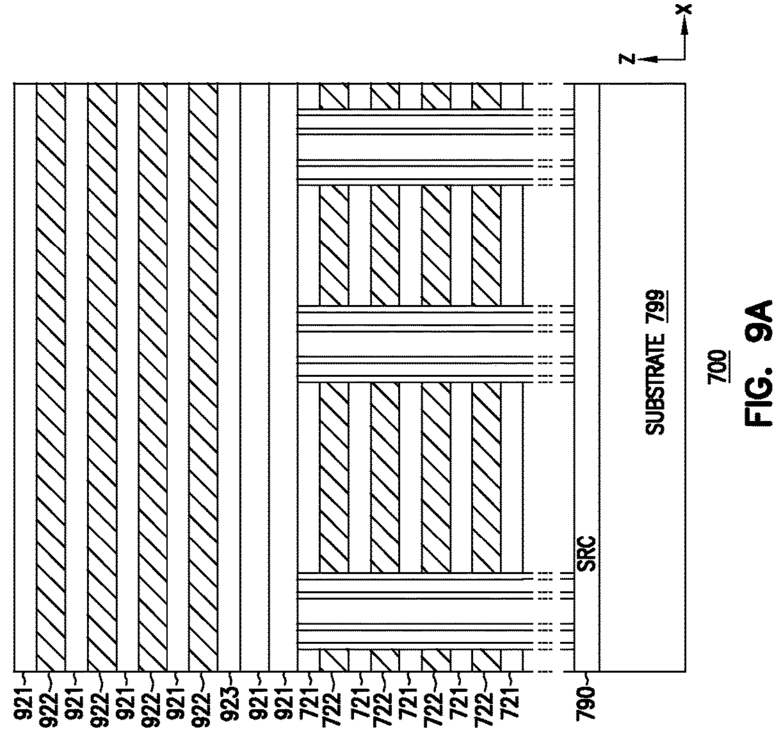

FIG. 9A, FIG. 9B, and FIG. 9C show memory device 700 after dielectric materials (e.g., levels of dielectric materials) 921, dielectric materials (e.g., levels of dielectric materials) 922, and a dielectric material 923 are formed over pillars 422'. Dielectric materials 921 and 922 can be sequentially formed one material after another in an interleaved fashion (e.g., like dielectric materials 721 and 722 of FIG. 7A), such that dielectric materials 921 can be interleaved with dielectric materials 922.

Dielectric materials 921 and 922 can be the same as dielectric materials 721 and 722 (e.g., silicon dioxide and silicon nitride, respectively). Dielectric material 923 can be different from dielectric materials 921 and 922 and can have a different property (e.g., etch property) from that of dielectric materials 921 and 922 and other materials above (in the Z-direction) dielectric material 923. An example material for dielectric material 923 includes carbon nitride. The different properties between dielectric material 923 can allow dielectric material 923 to be a structure (e.g., an etch stop) that can be used as a reference point (e.g., location) where a subsequent etch process can stop. The subsequent etch process (in FIG. 16A) can be part of forming sub-blocks and select lines of respective sub-blocks in a respective block of memory device 700.

In FIG. 9A, levels of dielectric materials 922 can also be called tiers. Thus, after pillars 422' (FIG. 8A) are formed in the tiers in the processes associated with FIG. 8A, additional tiers (formed by the process associated with FIG. 9A) are formed.

Figures 10A, 10C:
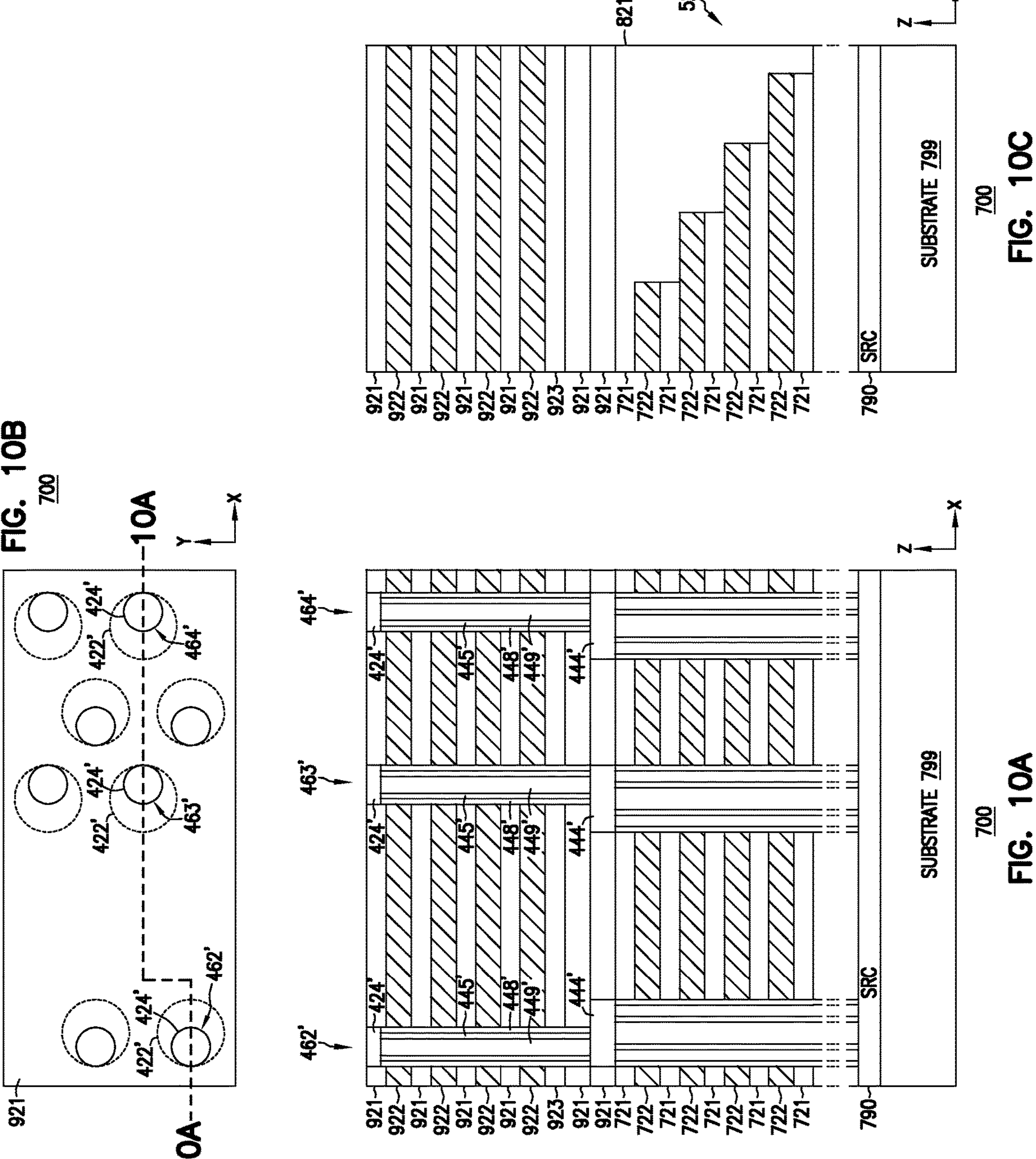

FIG. 10A, FIG. 10B, and FIG. 10C show memory device 700 after conductive structures 462', 463', and 464' are formed over respective pillars 422' and through dielectric materials 921 and 922 and dielectric material 923. Conductive structures 462', 463', and 464' are similar to (e.g., can correspond to) conductive structures 462, 463, and 464, respectively, of FIG. 4A. As shown in FIG. 10A, forming conductive structures 462', 463', and 464' can include forming, (in each of conductive structures 462', 463', and 464') a conductive contact (e.g., conductive plug) 424', a conductive contact (e.g., pillar contact) 444', a conductive region (e.g., conductive path) 445', and dielectric regions 448' and 449'. A chemical mechanical polishing (CMP) process can be used after conductive contacts 424' are formed.

Conductive contact 424', conductive contact 444', conductive region 445', and dielectric regions 448' and 449' are similar to (e.g., can correspond to) conductive contact 424, conductive contact 444, conductive region 445, and dielectric regions 448 and 449, respectively, of FIG. 4A.

Figures 11A, 11B, 11C:
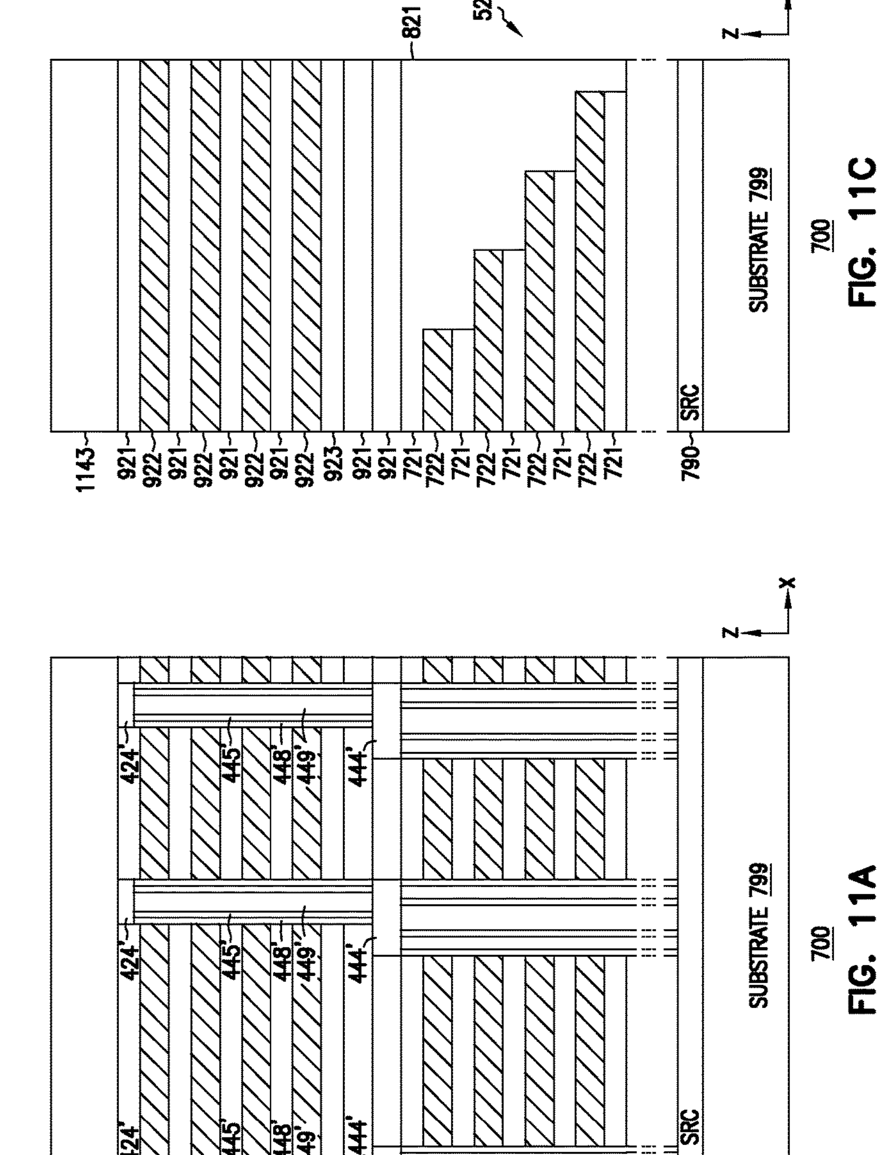

FIG. 11A, FIG. 11B, and FIG. 11C show memory device 700 after a dielectric material (e.g., silicon dioxide) 1143 is formed over other elements of memory device 700.

Figures 12A, 12B, 12C:
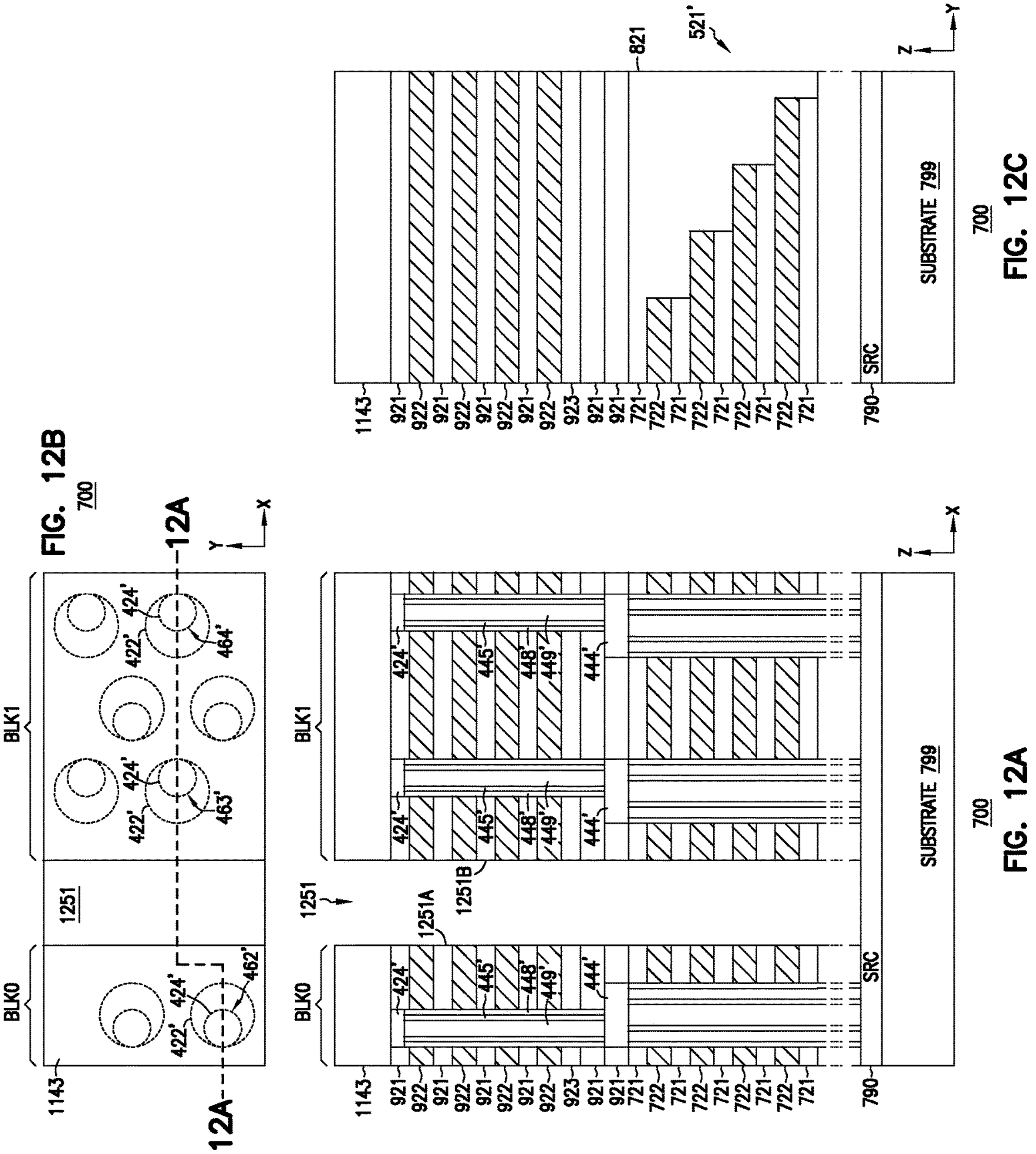

FIG. 12A, FIG. 12B, and FIG. 12C show memory device 700 after a slit (e.g., an opening, a trench, or a cut) 1251 is formed. Slit 1251 can include sidewalls 1251A and 1251B opposite from each other in the X-direction. Slit 1251 can be formed such that it can extend through dielectric material 1143, the levels of dielectric materials 921 and 922, dielectric material 923, the levels of dielectric materials 721 and 722, and other elements of memory device 700, as shown in FIG. 12A and FIG. 12B.

Slit 1251 can be formed to divide (e.g., separate) elements (e.g., respective memory cell strings and other elements) of memory device 700 into portions that form part of respective blocks (e.g., blocks BLK0 and BLK1) of memory device 700. For example, slit 1251 can separate conductive structures 462', 463', and 464' into respective portions in blocks BLK0 and BLK1. Slit 1251 can separate dielectric materials 921 and 922 into respective portions in blocks BLK0 and BLK1. Slit 1251 can separate dielectric materials 721 and 722 into respective portions in blocks BLK0 and BLK1. Slit 1251 can separate pillars 422' into respective portions in blocks BLK0 and BLK1.

The following description (associated with FIG. 13A through FIG. 15C) involve processes that include removing (FIG. 13A) then replacing (FIG. 14A) the levels of dielectric materials 722 in FIG. 12A with respective levels of conductive materials. The levels of conductive materials can form control gates in respective tiers of memory device 700. The same processes used to remove dielectric materials 722 in FIG. 12A can also include removing (FIG. 13A) then replacing (FIG. 19A) the levels of dielectric materials 922 in FIG. 12A with respective levels of conductive materials. The conductive materials (which replace dielectric materials 922) can form respective select lines (e.g., drain select lines) of select circuits of memory device 700.

Figures 13A, 13B, 13C:
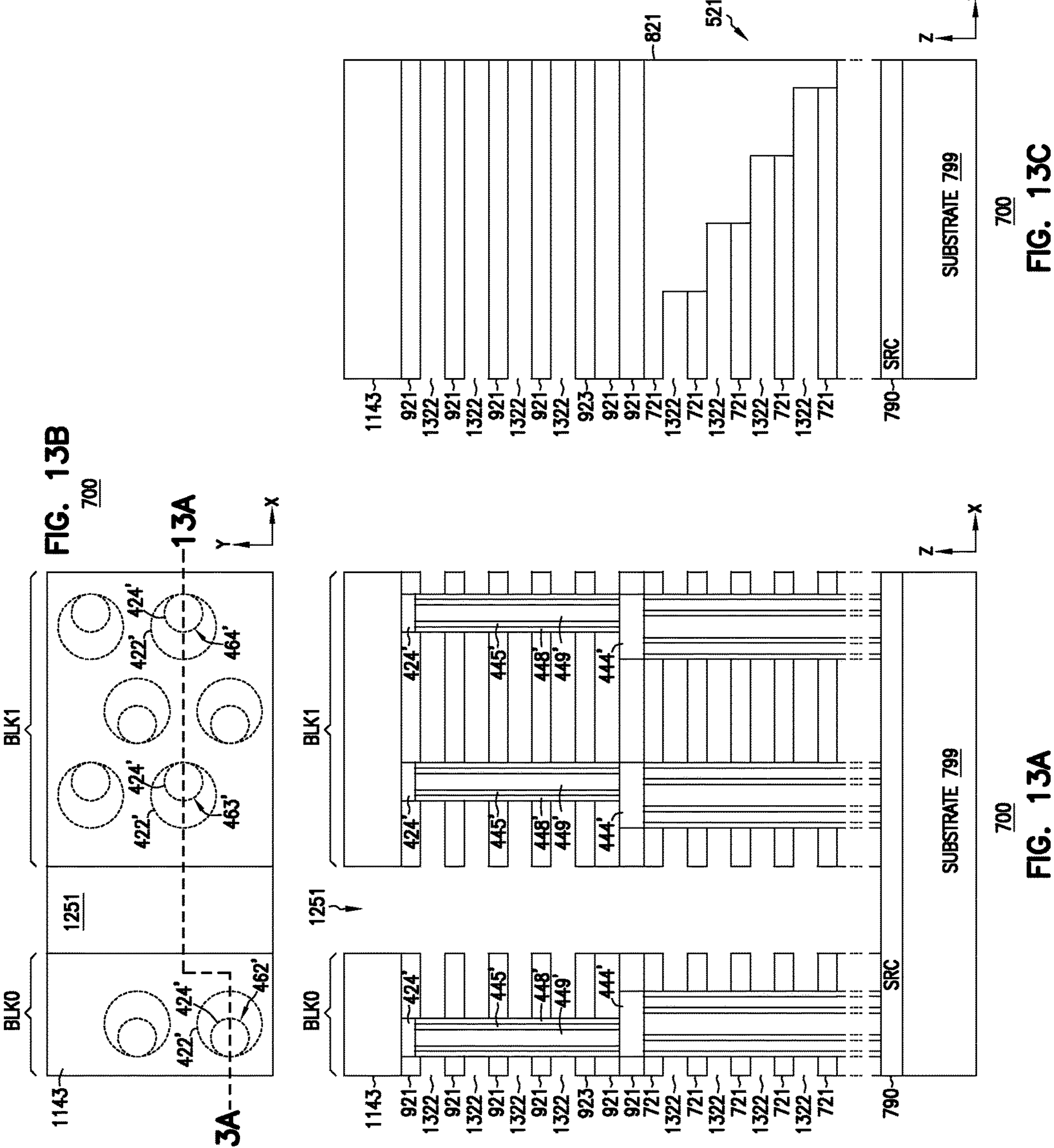

FIG. 13A, FIG. 13B, and FIG. 13C show memory device 700 after dielectric materials (e.g., silicon nitride) 722 and 922 are removed (e.g., exhumed) from locations 1322. Locations 1322 are empty spaces after dielectric materials 722 and 922 are removed. In subsequent processes, a conductive material (or conductive materials) can be formed in locations 1322 to form respective control gates and select gates (e.g., drain select gates) of memory device 700.

Figures 14A, 14C:
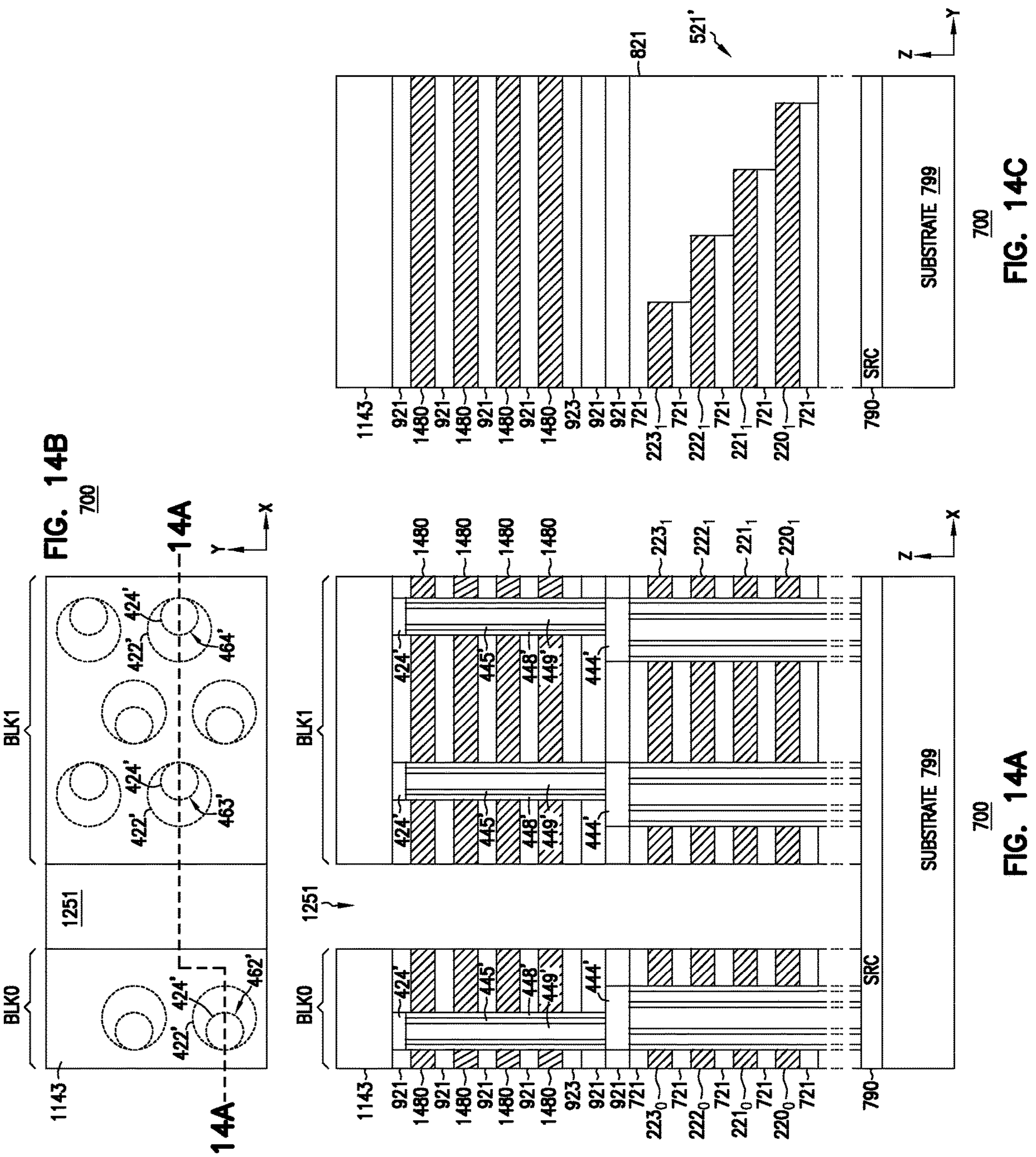

FIG. 14A, FIG. 14B, and FIG. 14C show memory device 700 after formation of control gates $\mathbf{220}_0$, $\mathbf{221}_0$, $\mathbf{222}_0$, and $\mathbf{223}_0$ in block BLK0, control gates $\mathbf{220}_1$, $\mathbf{221}_1$, $\mathbf{222}_1$, and $\mathbf{223}_1$ in block BLK1, and conductive regions (e.g., levels of conductive materials) 1480. Control gates $\mathbf{220}_0$, $\mathbf{221}_0$, $\mathbf{222}_0$, and $\mathbf{223}_0$ in block BLK0 are similar to (e.g., can correspond to) $\mathbf{220}_0$, $\mathbf{221}_0$, $\mathbf{222}_0$, and $\mathbf{223}_0$, respectively, of FIG. 4A. Control gates $\mathbf{220}_1$, $\mathbf{221}_1$, $\mathbf{222}_1$, and $\mathbf{223}_1$ in block BLK1 are similar to (e.g., can correspond to) $\mathbf{220}_1$, $\mathbf{221}_1$, $\mathbf{222}_1$, and $\mathbf{223}_1$, respectively, of FIG. 4A. In subsequent processes (FIG. 16), conductive regions 1480 are divided into separate portions to form select lines (e.g., drain select lines) of respective sub-blocks of memory device 700.

In FIG. 14A, FIG. 14B, and FIG. 14C, the process of forming control gates $\mathbf{220}_0$, $\mathbf{221}_0$, $\mathbf{222}_0$, and $\mathbf{223}_0$ in block BLK0, control gates $\mathbf{220}_1$, $\mathbf{221}_1$, $\mathbf{222}_1$, and $\mathbf{223}_1$ in block BLK1, and conductive regions 1480 (FIG. 14A) can include depositing a single conductive material (e.g., tungsten or other metal) in locations 1322 (FIG. 13A). Alternatively, the processes associated with FIG. 14A, FIG. 14B, and FIG. 14C can include forming (e.g., depositing) multiple materials (one at a time) in locations 1322. For example, the alternative processes can include depositing aluminum oxide on sidewalls of locations 1322, depositing titanium nitride conformal to the aluminum oxide, and then depositing tungsten (or other suitable conductive material) conformal to the titanium nitride. Thus, using the alternative processes, each of control gates $\mathbf{220}_0$, $\mathbf{221}_0$, $\mathbf{222}_0$, and $\mathbf{223}_0$ can include multiple materials (e.g., one layer form after another) aluminum oxide/titanium nitride/tungsten.

As shown in FIG. 14A, control gates $\mathbf{220}_0$, $\mathbf{221}_0$, $\mathbf{222}_0$, and $\mathbf{223}_0$ in block BLK0 can be formed in respective tiers (the locations of dielectric materials 722 (FIG. 12A) in block BLK0 that were removed) of memory device 700 to control the memory cells in respective tiers in block BLK0. Control gates $\mathbf{220}_1$, $\mathbf{221}_1$, $\mathbf{222}_1$, and $\mathbf{223}_1$ in block BLK1 can be formed in respective tiers (the locations of dielectric materials 722 (FIG. 12A) in block BLK1 that were removed) of memory device 700 to control the memory cells in respective tiers in block BLK1.

Figures 15A, 15B, 15C:
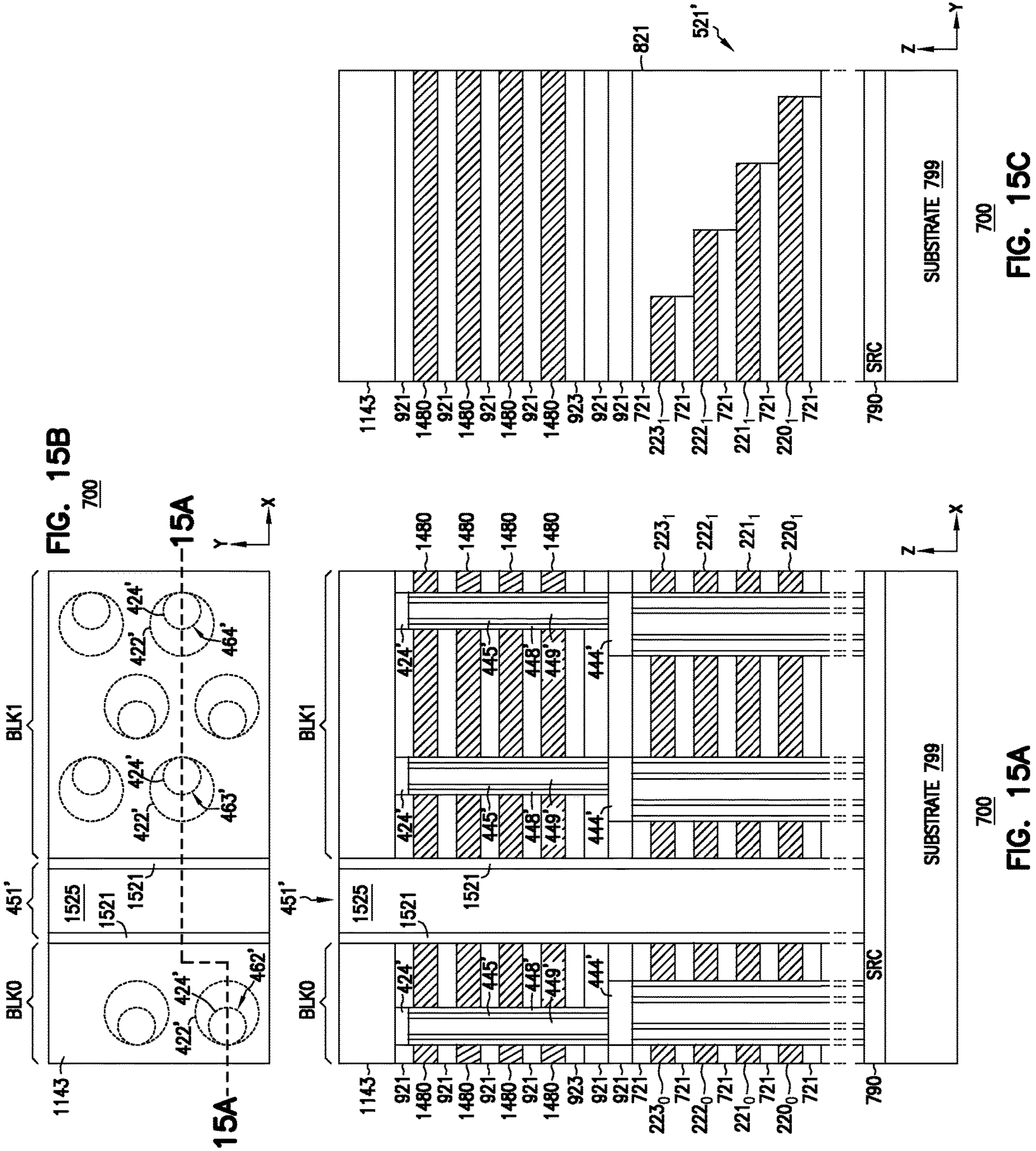

FIG. 15A, FIG. 15B, and FIG. 15C show memory device 700 after a dielectric structure 451' is formed. Dielectric structure 451' is similar to (e.g., can correspond to) dielectric structure 451 of FIG. 4A. Forming dielectric structure 451' can include forming dielectric materials (e.g., silicon dioxide) 1521 on opposite sidewalls (e.g., sidewalls 1251A and 1251B in FIG. 12A) of slit 1251 (labeled in FIG. 14A), and forming a material 1525 between dielectric materials 1521. Material 1525 can include polysilicon. Alternatively, material 1525 can include a dielectric material.

As shown in FIGS. 15A and 15B, dielectric structure 451' can separate (e.g., divide) the elements of memory device 700 into portions that can be part of respective blocks (e.g., blocks BLK0 and BLK1) of memory device 700. For example, dielectric structure 451' can separate the conductive materials that form respective conductive regions 1480 into respective portions in blocks BLK0 and BLK1. Dielectric structure 451' can separate the conductive materials that form respective control gates $220_0$, $221_0$, $222_0$, and $223_0$ (in block BLK0) and respective control gates $220_1$, $221_1$, $222_1$, and $223_1$ (in block BLK0) into respective portions in blocks BLK0 and BLK1. Dielectric structure 451' can separate pillars 422' (labeled in FIG. 8A) of respective memory cell strings of memory device 700 into respective portions in blocks BLK0 and BLK1.

Figures 16A, 16B, 16C:
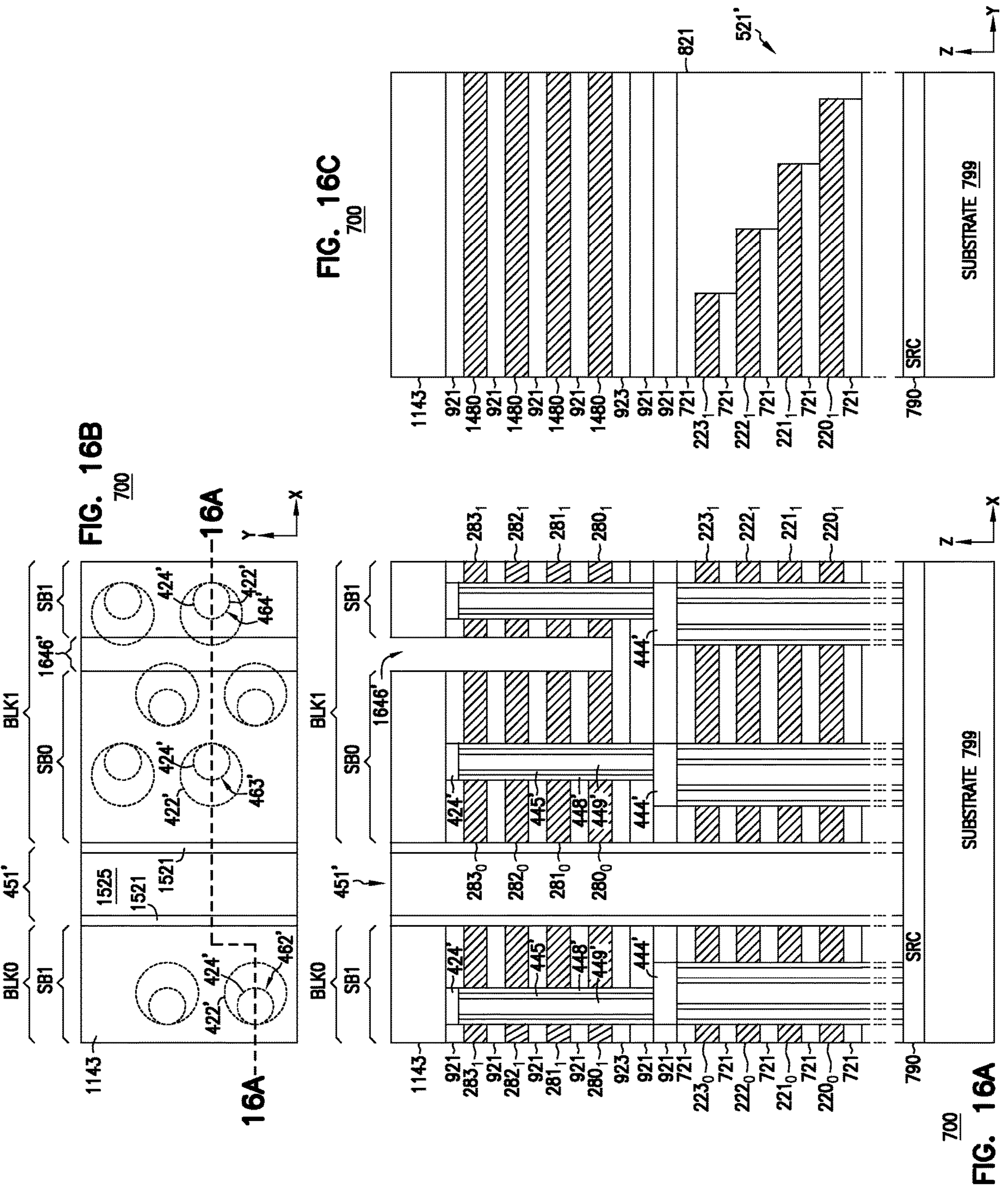

FIG. 16A, FIG. 16B, and FIG. 16C show memory device 700 after a trench (e.g., slits or openings) 1646' is formed. As shown in FIG. 16A, trench 1646' can be formed such that it has a bottom at dielectric material 923 (e.g., carbon nitride) 923. An etch process can be used to remove (e.g., etch) the materials at the location at trench 1646' and stop at dielectric material 923. A reticle (e.g., reticle 2046 in FIG. 20) can be used during the processes of forming trench 1646' and other similar trenches.

As shown in FIG. 16A, trench 1646' can divide (e.g., separate) conductive regions 1480 (FIG. 15A) in memory array region 701 (labeled in FIG. 7B) into separate portions (that are electrically separated from each other) to form select lines (e.g., drain select lines) of respective sub-blocks of block BLK0 and BLK1. For example, trench 1646' (FIG. 16A) can divide conductive regions 1480 (labeled in FIG. 15A) in block BLK1 into separate portions to form select lines $280_0$, $281_0$, $282_0$, and $283_0$ (FIG. 16A) of sub-block SB0 of block BLK1, and select lines $280_1$, $281_1$, $282_1$, and $283_1$ of sub-block SB1 of block BLK1.

Select lines $280_0$, $281_0$, $282_0$, and $283_0$ in block BLK1 are similar to (e.g., can correspond to) select lines $280_0$, $281_0$, $282_0$, and $283_0$, respectively, in block BLK1 of FIG. 4A. Select lines $280_1$, $281_1$, $282_1$, and $283_1$ in block BLK1 are similar to (e.g., can correspond to) select lines $280_1$, $281_1$, $282_1$, and $283_1$, respectively, in block BLK1 of FIG. 4A.

The processes associated FIG. 16A, FIG. 16B, and FIG. 16C can also form trenches in block BLK0 (not shown, but similar to trench 1646' in block BLK1) to divide conductive regions 1480 (labeled in FIG. 15A) in block BLK0 into separate portions to form the select lines (e.g., drain select lines) of respective sub-blocks of block BLK0. For example, FIG. 16A shows select lines $280_1$, $281_1$, $282_1$, and $283_1$ of sub-block SB1 of block BLK0. Select lines $280_1$, $281_1$, $282_1$, and $283_1$ in block BLK0 are similar to (e.g., can correspond to) select lines $280_1$, $281_1$, $282_1$, and $283_1$, respectively, in block BLK0 of FIG. 4A.

Figures 17A, 17B, 17C:
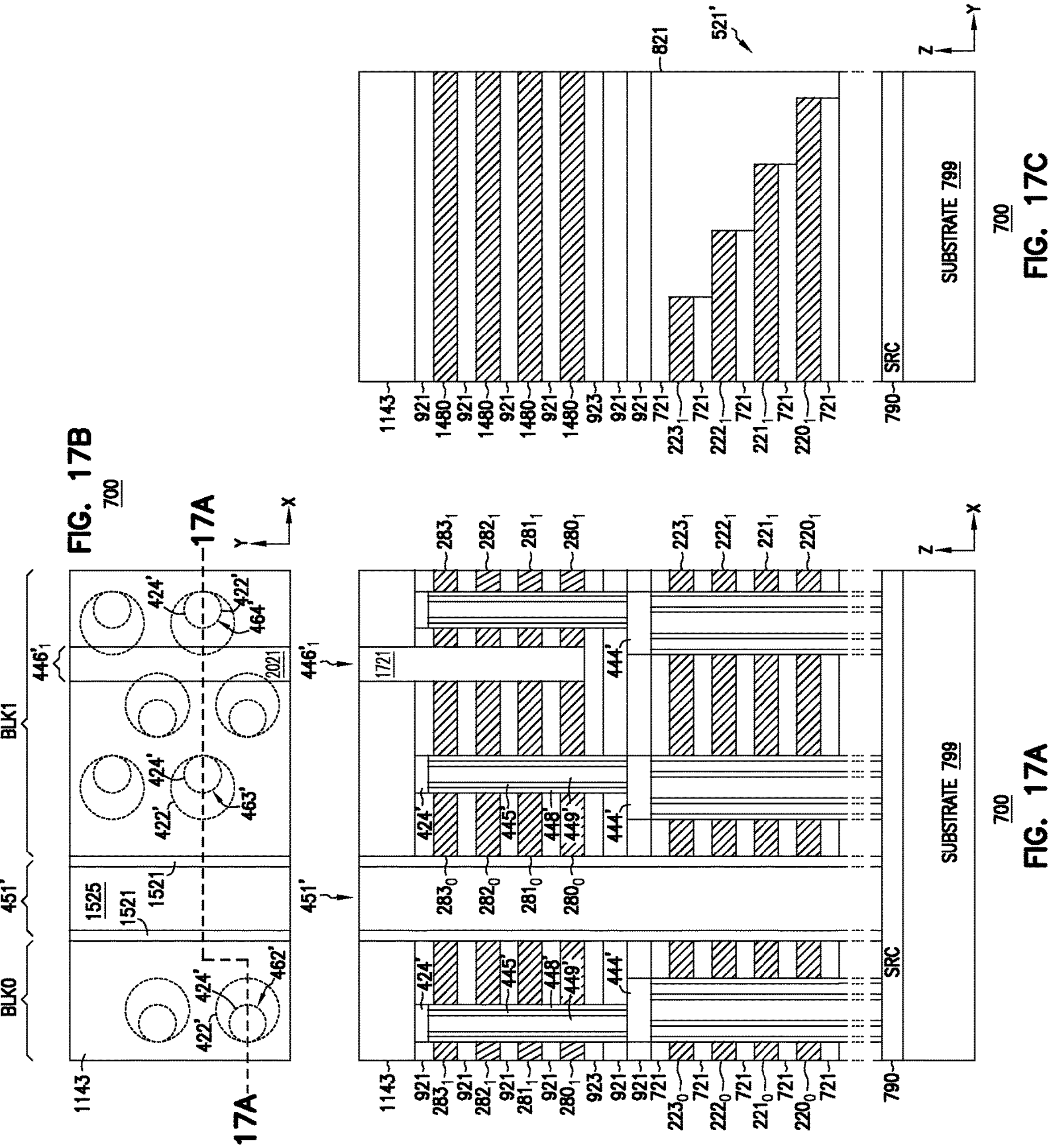

FIG. 17A, FIG. 17B, and FIG. 17C show memory device 700 after a dielectric structure (e.g., sub-block divider) $446_1$' is formed. Dielectric structure $446_1$' is similar to (e.g., can correspond to) dielectric structure $446_1$ of FIG. 4A. Forming dielectric structure $446_1$' can include forming (e.g., filling) a dielectric material 1721 in trench 1646' (labeled in FIG. 16A). As shown in FIG. 17A, dielectric structure $446_1$' can separate select lines $280_0$, $281_0$, $282_0$, and $283_0$ of sub-block SB0 of block BLK1 from select lines $280_1$, $281_1$, $282_1$, and $283_1$ of sub-block SB1 of block BLK1. Although not shown in FIG. 17A and FIG. 17B, other dielectric structures (e.g., sub-block dividers) in block BLK0 and other blocks of memory device 700 can be formed when dielectric structure $446_1$' is formed.

The process of forming the dielectric structures (e.g., sub-block dividers) such as dielectric structure $446_1$' (FIG. 17A) can include performing a reticle adjustment to determine the appropriate locations for the trenches (e.g., trench 1646' in FIG. 16B) where dielectric structures are subsequently formed.

Figures 18A, 18B, 19A, 19B, 20:
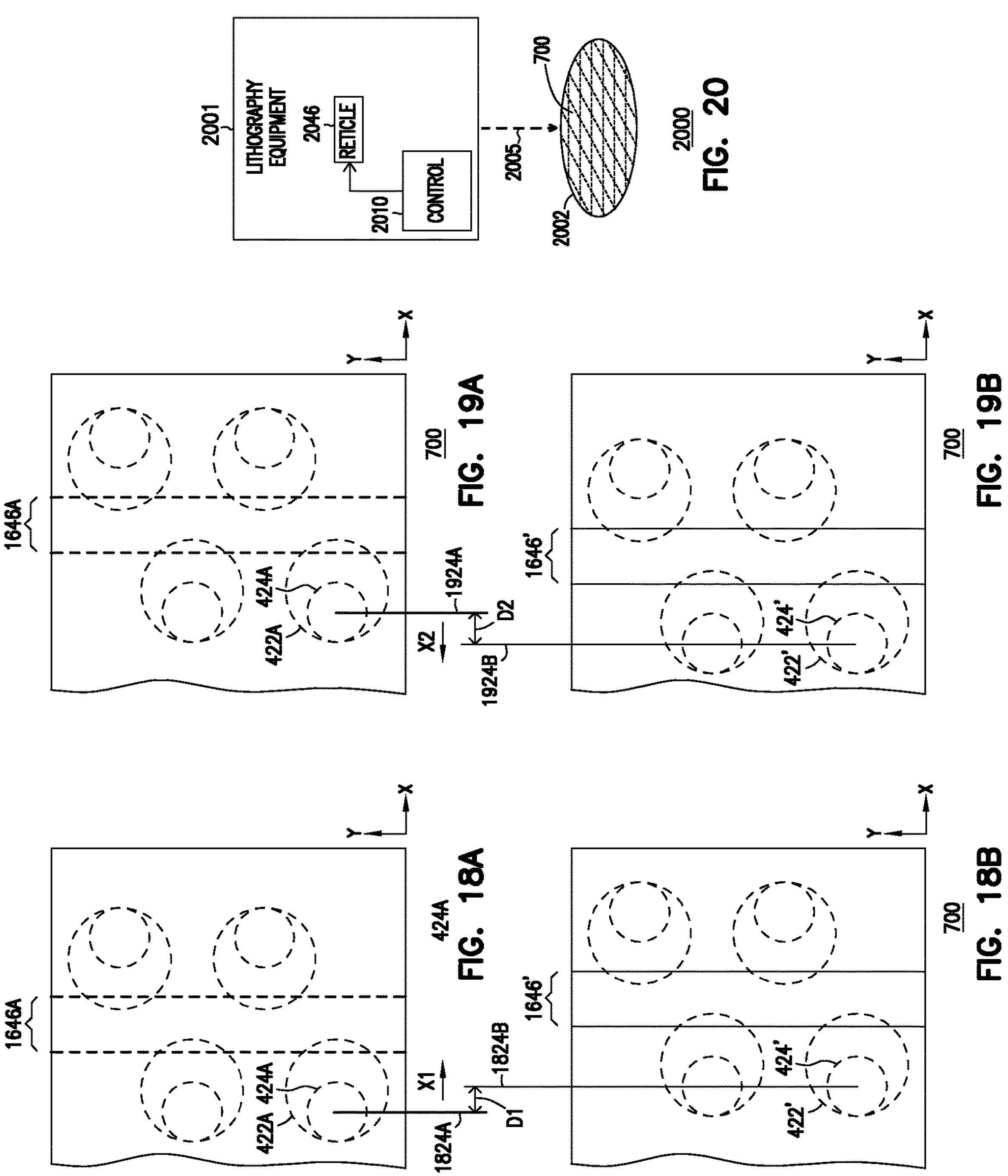

FIG. 18A, FIG. 18B, FIG. 19A, FIG. 19B, and FIG. 20 show processes of a reticle adjustment associated with forming sub-block dividers including trench 1646' (FIG. 16A) and dielectric structure $446_1$' (FIG. 17A), according to some embodiments described herein. FIG. 18A shows a top view of a portion of memory device 700 including intended locations of a pillar 422A, conductive contact 424A, and a trench 1646A. An intended location of a particular structure is a designed (e.g., target) location of that particular structure. FIG. 18B shows a portion of memory device 700 including actual locations of a pillar 422', a conductive contact 424', and a trench 1646'. For simplicity, the description below describes a change (e.g., shift) in the location of one pillar and one conductive contact. However, locations of other pillars 422A and conductive contacts 424A can have similar change (similar shift).

Pillar 422', conductive contact 424', and trench 1646' (FIG. 18B) correspond to pillar 422A, conductive contact 424A, and trench 1646A (FIG. 18A), respectively. However, as shown in the example of FIG. 18A and FIG. 18B, the locations of pillar 422A and conductive contact 424A have been changed (e.g., shifted) in an X1-direction by a distance D1 from a reference location represented by line 1824A to an actual location represented by line 1824B. The X1-direction can be parallel to the X-direction. In another example, as shown in FIG. 19A and FIG. 19B, the locations of pillar 422A and conductive contact 424A have been changed (e.g., shifted) in an X2-direction (e.g., opposite from the X1-direction) by a distance D2 from a reference location represented by line 1924A to an actual location represented by line 1924B. The reference location represented by line 1924A can be relative to a reference coordinate in the X-Y plane of a wafer (e.g., wafer 2002 in FIG. 20) used to form memory device 700. The change (e.g., shift by distance D1 or D2) in the locations of pillar 422A and conductive contact 424A from the intended locations can be caused by factors such as local stress imbalance and process variation associated with forming memory device 700 up to the processes associated with FIG. 17A, FIG. 17B, and FIG. 17C.

The reticle adjustment associated with forming the sub-block dividers (which includes dielectric structure $446_1$' in FIG. 17A) can include determining (e.g., measuring) the locations (actual locations) of conductive contact 424' (FIG. 18B) and then determining the locations of trenches (e.g., trench 1646') based on the location of conductive contact 424' (FIG. 18B).

Without the reticle adjustment associated with forming trench 1646', trench 1646' may be formed at a location that may undesirably hit other structures (e.g., conductive contact 424') of memory device 700 because of the change (e.g., shift) in the conductive contact 424' and pillar 422'. This can damage memory device 700. The reticle adjustment allows trench 1646' (and other similar trenches) to be formed at appropriate locations. Thus, the dielectric structure (e.g., dielectric structure $446_1$') can also be formed at an appropriate location to avoid damaging other structures adjacent the dielectric structure.

FIG. 20 shows a system 2000 including lithography equipment (e.g., a stepper) 2001 and a reticle 2046, according to some embodiments described herein. System 2000 can be used in part of the process of forming memory device 700. Lithography equipment 2001 can include a control unit 2010 to control operations of lithography equipment 2001 during part of forming memory device 700. Lithography equipment 2001 can be used to pass a light source (not shown) through a reticle (e.g., reticle 2046). Then, a projection lens (not shown) of lithography equipment 2001 can receive the light source (after the light source passes through the reticle (e.g., reticle 2046)) and produce a light beam 2005 based on the light source. The projection lens can project light beam 2005 onto a wafer 2002 to form structures of memory device 700. The structures formed on memory device 700 can be based on patterns on a reticle (e.g., reticle 2046 or other reticles (e.g., reticles 2442 and 2442 in FIG. 24 of reticle 2865 in FIG. 28). In an example in FIG. 20, the projection lens can project light beam 2005 during formation of trench 1646' (FIG. 16A and FIG. 16B) and other similar trenches used to form sub-block dividers of memory device 700, which can be formed from a portion of a wafer 2002 (FIG. 20).

Reticle 2046 can include patterns (e.g., lines and spaces) used to form trench 1646' (FIG. 16A and FIG. 18B) and other similar trenches. Part of the reticle adjustment (to form trench 1646') described above can include adjusting the patterns on reticle 2046 based on locations of conductive contact 424'. Adjusting the patterns on reticle 2046 can include comparing the location of conductive contact 424' with the intended location (e.g., location of conductive contact 424A), and adjusting the patterns based on the comparison. For example, the patterns on reticle 2046 can be adjusted to be offset (e.g., shifted) from intended patterns based on distance D1 (or distance D2) to compensate for the change in the location of conductive contact 424'. Adjusting the patterns allows trench 1646' (FIG. 16A) to be formed at appropriate (e.g., corrected) locations to avoid damaging other structures adjacent conductive contacts 442'.

Figures 21A, 21B, 21C:
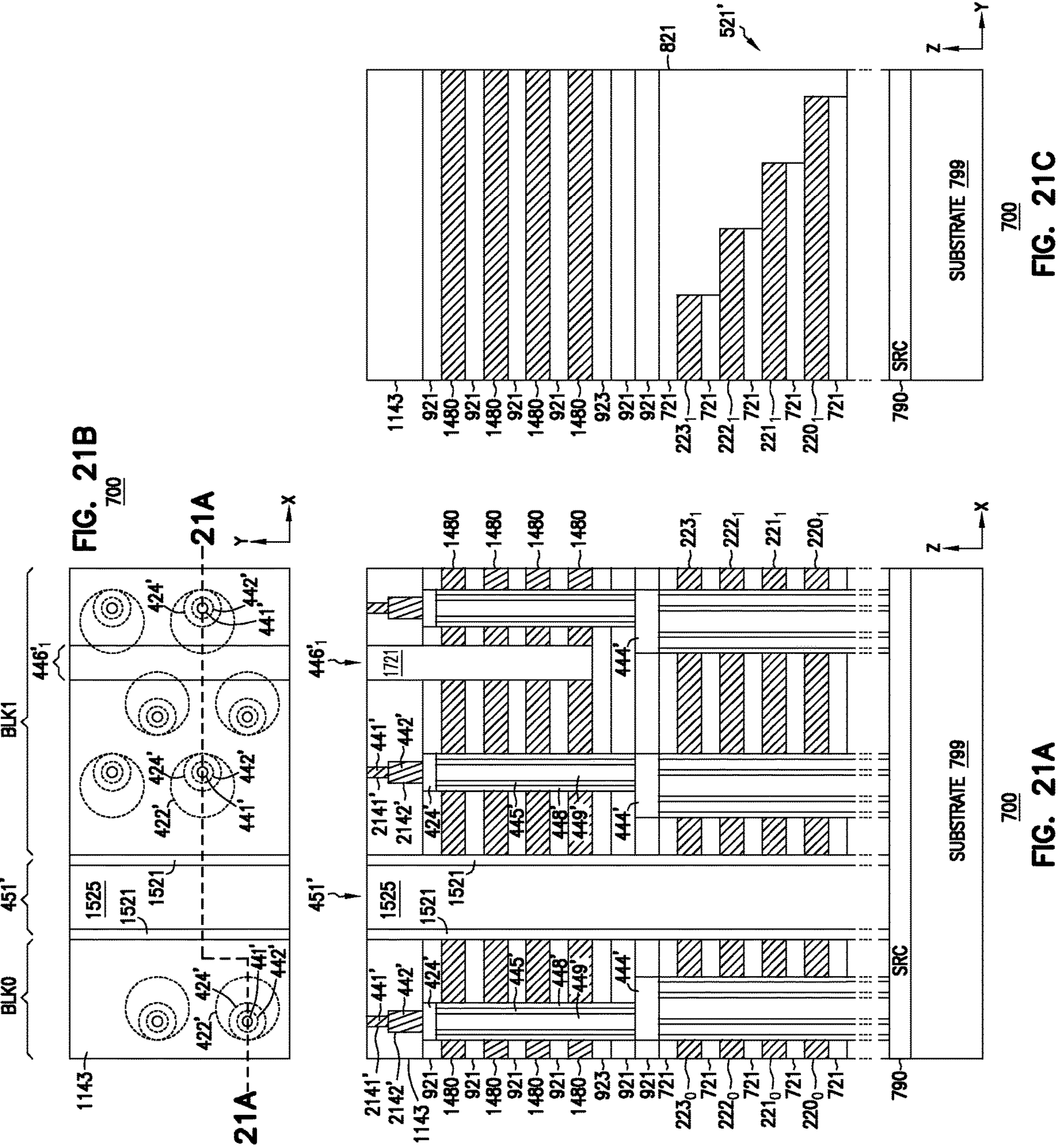

FIG. 21A, FIG. 21B, and FIG. 21C show memory device 700 after conductive contacts 441' and 442' are formed over respective conductive contacts (e.g., conductive plug) 424' of conductive structures 461', 462', and 463' (labeled in FIG. 10A). Conductive contacts 441' and 442' are similar to (e.g., can correspond to) conductive contacts 441 and 442, respectively, of conductive structures 481, 482, and 483 of FIG. 4A. Conductive contacts 441' and 442' (FIG. 21A) can be formed after formation of dielectric structure (e.g., block divider) 451' (formed in FIG. 12A) and dielectric structure (e.g., sub-block divider) 446'$_1$ (formed in FIG. 17A).

Conductive contacts 441' and 442' can be formed in different processes. For example, conductive contacts 441' can be formed after conductive contacts 442' are formed. Conductive contacts 442' can be formed over (and aligned with) respective conductive contacts 424'. After conductive contacts 442' are formed, conductive contacts 441' can be formed over (and aligned with) respective conductive contacts 442'.

Forming conductive contacts 442' can include forming holes 2142' in dielectric material 1143 to expose respective conductive contacts 424' at holes 2142'. After holes 2142' are formed, conductive materials (e.g., tungsten or other metal) can be formed (e.g., deposited) in holes 2142' to form conductive contacts 442' from the conductive materials.

Forming conductive contacts 441' can include forming holes 2141' over (e.g., aligned with) respective conductive contacts 442'. After holes 2141' are formed, conductive materials (e.g., tungsten or other metal) can be formed (e.g., deposited) in holes 2141' to form conductive contacts 441' from the conductive materials.

Thus, holes 2142' and holes 2141' can be formed using different reticles. For example, a reticle can be used to form holes 2142'. Then, another reticle can be used to form hole 2141'.

The process of forming the conductive structure that includes conductive contacts 441' and 442' (FIG. 21A) can include performing a reticle adjustment (associated with the reticle used to form holes 2142') to determine the appropriate locations for holes 2142'. Further, the process of forming the conductive structure that includes conductive contacts 441' and 442' (FIG. 21A) can also include performing another reticle adjustment (associated with the reticle to form holes 2141') to determine the appropriate locations for holes 2141'.

FIG. 22A, FIG. 22B, FIG. 23A, FIG. 23B, and FIG. 24 show processes of adjusting reticles associated with forming conductive contacts 442' of FIG. 21A, according to some embodiments described herein. FIG. 22A shows a top view of a portion of memory device 700 including intended (e.g., target) locations of pillar 422A, conductive contact 424A, and hole 2142A. FIG. 22B shows a portion of memory device 700 including actual locations of pillar 422A, conductive contact 424A, and hole 2142'. For simplicity, the description below describes a change (e.g., shift) in the location of one pillar and one conductive contact. However, locations of other pillars 422A and conductive contacts 424A can have similar change (similar shift).

Pillar 422', conductive contact 424', and hole 2142' (FIG. 22B) correspond to pillar 422A, conductive contact 424A, and hole 2142A (FIG. 22A), respectively. However, as shown in the example of FIG. 22A and FIG. 22B, the locations of pillar 422A and conductive contact 424A have been changed (e.g., shifted) in the X1-direction by a distance D3 from a reference location represented by line 2242A to an actual location represented by line 2242B. In another example as shown in FIG. 23A and FIG. 23B, the locations of pillar 422A and conductive contact 424A have been changed (e.g., shifted) in an X2-direction (e.g., opposite from the X1-direction) by a distance D4 from a reference location represented by line 2342A to an actual location represented by line 2342B. The reference location represented by line 2342A can be relative to a reference coordinate in the X-Y plane of a wafer (e.g., wafer 2002 in FIG. 24) used to form memory device 700. The change (e.g., shift by distance D3 or D4) of the locations of pillar 422A and conductive contact 424A from the intended locations can be caused by local stress imbalance and process variation associated with forming memory device 700 up to the processes associated with FIG. 17A, FIG. 17B, and FIG. 17C.

The reticle adjustment associated with forming conductive contacts 442' (FIG. 21A) can include determining (e.g., measuring) the location (actual location) of conductive contact 424' (FIG. 21A and FIG. 22B) and then determining the locations of hole 2142' based on the location of conductive contacts 424' (FIG. 22B).

Without the reticle adjustment associated with forming holes 2142', hole 2142' may be formed at a location that may undesirably hit other structures (e.g., conductive contact 424') of memory device 700 and/or may be misaligned with conductive contact 424' because of the change (e.g., shift) in the locations of conductive contact 424' and pillar 422'. This can damage memory device 700. The reticle adjustment allows hole 2142' (and other similar holes) to be formed at appropriate locations. Thus, conductive contacts 442' (FIG. 21A) can also be formed at an appropriate location to avoid damaging other structures adjacent conductive contacts 442'.

FIG. 24 shows a system 2000 of FIG. 20 including lithography equipment 2001, a reticle 2442, and a reticle 2441, according to some embodiments described herein. For simplicity, detailed description of system 2000 (also shown in FIG. 20) is not repeated.

Reticle 2442 can include patterns used to form holes 2142' (FIG. 21A). Part of the reticle adjustment (to form holes 2142') described above can include adjusting the patterns on reticle 2442 based on locations of conductive contact 424'. Adjusting the patterns on reticle 2442 can include comparing the location of conductive contact 424' with the intended location (e.g., location of conductive contact 424A), and adjusting the patterns based on the comparison. For example, the patterns on reticle 2442 can be adjusted to be offset (e.g., shifted) from intended patterns based on distance D3 (or distance D4) to compensate for the change in the location of conductive contact 442'. Adjusting the patterns on reticle 2442 allows holes 2142' (FIG. 21A) to be formed at appropriate (e.g., corrected) locations to avoid damaging other structures adjacent conductive contacts 442'.

As shown in FIG. 21A, conductive contacts 441' can be formed directly over (e.g., aligned with) conductive contacts 442', which are formed over respective conductive contacts 424'. Thus, holes 2141' (FIG. 21A) can also be formed in ways similar to that of forming holes 2142'. The process of forming holes 2141' can also include performing a reticle adjustment associated with forming holes 2141' in ways similar to performing the reticle adjustment associated with forming holes 2142'. For example, since hole 2141' can be formed over (e.g., directly over) conductive contacts 442' (which are formed over respective conductive contacts 424'), the reticle adjustment associated with forming holes 2141' can include determining the locations (actual locations) of conductive contacts 424' (FIG. 22B) and then determining the locations of hole 2141' based on the location of conductive contacts 424' (FIG. 22B).

In FIG. 24, after conductive contacts 442' (FIG. 21A) are formed, reticle 2442 can be replaced with reticle 2441 for forming holes 2141' using reticle 2441. Reticle 2441 can include patterns for forming holes 21421. Part of the reticle adjustment (to form holes 2141') described above can include adjusting the patterns on reticle 2441 based on locations of conductive contact 424'. Adjusting the patterns on reticle 2441 can include comparing the location of conductive contact 424' with the intended location (e.g., location of conductive contact 424A), and adjusting the patterns based on the comparison. For example, the patterns on reticle 2441 can be adjusted to be offset (e.g., shifted) from intended patterns based on distance D3 (or distance D4) to compensate for the change in the location of conductive contact 424'. Adjusting the patterns on reticle 2441 allows holes 2141' (FIG. 21A) to be formed at appropriate (e.g., corrected) locations to avoid damaging other structures adjacent conductive contacts 441'.

Figures 25A, 25B, 25C:
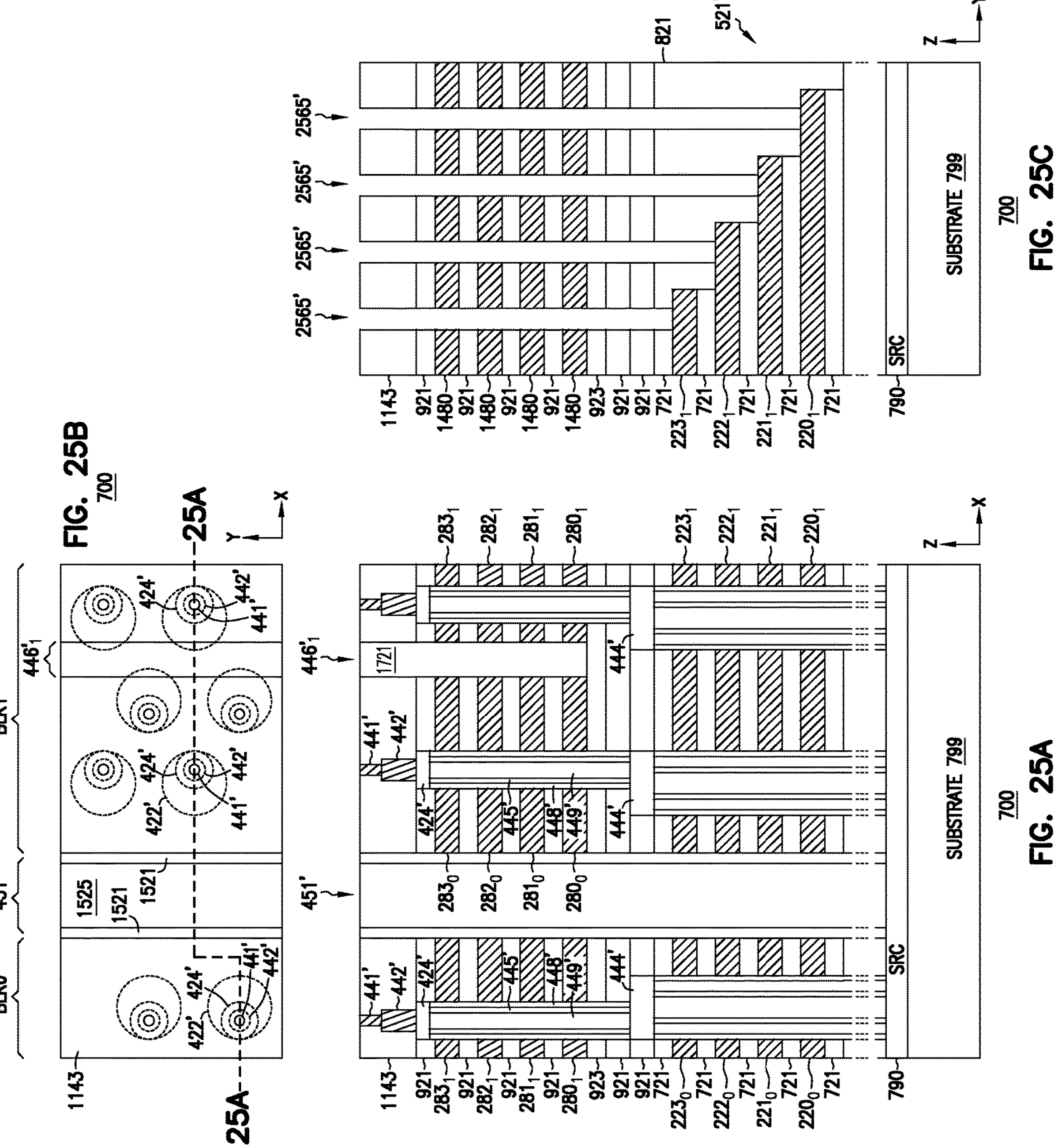

FIG. 25A, FIG. 25B, and FIG. 25C show memory device 700 after holes 2565' (FIG. 25C) are formed through the materials at staircase structure 521'. For example, forming holes 2565' can include removing (e.g., etching) portions of the materials at staircase structure 521' including conductive regions (e.g., levels of conductive materials) 1480, dielectric materials 921 and 923, and other materials at staircase structure 521'. As shown in FIG. 25C, respective portions of control gates $\mathbf{220}_1$, $\mathbf{221}_1$, $\mathbf{222}_1$, and $\mathbf{223}_1$ at staircase structure 521' can be exposed at respective holes 2565'.

Figures 26A, 26B, 26C:
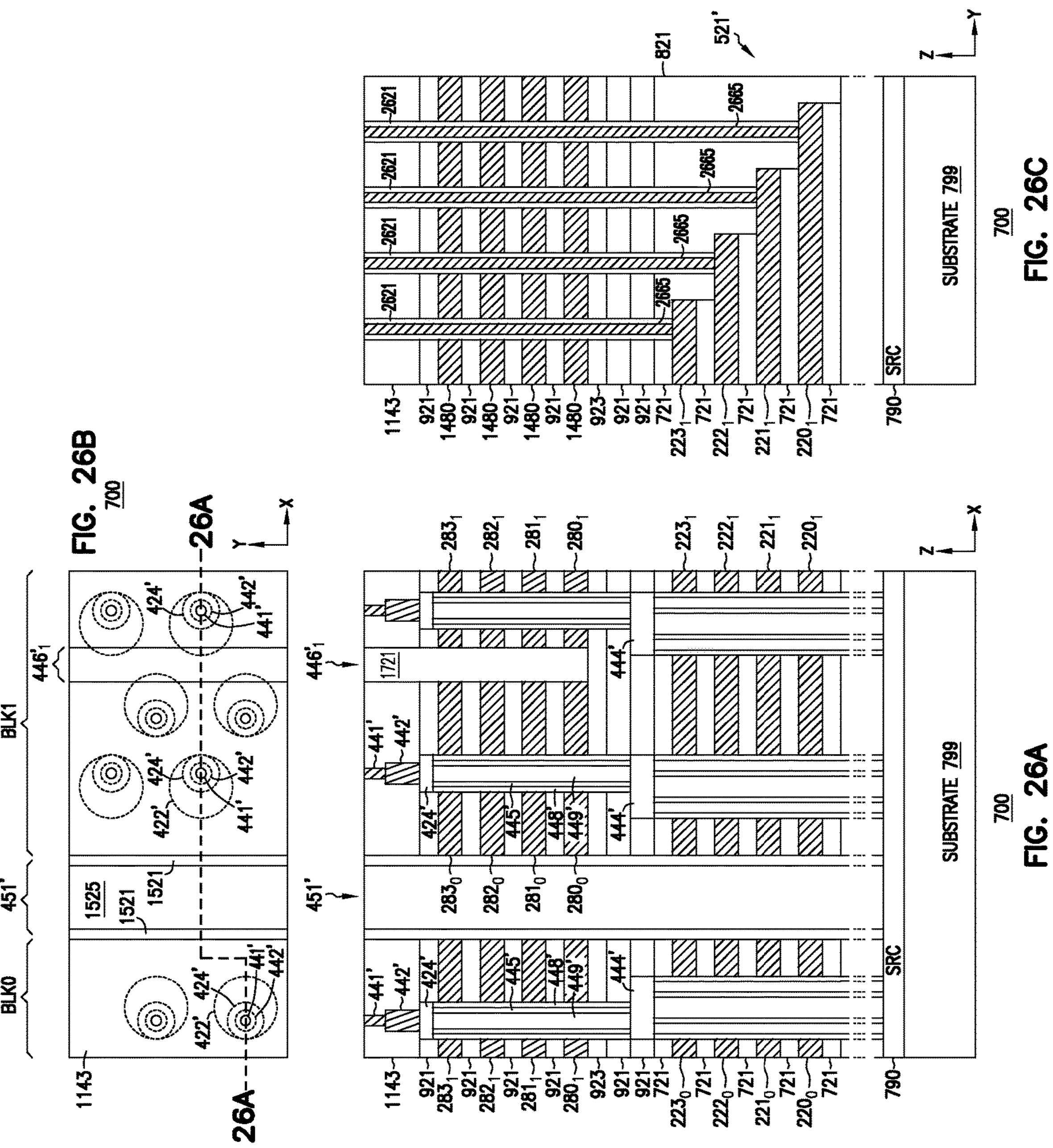

FIG. 26A, FIG. 26B, and FIG. 26C show memory device 700 after a dielectric material (e.g., liner material) 2621 and conductive contacts (e.g., word line contacts) 2665 are formed. Dielectric material 2621 can be formed on sidewalls (not labeled) of holes 2565. Dielectric material 2621 can include silicon dioxide or other dielectric materials. Conductive contacts 2665 can be formed after all dielectric material 2621 formed. Conductive contacts 2665 are electrically separated from conductive regions 1480 by dielectric material 2621. Conductive contacts 2665 can contact (e.g., can be directly coupled to or electrically coupled to) respective portions of control gates $\mathbf{220}_1$, $\mathbf{221}_1$, $\mathbf{222}_1$, and $\mathbf{223}_1$ at staircase structure 521'. Conductive contacts 2665 can include metal (e.g., tungsten) or other conductive materials.

The process of forming holes 2565' (FIG. 25C) and conductive contacts 2665 (FIG. 26C) can include performing a reticle adjustment (associated with the reticle to form holes 2565) to determine the appropriate locations for holes 2565'.

FIG. 27A, FIG. 27B, and FIG. 28 show processes of adjusting a reticle associated with forming holes 2565' (FIG. 25C) and conductive contacts 2665 (FIG. 26C), according to some embodiments described herein. FIG. 27A shows a top view of a portion of memory device 700 including intended locations of portions of control gates 223A, 222A, 221A, and 220A at staircase structure 521', an intended locations of holes 2565A. FIG. 27B shows a portion of memory device 700 including actual locations of portions of control gates $\mathbf{220}_1$, $\mathbf{221}_1$, $\mathbf{222}_1$, and $\mathbf{223}_1$ at staircase structure 521', and actual locations of holes 2565'. For simplicity, the description below describes a change (e.g., shift) in the location of one control gate (e.g., control gate $\mathbf{223}_1$) and one hole (e.g., hole 2565A). However, locations of other control gates $\mathbf{220}_1$, $\mathbf{221}_1$, and $\mathbf{222}_1$ and other holes 2565A can have similar change (similar shift).

Control gates $\mathbf{220}_1$, $\mathbf{221}_1$, $\mathbf{222}_1$, and $\mathbf{223}_1$, and hole 2565' (FIG. 27B) correspond to control gates 223A, 222A, 221A, and 220A, and hole 2565A, respectively (FIG. 27A). However, as shown in the example of FIG. 27A and FIG. 27B, the locations of control gate 223A and hole 2565A have been changed (e.g., shifted) in a Y1-direction by a distance D5 from a reference location represented by line 2765A to an actual location represented by line 2765B. The Y1-direction can be a direction from memory array region 701 (FIG. 7B) to staircase region 745 that can be parallel to the Y-direction. The reference location represented by line 2765A can be relative to a reference coordinate in the X-Y plane of a wafer (e.g., wafer 2002 in FIG. 28) used to form memory device 700. The change (e.g., shift by distance D5) of the locations of control gate 223A and hole 2565A from the intended locations can be caused by local stress imbalance and process variation associated with forming memory device 700 up to the processes associated with FIG. 26A, FIG. 26B, and FIG. 26C.

The reticle adjustment associated with forming hole 2565' and conductive contact 2665' in FIG. 26C can include determining (e.g., measuring) the locations (actual locations) of control gate $\mathbf{223}_1$ (FIG. 27B) and then determining the locations of hole 2565' based on the location of control gate $\mathbf{223}_1$ (FIG. 27B).

Without the reticle adjustment associated with forming hole 2565', hole 2565' may be formed at a location that may undesirably hit other structures or may contact (e.g., land on) a different control gate (e.g., wrong control gate) of memory device 700 because of the change (e.g., shift) in the locations of the control gates (e.g., control gate 233B). This can damage memory device 700. The reticle adjustment allows hole 2565' (and other similar holes) to be formed at appropriate locations. Thus, conductive contact 2665 (FIG. 26C) can also be formed at an appropriate location (inside hole 2565') to avoid damaging other structures, landing on wrong control gates, or both.

FIG. 28 shows a system 2000 of FIG. 20 including lithography equipment 2001, and a reticle 2865, according to some embodiments described herein. For simplicity, detailed description of system 2000 (also shown in FIG. 20) is not repeated. In FIG. 24, reticle 2865 can include patterns (e.g., lines and spaces) used to form holes 2565' (FIG. 26C). Part of the reticle adjustment (to form holes 2565') described above can include adjusting patterns on reticle 2865 based on locations of the control gate. Adjusting the patterns on reticle 2865 can include comparing the location of control gate $\mathbf{223}_1$ with the intended location (e.g., location of control gate 223A), and adjusting the patterns based on the comparison. For example, the patterns on reticle 2865 can be adjusted to be offset (e.g., shifted) from intended patterns based on distance D5 (FIG. 27B) to compensate for the change in the location of control gate $\mathbf{223}_1$. Adjusting the patterns allows hole 2565' (FIG. 26C) and conductive contact 2665 to be formed at appropriate (e.g., corrected) locations to avoid damaging other structures, landing on wrong control gates, or both.

Figures 29A, 29B, 29C:
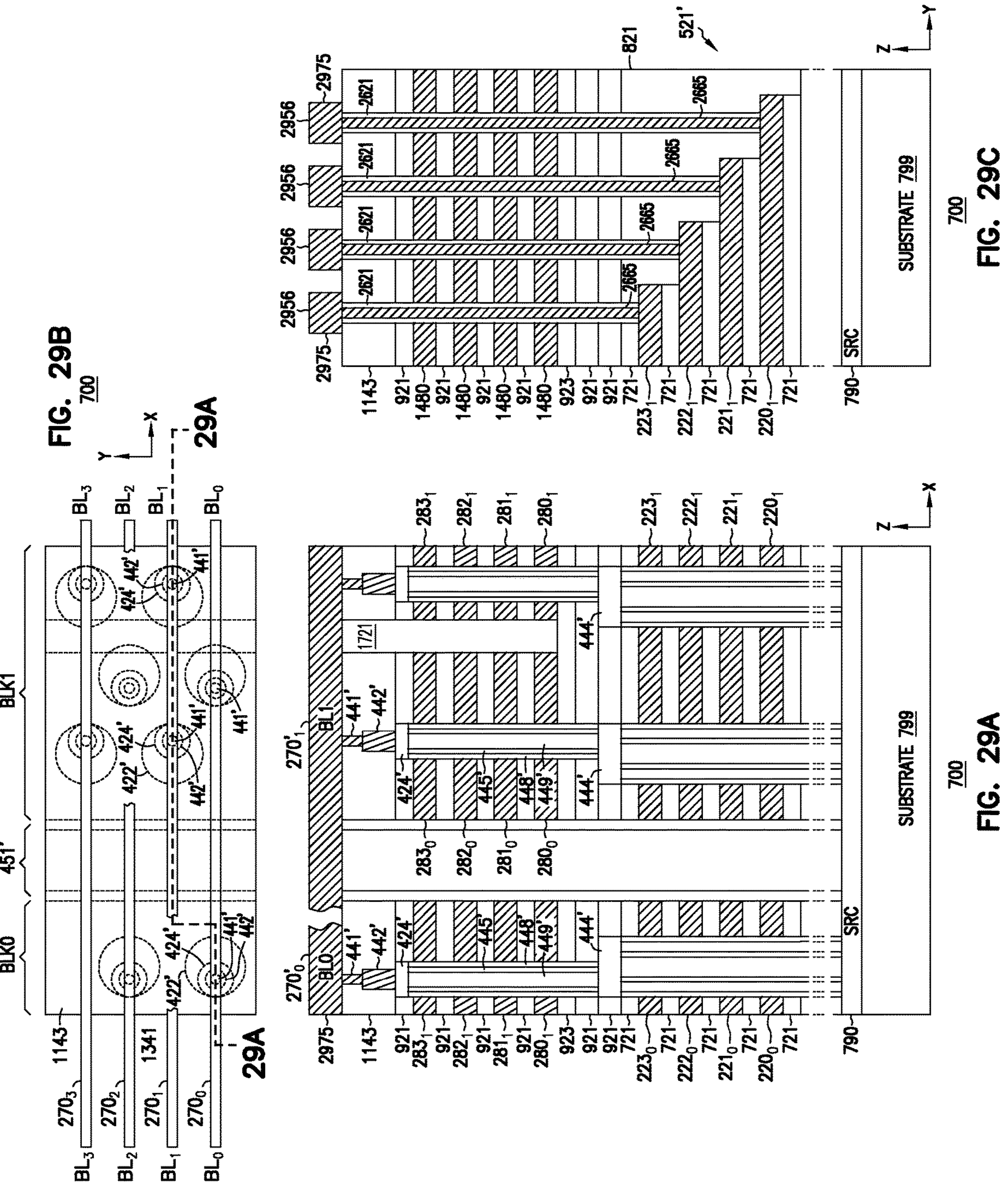

FIG. 29A, FIG. 29B, and FIG. 29C show memory device 700 after data lines $\mathbf{270}_0$, $\mathbf{270}_1$, $\mathbf{270}_2$, and $\mathbf{270}_3$, and conductive lines 2956 are formed. Data lines $\mathbf{270}_0$, $\mathbf{270}_1$, $\mathbf{270}_2$, and $\mathbf{270}_3$ are similar to the data lines (e.g., data lines $\mathbf{270}_0$ through $\mathbf{270}_N$) of memory device 200 in FIG. 5A. Conductive lines 2956 are similar to conductive lines 556 of memory device 200 of FIG. 5A and FIG. 6.

For simplicity and for ease of viewing the elements of memory device 700 from a side view (FIG. 29A) and from a top view (FIG. 29B), some of the data lines (which are conductive lines) $\mathbf{270}_0$, $\mathbf{270}_1$, $\mathbf{270}_2$, and $\mathbf{270}_3$ are partially shown in FIG. 29A and FIG. 29B. Data lines $\mathbf{270}_0$, $\mathbf{270}_1$, $\mathbf{270}_2$, and $\mathbf{270}_3$ can be located over (in the Z-direction) and fully extend across (in the X-direction) the blocks (e.g., blocks BLK0 and BLK1) of memory device 700, such that each of data lines $\mathbf{270}_0$, $\mathbf{270}_1$, $\mathbf{270}_2$, and $\mathbf{270}_3$ can contact (e.g., can be directly coupled to) dielectric structure 451', contact (e.g., can be directly coupled to or electrically coupled to) at least one conductive contact 441' in block BLK0, and contact (e.g., can be directly coupled to or electrically coupled to) at least one conductive contact 441' in block BLK1.

The description of forming memory device 700 with reference to FIG. 7A through FIG. 29C can include other processes to form a complete memory device (e.g., memory device 700). Such processes are omitted from the above description so as to not obscure the subject matter described herein.

Benefits and improvement of the processes described herein can mitigate misalignment between elements of memory device 700 that may be caused by structural changes (e.g., shift) in the pillars, the blocks, or both. For example, forming the structure of memory device 700 and the reticle adjustments as described above allow a proper placement of dielectric structures of sub-block dividers (e.g., dielectric structures 4460, $\mathbf{446}_1$, 4460', and $\mathbf{446}_1$')), conductive structures (e.g., conductive contacts 441, 442, 441', and 442'), and conductive contacts 2665. Therefore, reliability of memory device 700 can be improved or maintained, and improved yield may also be achieved.

Figures 30A, 30B, 30C:
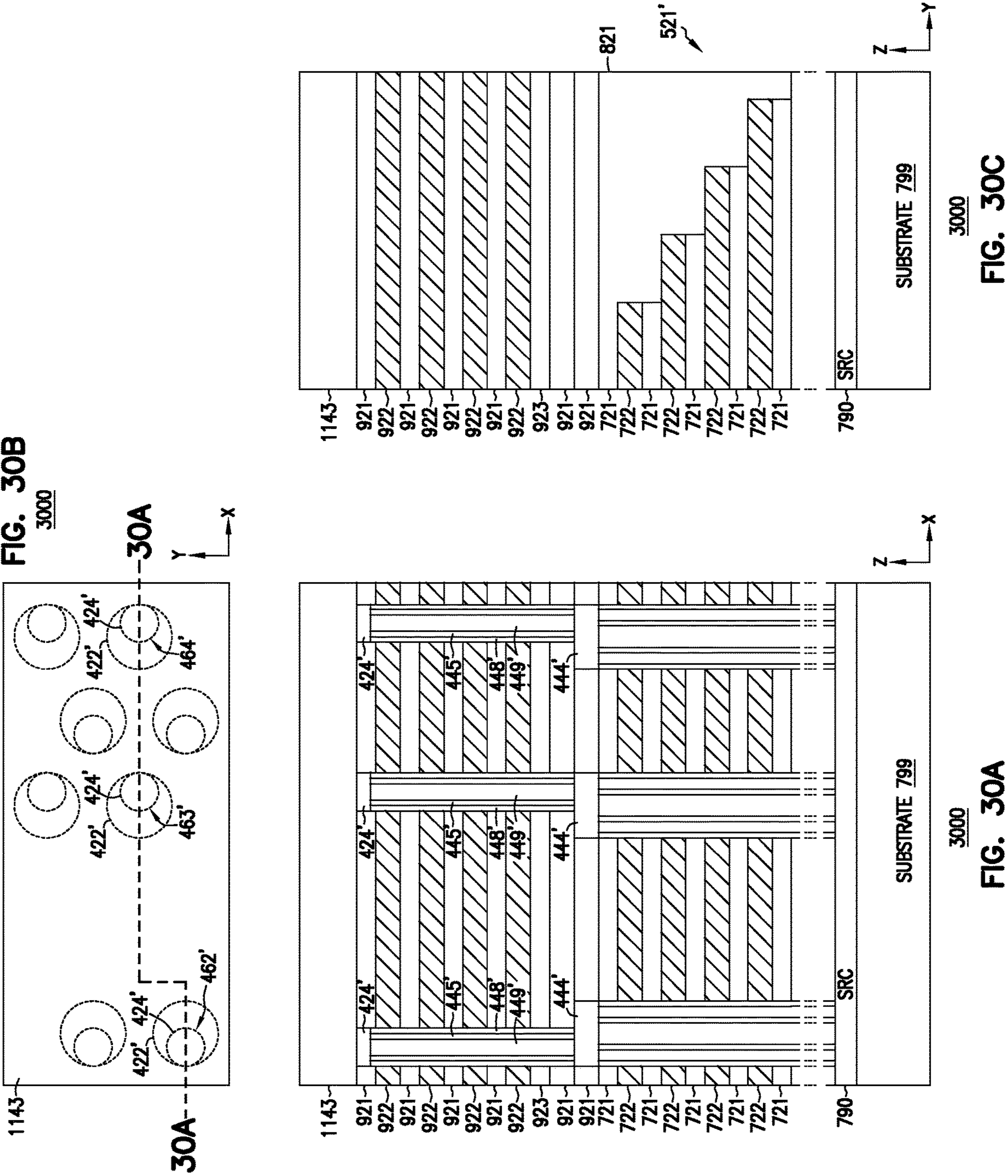

FIG. 30A, FIG. 30B, and FIG. 30C through FIG. 34A, FIG. 34B, and FIG. 34C show different views of elements during processes of forming a memory device 3000, according to some embodiments described herein. FIG. 30A, FIG. 30B, and FIG. 30C show memory device 3000 after some elements of memory device 3000 are formed. These elements can be the same as the elements of memory device 700 shown in FIG. 11A, FIG. 11B, and FIG. 11C. Thus, the processes of forming memory device 700 from FIG. 7A to FIG. 11C can be used to form the elements of memory device 3000 shown in FIG. 30A, FIG. 30B, and FIG. 30C. For simplicity, such processes are not repeated. Further, description of similar or the same elements between memory devices 700 and 3000 are also not repeated.

Differences between the processes of forming memory devices 700 and 3000 include the order in which some of the elements are formed. In memory device 700 (FIG. 7A through FIG. 29C), part of a block divider (e.g., slit 1251 in FIG. 12A) can be formed before part of a sub-block divider (e.g., trench 1646' in FIG. 16A) is formed. In memory device 3000 (FIG. 30A through FIG. 34C), part of a block divider (e.g., dielectric structure 451' FIG. 32A) can be formed after part of a sub-block divider (e.g., trench 1646' in FIG. 31A) is formed.

Figures 31A, 31B, 31C:
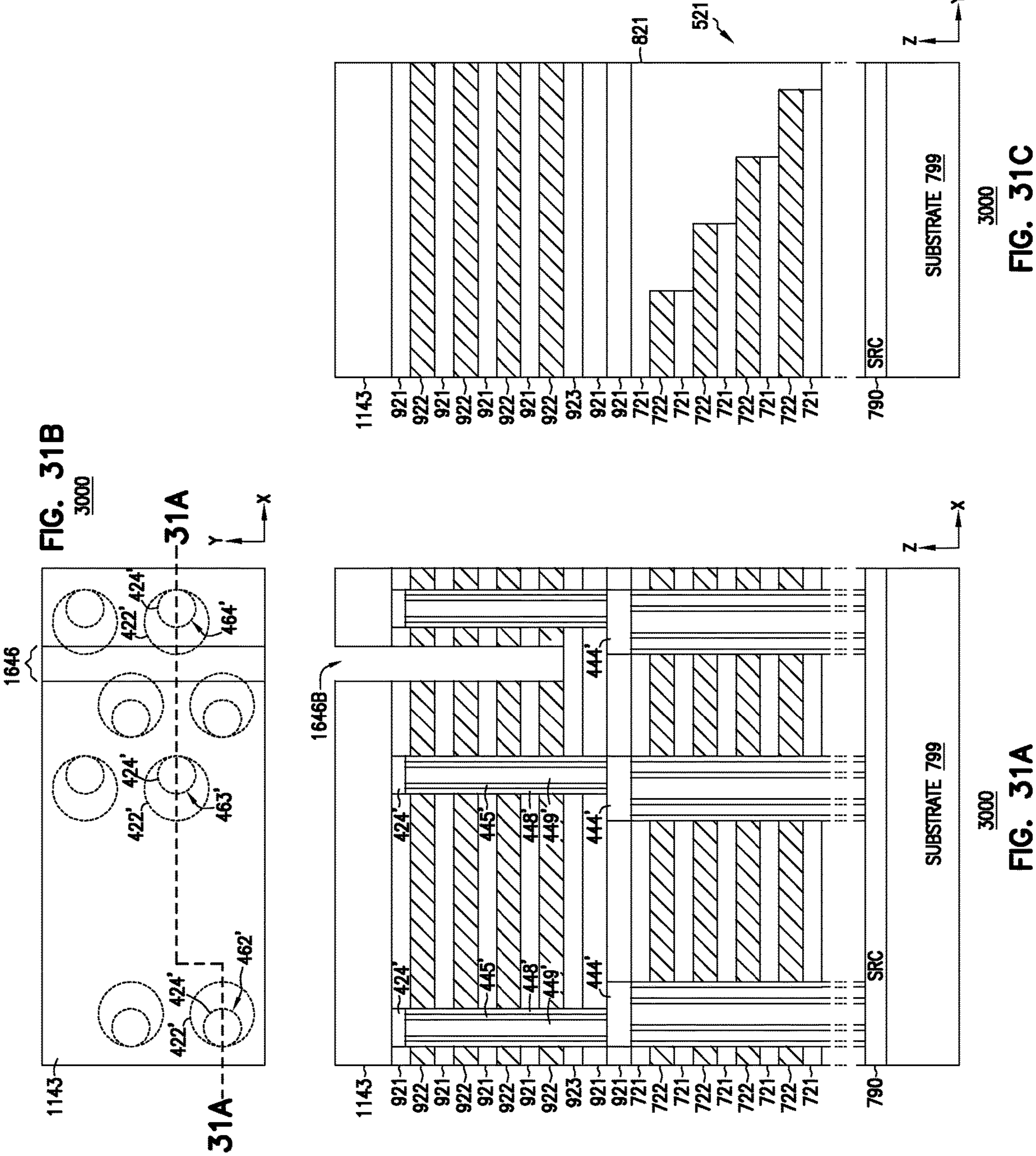

FIG. 31A, FIG. 31B, and FIG. 31C show memory device 3000 after trench 1646' is formed. Trench 1646' can be formed by processes similar to those for forming trench 1646' described above with reference to FIG. 16A.

Figures 32A, 32B, 32C:
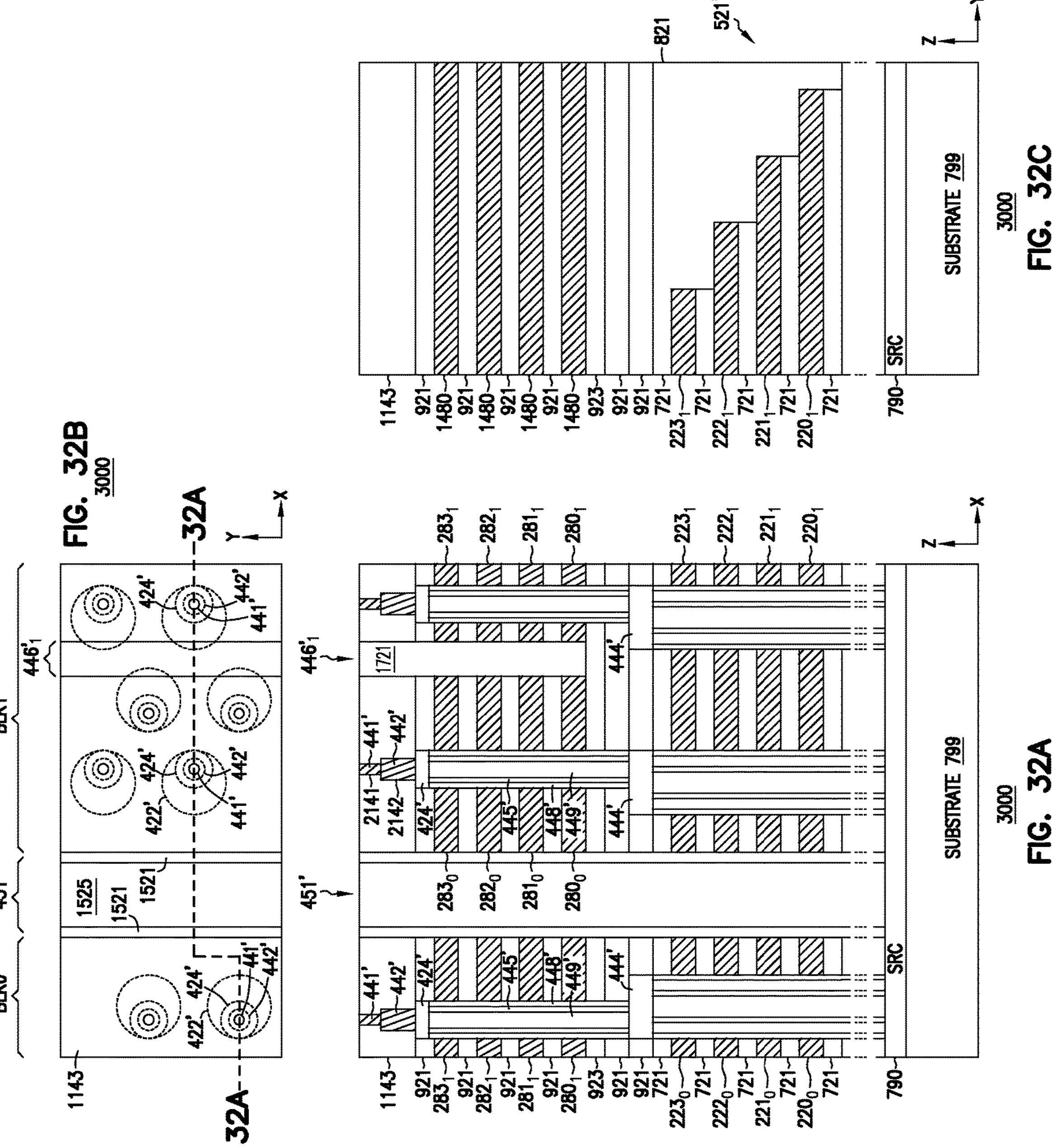

FIG. 32A, FIG. 32B, and FIG. 32C show memory device 3000 after dielectric structure $\mathbf{446'}_1$ is formed. Dielectric structure $\mathbf{446'}_1$ can be formed by processes similar to those for forming dielectric structure $\mathbf{446'}_1$ described above with reference to FIG. 17A. The processes associated with FIG. 32A, FIG. 32B, and FIG. 32C can also include forming dielectric structure 451' and conductive contacts 441' and 442' are formed after dielectric structure $\mathbf{446'}_1$ is formed.

Figures 33A, 33B, 33C:
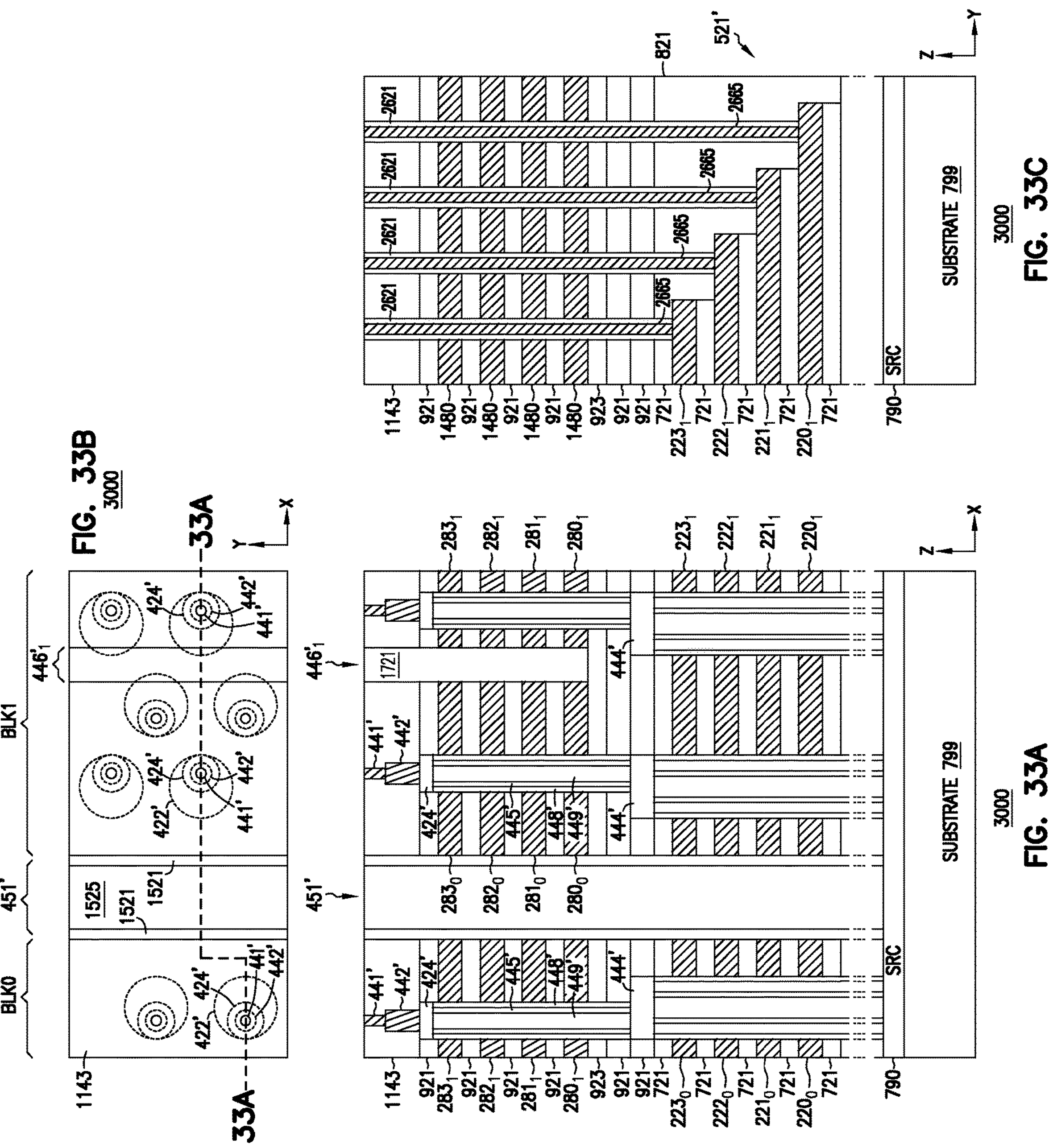

FIG. 33A, FIG. 33B, and FIG. 33C show memory device 3000 after conductive contacts 2665 and dielectric materials 2621 are formed.

Figures 34A, 34B, 34C:
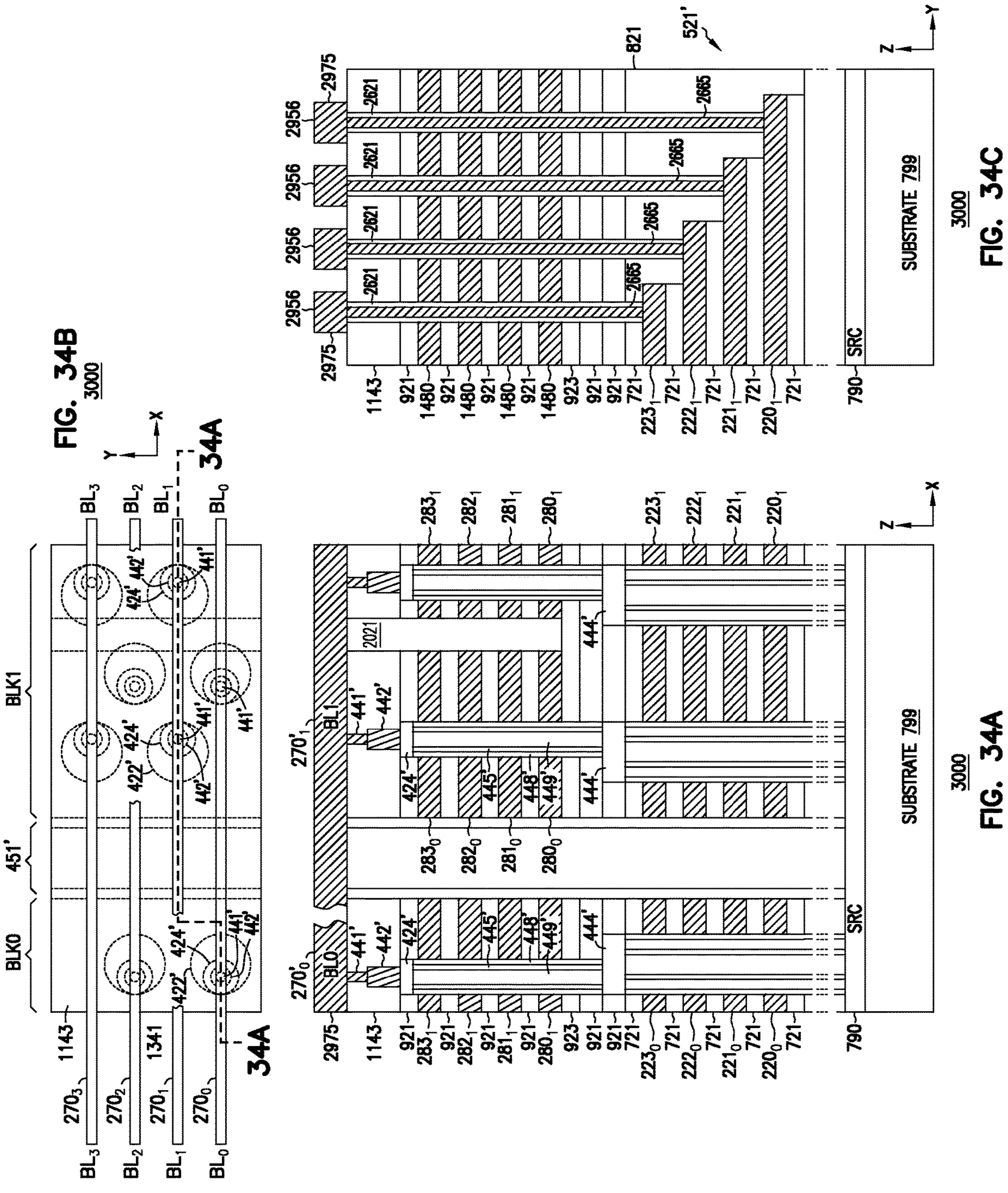

FIG. 34A, FIG. 34B, and FIG. 34C show memory device 3000 after data lines $\mathbf{270}_0$, $\mathbf{270}_1$, $\mathbf{270}_2$, and $\mathbf{270}_3$, and conductive lines 2956 are formed.

The processes of forming memory device 3000 can also include performing reticle adjustments similar to or the same as the reticle adjustments associated with forming dielectric structure $\mathbf{446'}_1$, conductive structures (e.g., conductive contacts dielectric structure 451', conductive contacts 441' and 442'), and conductive contacts 2665.

Memory device 3000 can have improvements and benefits similar to or the same as those of memory devices 200 and 700 described above.

The illustrations of apparatuses (e.g., memory devices 100, 200, 700, and 3000) and methods (e.g., processes associated with forming memory devices 700 and 3000) are intended to provide a general understanding of the structure of various embodiments and are not intended to provide a complete description of all the elements and features of apparatuses that might make use of the structures described herein. An apparatus herein refers to, for example, either a device (e.g., any of memory devices 100, 200, 700, and 3000) or a system (e.g., a computer, a cellular phone, or other electronic systems) that includes a device such as any of memory devices 100, 200, 700, and 3000.

Any of the components described above with reference to FIG. 1 through FIG. 34C can be implemented in a number of ways, including simulation via software. Thus, apparatuses, e.g., memory devices 100, 200, 700, and 3000, or part of each of these memory devices described above, may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

Memory devices 100, 200, 700, and 3000 may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 34C include apparatuses and methods of forming the apparatuses. One of the apparatuses includes memory cell strings having respective pillars extending through levels of first conductive materials interleaved with levels of first dielectric materials; conductive structures formed over the memory cell strings and extending through levels of second conductive materials interleaved with levels of second dielectric materials; dielectric structures located in respective trenches over the memory cell strings and dividing the levels of second conductive materials into portions that are electrically separated from each other; and the dielectric structures located such that the distance between two adjacent dielectric structures is different from the distance between two other adjacent dielectric structures. Other embodiments including additional apparatuses and methods are described.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A can include a single element or multiple elements. Item B can include a single element or multiple elements. Item C can include a single element or multiple elements.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:

levels of first conductive materials interleaved with levels of first dielectric materials;

memory cell strings including respective pillars extending through the levels of first conductive materials and the levels of first dielectric materials;

levels of second conductive materials interleaved with levels of second dielectric materials and located over the levels of first conductive materials and the levels of first dielectric materials;

conductive structures extending through the levels of second conductive materials and the levels of second dielectric materials and electrically coupled to the pillars, respectively;

dielectric structures located in respective trenches in the levels of second conductive materials and the levels of second dielectric materials and located over the levels of first conductive materials and the levels of first dielectric materials, wherein the dielectric structures do not extend through the levels of first conductive materials;

the dielectric structures dividing the levels of second conductive materials into portions that are electrically separated from each other, the portions including a first portion and a second portion;

the first portion located between and adjacent a first dielectric structure and a second dielectric structure of the dielectric structures, the second portion located between and adjacent the second dielectric structure and a third dielectric structure of the dielectric structures; and the first dielectric structure located at a first distance from the second dielectric structure, the second dielectric structure located at a second distance from the third dielectric structure, wherein the first distance is different from the second distance, wherein the apparatus comprises a memory device, and wherein:

the first dielectric structure, the second dielectric structure, and the third dielectric structures are located in a same memory block of the memory device;

the memory cell strings including respective pillars extending through the levels of first conductive materials and the levels of first dielectric materials are included in the same memory block of the memory device as the first dielectric structure and the second dielectric structure; and the memory cell strings including respective pillars extending through the levels of first conductive materials and the levels of first dielectric materials are associated with same control gates of the memory device.

2. The apparatus of claim 1, wherein:
the levels of second conductive materials in the first portion include a level of conductive material, the level of conductive material having a width in a direction from the first dielectric structure to the second dielectric structure; and
the width is greater than a difference between the first distance and the second distance.

3. The apparatus of claim 1, wherein:
the first portion of the levels of second conductive materials is included in a first sub-block of the memory device; and
the second portion of the levels of second conductive materials is included in a second sub-block of the memory device.

4. An apparatus comprising:
levels of first conductive materials interleaved with levels of first dielectric materials;
memory cell strings including respective pillars extending through the levels of first conductive materials and the levels of first dielectric materials;
levels of second conductive materials interleaved with levels of second dielectric materials and located over the levels of first conductive materials and the levels of first dielectric materials;
dielectric structures located in respective trenches in the levels of second conductive materials and the levels of second dielectric materials and located over the levels of first conductive materials and the levels of first dielectric materials;
the dielectric structures dividing the levels of second conductive materials into portions that are electrically separated from each other, the portions including a first portion, a second portion, and a third portion, wherein the dielectric structures do not extend through the levels of first conductive materials;
the first portion located between and adjacent a first dielectric structure and a second dielectric structure of the dielectric structures, the second portion located between and adjacent the second dielectric structure and a third dielectric structure of the dielectric structures, and the third portion located adjacent the third dielectric structure;
conductive structures extending through the levels of second conductive materials and the levels of second dielectric materials and electrically coupled to the pillars, respectively;
the conductive structures including first, second, and third conductive structures extending through the first, second, and third portions, respectively, of the levels of second conductive materials;
the first, second, and third conductive structures including a first conductive contact, a second conductive contact, and a third conductive contact, respectively; and
a data line coupled to the first, second, and third conductive contacts; and
the first conductive contact located at a first distance from the second conductive contact, the second conductive contact located at a second distance from the third conductive contact, wherein the first distance is different from the second distance, wherein the apparatus comprises a memory device, and wherein:
the first dielectric structure, the second dielectric structure, and the third dielectric structures are located in a same memory block of the memory device;
the memory cell strings including respective pillars extending through the levels of first conductive materials and the levels of first dielectric materials are included in the same memory block of the memory device as the first dielectric structure and the second dielectric structure; and
the memory cell strings including respective pillars extending through the levels of first conductive materials and the levels of first dielectric materials are associated with same control gates of the memory device.

5. The apparatus of claim 4, wherein:
the first dielectric structure is located at a third distance from the second dielectric structure; and
the second dielectric structure is located at fourth distance from the third dielectric structure, and the third distance is different from fourth distance.

6. The apparatus of claim 4 wherein:
the first portion of the levels of second conductive materials is included in the first sub-block of the memory device; and
the second portion of the levels of second conductive materials is included in the second sub-block of the memory device.

7. The apparatus of claim 6, wherein:
the levels of second conductive materials in the first portion includes a level of conductive material, the level of conductive material having a width in a direction from the first dielectric structure to the second dielectric structure; and
the width is greater than a difference between the first distance and the second distance.

8. The apparatus of claim 4, wherein the first, second, and third conductive contacts are included in a first sub-block, a second sub-block, and a third sub-block, respectively, of the memory device.

9. An apparatus comprising:
levels of first conductive materials interleaved with levels of first dielectric materials;
memory cell strings including respective pillars extending through the levels of first conductive materials and the levels of first dielectric materials;
levels of second conductive materials interleaved with levels of second dielectric materials and located over the levels of first conductive materials and the levels of first dielectric materials;
dielectric structures located in respective trenches in the levels of first conductive materials, the levels of first dielectric materials, the levels of second conductive materials, and the levels of second dielectric materials;
the dielectric structures dividing the levels of first conductive materials, the levels of first dielectric materials, the levels of second conductive materials, and the levels of second dielectric materials into memory blocks;
the first conductive materials forming control gates for the memory cell strings, the control gates including respective portions that collectively form a staircase structure;
conductive contacts extending through the levels of second conductive materials and the levels of second dielectric materials and electrically coupled to the control gates, respectively;
the conductive contacts including a first conductive contact, a second conductive contact, and a third conductive contact, coupled to a first control gate, a second control gate, and a third control gate, respectively, at the staircase structure, wherein the first control gate is located immediately next to the second control gate, and the second control gate is located immediately next to the third control gate; and the first conductive contact located at a first distance from the second conductive contact, the second conductive contact located at a second distance from the third conductive contact, wherein the first distance is different from the second distance, wherein the first conductive contact is located immediately next to the second conductive contact, and second conductive contact is located immediately next to the third conductive contact.

10. The apparatus of claim 9, wherein the second conductive contact is between the first conductive contact and the third conductive contact, and the first distance is less than the second distance.

* * * * *